United States Patent
Katsioulas et al.

(10) Patent No.: US 6,467,074 B1
(45) Date of Patent: Oct. 15, 2002

(54) INTEGRATED CIRCUIT ARCHITECTURE WITH STANDARD BLOCKS

(75) Inventors: Athanassios Katsioulas, San Jose; Stan Chow; Jacob Avidan, both of Los Altos; Dimitris Fotakis, Sunnyvale, all of CA (US)

(73) Assignee: Ammocore Technology, Inc.

( * ) Notice: Subject to any disclaimer, the term of this patent is extended or adjusted under 35 U.S.C. 154(b) by 0 days.

(21) Appl. No.: 09/532,330

(22) Filed: Mar. 21, 2000

(51) Int. Cl.[7] .................................................. G06F 17/50
(52) U.S. Cl. ............................................. 716/17; 716/8
(58) Field of Search ................................. 716/1, 2, 7, 8, 716/17, 18, 12, 14, 10, 11, 13, 9, 3, 4, 5, 6, 16

(56) References Cited

U.S. PATENT DOCUMENTS

| | | | |
|---|---|---|---|
| 4,964,057 A | 10/1990 | Yabe | 364/491 |
| 5,047,949 A | 9/1991 | Yamaguchi et al. | 364/491 |
| 5,206,815 A | 4/1993 | Purcell | |
| 5,227,665 A | 7/1993 | Nakamura et al. | |
| 5,369,596 A | 11/1994 | Tomkumaru | |
| 5,459,673 A | 10/1995 | Carmean et al. | |
| 5,471,398 A | 11/1995 | Stephens | |
| 5,495,419 A | 2/1996 | Rostoker et al. | 364/468 |
| 5,581,475 A | 12/1996 | Majors | |
| 5,636,129 A | 6/1997 | Her | |

(List continued on next page.)

FOREIGN PATENT DOCUMENTS

| | | |
|---|---|---|
| EP | 0599469 | 6/1994 |
| EP | 08258993 | 9/1996 |
| EP | 0848342 | 6/1998 |
| JP | 10107614 | 4/1998 |
| WO | WO9952049 | 10/1999 |

OTHER PUBLICATIONS

Synopsis, Design Compiler Family Reference Manual, Version 3.3a, Mar. 1995, Table of Contents.
Semiconductor Industry Association, SIA Technology Programs, ASIC/SOC Presentation, Sep. 17, 1999 by Dr. Juri Matisoo (List continued on next page.)

Primary Examiner—Matthew Smith
Assistant Examiner—Paul Dinh
(74) Attorney, Agent, or Firm—Anthony T. Cascio

(57) ABSTRACT

An integrated circuit (IC) architecture with STANDARD BLOCKs. The IC architecture forms a layout that includes a plurality of STANDARD BLOCKs, top-level cells, and hard IP blocks. The STANDARD BLOCKS form row-based or column-based STANDARD BLOCK ARRAY configurations in which STANDARD BLOCKs are placed adjacent to each other in a row or column configuration with their fixed or quantized dimension aligned and oriented perpendicular to the STANDARD BLOCK ARRAY direction. Individual STANDARD BLOCK ARRAYs can be spaced apart forming channels between them to allow for routing interconnections, or overlapping one another in a flipped configuration sharing VDD or GND power rails. The IC layout includes sites reserved for top-level cells that are placed in channels between STANDARD BLOCK ARRAYs, around the perimeter of STANDARD BLOCKs, or arranged in a staggered or diagonal configuration inside the STANDARD BLOCKs. The layout of the IC further includes power grid and clock grid structures providing, respectively, power and ground and clock distribution. Each of the STANDARD BLOCKs has a form that is physically constrained such that its dimensions feature one fixed or quantized dimension, and one variable dimension that ranges between predefined limits; a granularity larger than a standard cell granularity such that each STANDARD BLOCK includes a plurality of standard cells; and flexible physical design properties.

100 Claims, 36 Drawing Sheets

U.S. PATENT DOCUMENTS

| | | | |
|---|---|---|---|
| 5,696,693 A | * 12/1997 | Aubel et al. | 716/12 |
| 5,723,883 A | 3/1998 | Gheewalla | 257/204 |
| 5,757,656 A | 5/1998 | Hershberger et al. | |
| 5,847,969 A | 12/1998 | Miller et al. | 364/491 |
| 5,872,718 A | 2/1999 | Scepanovic et al. | |
| 5,892,688 A | 4/1999 | Scepanovic et al. | |
| 5,898,597 A | * 4/1999 | Scepanovic et al. | 716/9 |
| 5,905,655 A | 5/1999 | Deeley | |
| 5,923,059 A | 7/1999 | Gheewala | 257/204 |
| 5,923,060 A | 7/1999 | Gheewala | 257/207 |
| 5,984,510 A | 11/1999 | Guruswamy et al. | 364/491 |
| 5,987,086 A | 11/1999 | Raman et al. | |
| 6,006,024 A | * 12/1999 | Guruswamy et al. | 716/12 |
| 6,067,409 A | * 5/2000 | Scepanovic et al. | 716/8 |
| 6,110,221 A | 8/2000 | Pai et al. | |
| 6,223,329 B1 | * 4/2001 | Ling et al. | 716/12 |
| 6,230,304 B1 | 5/2001 | Groeneveld et al. | |
| 6,230,308 B1 | 5/2001 | Granzelmi et al. | |
| 6,269,466 B1 | 7/2001 | Crafts | |
| 6,298,468 B1 | * 10/2001 | Zhen | 716/2 |
| 6,308,309 B1 | 10/2001 | Gan et al. | |

OTHER PUBLICATIONS

Synopsis, Experiences Using Behavioral Synthesis on an ATM Traffic & Queue Management ASIC, www.synopsys.com/products/beh_syn/bc_nortel_wp.html.

Synopsis, Behavioral and RTL Synthesis, 1998, www.synopsys.com/products/beh_syn/what_is.gif.

Avant!, Single Pass RTL Design, 1999, ftp.interhdl.com/Avant!/SolutionsProducts/SinglePassRTLDesign/Index/.

Synopsis, Synopsis Delivers Industry's First Register–Transfer–Level Optimization for Power Synthesis, Nov. 3, 1997, www.synopsys.com/news/announce/press/rtl_power_pr.html.

ASIC Design, asic.heltech.com/asdcnts.htm.

EDA Direct, XHDL, www.edadirect.com/XHDL.htm.

IEEE 1076.6 VHDL Synthesis Standard Passes Balloting, 1999, www/vhdl.org/vhdltimes/73–ieee.html.

Modeling Layout Tools to Derive Forward Estimates of Area and Delay at the RTL Level, by Donald S. Gelosh, www.acm.org/todaes/V6N2/L146/abstract.html.

Avant!, IC Packaging and System Products, 1999, www.interhdl.com/Avant!/SolutionsProducts/Category/Item/1,1299,6,00.html.

Synopsys, Desktop Verilog, www.synopsys.com/services/education/desk_verilog_tr.html.

Cadence Design Tools Tutorial, vlsi.wpi.edu/courses/ee390x/flow.html.

* cited by examiner

|  | 1999 | 2001 | 2003 |
|---|---|---|---|
| Manufacturing Process | .25μm | .18μm | .13μm |
| Design Complexity (gates) | 1-5M | 3-20M | 5-30M |
| Memory (Bit per chip) | 1G | 4G | 8G |
| On-chip Frequency (MHz) | 500 | 700 | 900 |
| Wiring Levels (layers) | 6-7 | 7 | 7-8 |
| Power Supply Voltage (VDD) | 1.5-1.8 | 1.2-1.5 | 0.9-1.2 |
| Process materials | Aluminum | Al-Copper | Al-Cu-SOI-Low k |
| Chip Area / Timing | | | |
| Power / Electromigration | | | |
| Signal Integrity (Cross-talk) | | | |
| Design for Reliability | | | |
| Design for Manufacturability | | | |

FIG. 2

INTEGRATED CIRCUIT ARCHITECTURE WITH STANDARD BLOCKS

RELATED APPLICATIONS

This application is related to and incorporates herein by reference pending U.S. application Ser. No. 09/525,184 titled "STANDARD BLOCK Architecture For Integrated Circuit Design," filed Mar. 14, 2000, which is assigned to the assignee of the present application.

BACKGROUND OF THE INVENTION

1. Field of the Invention

This application relates to semiconductor design process and, particularly, to integrated circuit (IC) design process including electronic design automation (EDA) and automated IC design tools.

2. Background Art

Modem IC design process depends on a highly developed software technology directed to optimizing IC density, timing, and other electrical parameters in order to achieve low cost, improved performance, and high reliability while reducing overall design turn-around-time. It is common to find computer-aided IC design tools (also known as CAD tools and EDA tools, hereafter collectively "IC design tools") that are utilized for the design of complex ICs with millions of components. To deal with such complexity, IC design tools must have the capacity to process millions of gates, must be computationally fast, and must produce optimal results in order to reduce the number of iterations in the design flow (See FIG. 1 for a typical IC design flow). In other words, IC design tools must keep pace with the rapidly increasing complexity as outlined by Moore's Law. (Moore's Law predicted that the design complexity and speed of ICs will double every two (2) years; See FIG. 2 for a Semiconductor Industry Association's (SIA's) projection of IC complexity development along with the increased importance of deep-submicron (DSM) for physical design.

Over time there have been many generations of IC design tools for handling the increasing number of components (e.g., gates) on a single chip. The increasing IC complexity overtime resulted in the evolution of IC design methods including adoption of higher levels of abstraction as illustrated in FIG. 3. FIG. 3, shows the evolution over time of ICs, from small ICs comprised of transistors (or polygons) to larger ICs comprised of higher levels of abstraction such as gates, (or cells), and blocks.

Early on, with a relatively small number of gates, logic design with transistors and physical design with polygons 30 in an IC 40 was performed manually. With the emergence of synthesis and placement and routing (P&R) tools, gates and standard cells 32 have been introduced as a basic architectural feature for the design and implementation of ICs. As a result, the physical design and implementation of ICs was automated using the standard-cell-based architecture 42. Physical design tools, particularly, automated physical design tools, have long been key in implementing the IC design evolution. In general, physical design of an IC is the process of converting electrical circuit specifications into an IC layout. Physical design requires exacting details about components, geometric patterns and geometric rules, such as separation, spacing, etc. Physical design automation tools use algorithms and data structures to achieve optimal arrangement of components and efficient interconnection between components to obtain the desired functionality. However, unlike front-end design tools (e.g., logic design tools), physical design tools have not kept pace with the IC evolution. Physical design tools for both flat standard-cell-based and functional-block-based architectures 42 and 44 are inadequate and have not kept pace with large scale ICs design. For example, automatic P&R tools for implementing ICs with a flat cell-based architecture 42 are reaching practical limits in the number of cells they can process automatically; and P&R tools for implementing ICs with a functional block-based architecture 44 are less automatic thus consuming more designer resources.

The development of functional block-based architecture 44, came into existence with the evolution of synthesis tools that gave rise to Register Transfer Level (RTL) design. RTL was introduced to specify the IC functionality design with a behavior-level specification. Behavioral and RTL specifications can be coded in any currently available hardware description language (HDL). From RTL, gate level information can be generated by logic synthesis tools, and this information (commonly referred to as the "netlist") can be used in generating layout including physical interconnections (wires) between the gates (which are provided as part of the netlist). The transition from gate-level to RTL-level methodologies in the front-end design tools accommodates the evolution of IC design, but the limitations in the back-end (e.g. physical) design tools have yet to be overcome. To better understand these limitations, an overview of the standard-cell-based and functional-block-based architectures and corresponding design methodologies are illustrated in FIGS. 4 and 5, respectively.

As shown in FIG. 4, standard cell architecture of an IC 42 considers the IC layout to be formed of rectangular cells 54 with a similar height, the so-called standard cells. The standard cell layout is inherently non-hierarchical, hence the term flat cell-based design. In this layout, cells 54 are placed in rows 52 with, or without, spaces (channels) therebetween. In a layout with channels (not shown), the channels are used to accommodate wires for cell interconnections. In a layout without channels, all interconnections are routed over the cells. In the standard-cell-based architecture 42, each cell 54 is equivalent to a primitive component of the circuit embodied in the IC. The functionality of each cell is typically predefined and available from a cell library. After the logical design phase 14 (e.g., by high-level synthesis from behavioral description to RTL code followed by RTL synthesis to gate-level), the design process proceeds with the physical design phase 16. The standard cell design style is relatively simple but has practical limitations for processing large ICs, primarily due to the fact that physical design deals with significantly more design elements than logic design. Also, long interconnects in large-scale standard cell layout typically leads to non-deterministic timing results or signal integrity issues. As a result, standard cell design optimization requires a repeat in a number of iterations of either one or both of the logical and physical design phases 14 and 16 (indicated by return arrows). For instance, engineering design change orders (ECOs) which introduce changes in the design (e.g., function, netlist, or timing) require a repeat of the standard cell design cycle. Moreover, although a cell-based approach is fairly automatic, substantial efforts and resources must be expended in large scale IC designs to maintain synchronization between the vast information generated, respectively, by the logical and physical design teams.

By comparison, in an IC with a functional block-based design architecture 44, as shown in FIG. 5, the circuit embodied in the IC is partitioned (step 11) into a hierarchy of functional blocks 62. Each individual functional block can be implemented by being further partitioned into a hierarchy of sub-blocks, or by using a standard cell approach as described above. Each IC design team is typically responsible for the logical and physical design of a respective functional block. However, as the individual block designs progress there remains a challenge to synchronize tuning of the design requirements and related information among the individual design teams. A separate top-level design team must then assemble the functional blocks in an integration phase performed at a top-level of the hierarchy using floor planning (or chip assembly) tools. Reconciling mismatches between the functional blocks requires ECOs and is a significant challenge which floor planning tools cannot easily overcome with predictable results.

The difficulties associated with a functional block design style are due to the irregular sizes and diverse timing requirements of functional blocks 62. Because the floor planning involves a multiple number of constraints (such as overall IC and blocks size, aspect ratio, timing, pin accessibility, etc.), optimizing the design with functional blocks, particularly with P&R tools, is far more complex and requires a number of design iterations (See FIG. 5: return arrows). Also, due to the wide range of functional block sizes some phases of the physical design (such as floorplan optimization) are performed manually in a time consuming process (hence, the semi-automatic physical design).

As the complexity of IC circuits evolves to include entire systems on a single chip (SOC), the number of functional blocks in the IC increases and their respective design styles of these blocks diverge. For example, SOC design increasingly includes functional blocks, which are provided in two forms, soft IP and hard IP. Soft IP is provided in RTL (or gate level netlist) form which provides design flexibility and process independence. However, soft IP requires the additional process of conversion into hard IP (i.e., the physical design implementation) before manufacturing the chip. Hard IP is provided in ready to use layout form (or placed and routed standard cells), but it is inflexible (or rigid as explained before) and difficult to adapt into a new manufacturing process. Hard IP may be comprised only of standard cells or a combination of standard cells and/or custom circuitry such as analog blocks, memory blocks, and processor blocks. As the number of design blocks and styles increases, the complexity of placement, routing, timing, and signal integrity optimization increases as well. With the irregular nature of functional blocks, a change at any level of the hierarchy (even inside a functional block) effects the entire design and complicates ECOs. Furthermore, the irregular size of the functional blocks compounds the difficulty to optimize placement, minimize timing, increase density, and minimize the length of interconnections between the blocks.

Achieving IC performance objectives in large scale IC design implementations with the soft and/or hard IP blocks presents difficult chip assembly challenges. Particularly difficult is the timing closure during physical layout implementation 16. Further design optimization after completion of the synthesis and physical layout phases is often needed to meet performance objectives such as timing, signal integrity, power and noise immunity. Design optimization requires a return to the synthesis phase 14, or floor planing phase 11, in order to consider parasitic electronic parameters (i.e., resistor capacitor, RC, data and delay values). Namely, design optimization involves iterative loops (indicated by the return arrows) that make it difficult to converge on a solution that closely meets the design specifications and objectives. This, of course, leads to design flow bottlenecks and delays in design completion. The problem is compounded as conventional IC design tools ignore RTL hierarchy, which complicates passing back of information to the RTL stage.

Accordingly, for the increasingly complex large scale ICs it is increasingly difficult to achieve the desired low cost, fast turn-around-time, high yield, high performance and reliability. Therefore, there remains a need to improve IC design methods and tools.

SUMMARY OF THE INVENTION

The present invention addresses the foregoing and related problems by allowing acceleration of the integrated circuit (IC) design process while optimizing critical IC design parameters such as density, timing, and reliability. Specifically, the present invention introduces an IC architecture with STANDARD BLOCKs that substantially improves complex, large scale, deep-submicron high speed IC designs. (As mentioned later in the detailed description of the invention, STANDARD BLOCK and STANDARD BLOCK ARRAY are trademarks of Ammocore Technology, Inc., the assignee of the present invention.)

In the new IC architecture, the STANDARD BLOCKs provide a new standard platform for physical design that substantially reduces the complexity associated with large scale, deep-submicron high speed IC design, such as the SOC (system on chip) design. The new IC architecture is created with STANDARD BLOCKs having a STANDARD BLOCK architecture. The STANDARD BLOCK architecture introduces STANDARD BLOCKS as a new level of abstraction which is higher than standard cells, and their relative size is, on average, smaller than functional blocks' size. STANDARD BLOCKs are physical representations of portions of a logic netlist.

The new IC architecture, contains a plurality of STANDARD BLOCKs arranged in a channeled or channel-less STANDARD BLOCK ARRAYs. Furthermore, each STANDARD BLOCK contains a plurality of standard cells arranged in a channeled or channel-less cell-based array configuration. For the purpose of simplified and more efficient top-level assembly, as will later become clear from the description herein, the number of cells in each STANDARD BLOCK is designed to be large enough to simplify top-level timing analysis (with less complex timing abstractions), yet small enough to simplify top-level placement and maximize IC density. As further compared to standard cells, STANDARD BLOCKs have more properties than standard cells. Consistently, STANDARD BLOCKs have both functional and physical properties such as timing, power, size, number of cells (or pins), etc. In other words, STANDARD BLOCKs are entities in which these properties and characteristics are consistently present.

By providing the STANDARD BLOCKs as a physical representation at a higher abstraction level than standard cells and by eliminating the irregularity associated with functional blocks, the new IC architecture enables increased IC layout density, improved timing, and higher reliability. In so doing, an IC implementation with the STANDARD BLOCK architecture combines the advantages of standard-cell-based and functional-block-based architectures.

With the new IC architecture, STANDARD BLOCKs in the IC architecture have a physically constrained "form" yet flexible physical design properties. For the purpose of this application, the "form" of a STANDARD BLOCK is a surface area defined or occupied by a STANDARD BLOCK which preferably approximates, but is not limited to, a rectangular-shaped area. The "physically constrained" form is, in turn, a shape the dimensions of which are constrained but capable of being scalable relative to IC size and process technology.

Being physically constrained, the form of STANDARD BLOCKs is characterized by one fixed or quantized dimension and one "variable" dimension that is selectable between predefined limits. Namely, STANDARD BLOCKs preferably have a similarly fixed or quantized height and variable widths or, alternatively, variable heights and a similarly fixed or quantized width. The height and width dimensions of each STANDARD BLOCK are preferably expressed in terms of number of minimal-size cells (i.e., the smallest cells available in the design library).

The new IC architecture is advantageously implemented with STANDARD BLOCK ARRAYs, each containing a plurality of STANDARD BLOCKs arranged in a row or column configuration. STANDARD BLOCKs are placed adjacent to each other with their fixed or quantized dimension aligning one another, such that each STANDARD BLOCK ARRAY is contiguous. Individual STANDARD BLOCK ARRAYS, are placed in either channel-less or channeled configuration with respect to one-another. In a channel-less STANDARD BLOCK ARRAY configuration the individual row or column based arrays are flipped in an alternate fashion and placed next to each other such that their respective VDD (power) and GND (ground) can be shared between the rows or columns. In a channeled STANDARD BLOCK ARRAY configuration, the individual rows or columns are spaced apart forming channels between the arrays of STANDARD BLOCKs which can be used to accommodate interconnect resources. The number of STANDARD BLOCK ARRAYs is determined by the dimensions of the IC and the dimensions of the STANDARD BLOCKs. The dimensions of STANDARD BLOCKs range from a pre-defined minimum to a maximum number of cells and pins.

The new IC architecture further includes a plurality of standard cells at the top level. These top-level cells are intermixed with the STANDARD BLOCKs by being placed in reserved sites around the perimeter or inside the STANDARD BLOCKs, or in reserved channels between STANDARD BLOCK ARRAYs. Top-level cells are typically buffers, repeaters and other glue logic, and are typically utilized in a global context, such as splitting long interconnects, implementing clock trees, and accommodating functions such as control logic and test-scan. As such, the new IC architecture includes a plurality of STANDARD BLOCKs, top-level cells, and IP (intellectual property) in a single IC.

The new IC architecture further includes power grid and clock grid structures providing, respectively, power and ground and clock distribution to the STANDARD BLOCKs and the top-level cells. The power structure for the IC is implemented by abutting STANDARD BLOCKs containing special power grid structure, and filling any unused space with special power routing, or special filler STANDARD BLOCKs.

To implement the new IC architecture, STANDARD BLOCKs are created by partitioning a full hierarchical RTL (register transfer level) design or a structural netlist of the IC (or IP part thereof) into smaller functional modules, thereby adopting the advantages of functional block architecture without assuming its shortcomings. Because of the regularity and granularity of the STANDARD BLOCKs, which facilitates the formation of STANDARD BLOCK ARRAYs, the implementation of STANDARD BLOCK based IC design can be realized with conventional placement tools.

A STANDARD BLOCK or a collection of STANDARD BLOCKs introduces an abstraction that, preferably but not invariably, aligns to the RTL functional block boundaries, or RTL sub-block boundaries. Since one or more STANDARD BLOCKs correspond to the RTL functionality, STANDARD BLOCKs corresponding to various modules of intellectual property (soft IP or hard IP, as mentioned above) can, in turn, be created for easy re-use in other designs (with minimal or no additional changes to the STANDARD BLOCKs). The alignment of STANDARD BLOCKs to the RTL functionality also provides a common platform for both the RTL design and the physical design. This makes passing information back to the RTL level much easier (for performing a re-design, for example, in order to meet physical constraints).

For the purpose of top-level assembly for forming the IC, the STANDARD BLOCKs are provided as a general physical abstraction such that each STANDARD BLOCK is akin to black box model with the majority of its internal design aspects being invisible to a top-level assembly tool while selected aspects of its internal design remain visible. Each STANDARD BLOCK can be presented to the assembly phase in terms of its respective fundamental properties as well as its respective characteristics which take the form of abstractions. Namely, each of the STANDARD BLOCKs can be uniquely characterized by its fundamental properties and characteristics such as, size, number of gates, number of I/O pins, clock, power, and timing, and by using various abstractions which model physical block placement, interconnects, etc.

Thus, in accordance with the purpose of the invention, as embodied and broadly described herein, the invention relates to a new IC architecture with STANDARD BLOCKs. The features of STANDARD BLOCKs in the IC architecture are defined by the STANDARD BLOCK architecture and are provided thereby as a new level of abstraction. The new level of abstraction has a granularity and regularity that is most appropriate for the physical implementation of complex, large scale deep-submicron IC designs. To this end, as noted above, the new IC architecture combines the advantages of standard-cell-based and functional-block-based architectures.

As further noted above, the STANDARD BLOCKs are invariably provided in the new IC architecture with a form that is physically constrained. This form has one fixed or quantized dimension and one variable dimension that ranges between predefined limits. The STANDARD BLOCKs have a granularity and a level of abstraction that are larger and higher, respectively, than a standard cell granularity and level of abstraction such that each standard block includes a plurality of standard cells. The STANDARD BLOCKs additionally have the above-mentioned flexible physical design properties. The layout of the new IC is implemented with STANDARD BLOCKs arranged in a STANDARD BLOCK ARRAY configuration, and with top-level cells positioned in a configuration that is suited to meet timing and signal integrity for the IC.

Various modifications to the preferred embodiment will be apparent to those skilled in the art from consideration of the disclosure and practice of the invention disclosed herein and the generic principles herein may be applied to other embodiments. Thus, the present invention is not intended to be limited to the embodiments shown, but is to be accorded the widest scope consistent with principles and features described herein.

Furthermore, advantages of the invention will be understood by those skilled in the art from the description that follows. Advantages of the invention will be further realized and attained from practice of the invention disclosed herein.

BRIEF DESCRIPTION OF THE DRAWINGS

The accompanying drawings, which are incorporated in and constitute a part of this specification, illustrate several embodiments of the invention and together with the description, serve to explain the principles of the invention. Wherever convenient, the same reference numbers will be used throughout the drawings to refer to the same or like elements.

FIG. 2 shows a projected development of IC (integrated circuit) complexity and the increased importance of deep-submicron (DSM) physical design.

DETAILED DESCRIPTION OF THE INVENTION

Figure 1:
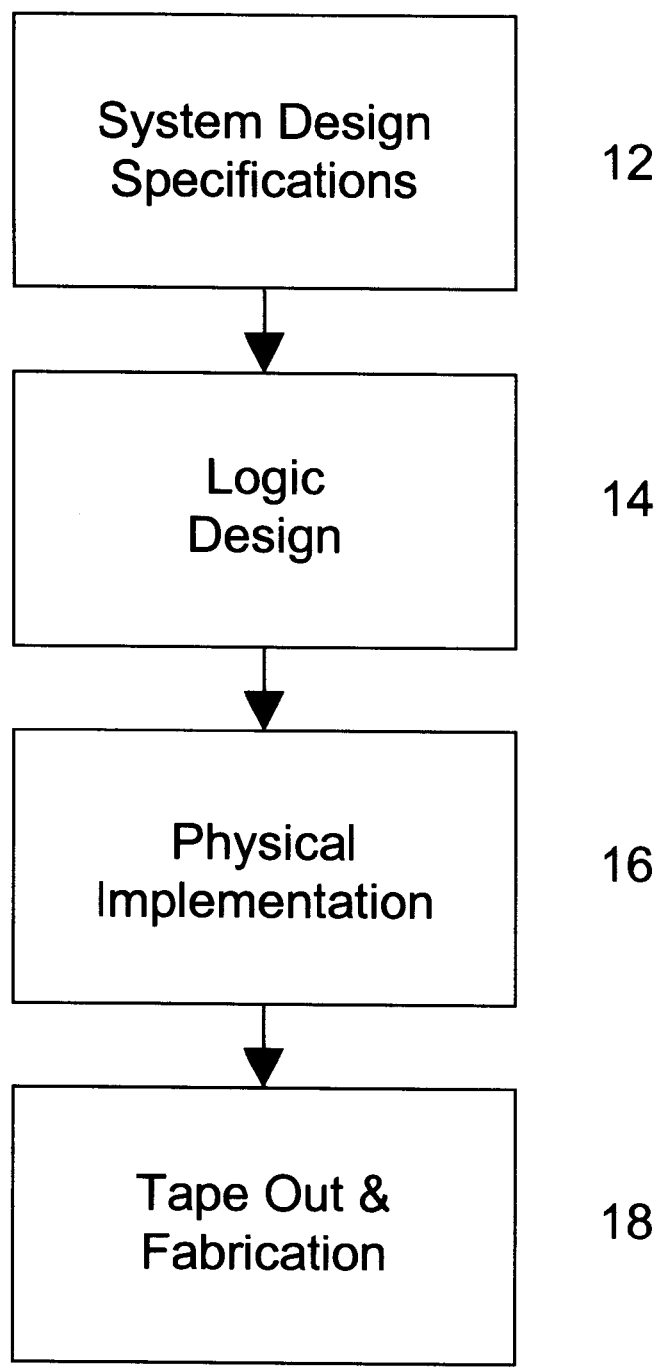
FIG. 1 shows a typical IC design flow.

The present invention relates to semiconductor design process. The invention relates particularly to electronic design automation (EDA) and automated integrated circuit (IC) design tools which are useful in the design of large scale ICs The following description is presented to enable one of ordinary skill in the art to make and use the invention and is provided in the context of a patent application and its requirements. Reference will be made in detail to a preferred embodiment of the invention which is illustrated in the accompanying drawings. Whenever convenient, the same reference numbers will be used throughout the drawings to refer to same or like elements. Although the invention will be described in accordance with shown embodiments, one of ordinary skill in the art will readily recognize that there could be variations to the embodiments and those variations would be within the scope and spirit of the invention.

The present invention contemplates implementing a new IC architecture with STANDARD BLOCKs. The STANDARD BLOCKs are provided with an architecture that is hereafter referred to as the STANDARD BLOCK architecture (STANDARD BLOCK is a trademark of AmmoCore Technology Inc., the assignee of the present application). In the new IC architecture, STANDARD BLOCKs are introduced as a new level of abstraction which is higher than standard cells, and their relative size is, on average, smaller than functional blocks' size.

With the new architecture, the layout of an IC invariably includes the STANDARD BLOCKs. As will be further described below, the IC layout is constructed of STANDARD BLOCKs having a physically constrained form one dimension of which is substantially fixed or quantized and other dimension is variable. The functional and architectural properties of STANDARD BLOCKs in the new IC architecture are defined by the STANDARD BLOCK architecture. With the new IC architecture, STANDARD BLOCKs in the IC are distinguished by a substantially constant quantization of their dimensions relative to chip dimensions and scalability with the evolution of semiconductor process technology and IC design complexity.

Thus, the new IC architecture can be applied to any large scale IC designs (e.g.,100's of millions of gates and 100's of MHz), as well as, any soft and hard intellectual property (IP) designs. Large scale IC designs encompass various types of designs such as microprocessors and microcontrollers, ASIC (application specific IC), ASSP (application specific standard part), microprocessor, DSP (digital signal processor), microcontroller, and SoC (system on chip). Soft IP is logic functionality expressed in register transfer level (RTL) design code that has yet to be synthesized and converted into a layout or logic netlist. Hard IP is ready to use logic functionality expressed in circuit layout and netlists. STANDARD BLOCKs are physical representations of portions of a logic netlist.

The new IC architecture consists of a plurality of STANDARD BLOCKs arranged in a channeled or channel-less array configuration, and top-level cells placed in reserved areas around the perimeter or inside STANDARD BLOCKs, or in channels among STANDARD BLOCK ARRAYs. Each STANDARD BLOCK contains a plurality of standard cells arranged in a channeled or channel-less array configuration. For the purpose of simplified and more efficient top-level assembly, the number of standard cells in each STANDARD BLOCK is designed to be large enough to simplify timing analysis task (with less complex timing abstractions representing larger groups of flip-flops along timing paths), yet small enough to simplify placement and maximize IC density (with more uniform dimensions). As further compared to standard cells, STANDARD BLOCKs have more properties than standard cells. Consistently, STANDARD BLOCKs have both functional and physical properties such as timing, power, size, number of cells (or pins), etc. In other words, STANDARD BLOCKs are entities in which these properties and characteristics are uniformly and consistently present.

By providing the STANDARD BLOCKs in the IC architecture as a physical representation at an abstraction level that is higher than standard cells and by eliminating the irregularity associated with functional blocks, the new architecture enables increased IC layout density, improved timing, and higher reliability. The functional and architectural properties of STANDARD BLOCKs in the new IC architecture are defined by the STANDARD BLOCK architecture. In so doing, the STANDARD BLOCK architecture combines the advantages of standard-cell-based and functional-block-based architectures. Therefore, STANDARD BLOCK architecture brings higher levels of automation and integration to all levels of a design. With this architecture, design information flows through the entire design process and allows passing relevant information seamlessly between logical and physical design task boundaries.

Figure 6:
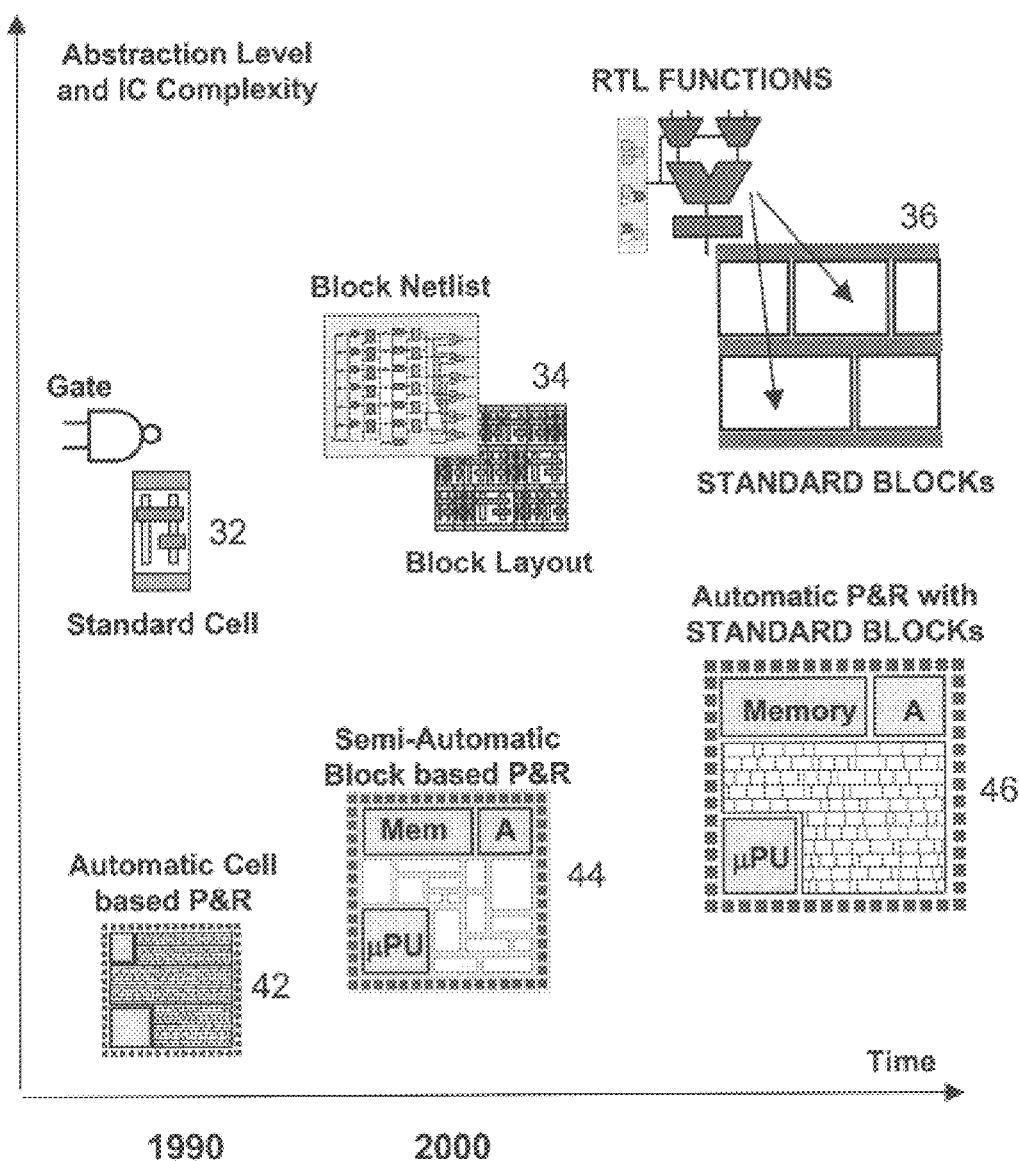
FIG. 6 illustrates the new trend set by the STANDARD BLOCK architecture and the continued evolution to a fully automatic IC design based on STANDARD BLOCKs.

In introducing the new IC architecture with STANDARD BLOCKs, the present invention establishes a new trend in IC design. FIG. 6 illustrates the departure from pre-existing approaches of the trend set by the STANDARD BLOCK architecture 46 and the continued evolution to a fully automatic design and assembly of STANDARD BLOCKs 36. As shown, the approach contemplated by the present invention is based on a level of abstraction that is different from the standard cell 32 and functional block 34 abstractions. Standard cells 32 are design primitives with fixed instances of logical and/or electrical equivalents that are typically available in a standard cell library. As will be later explained in more detail, STANDARD BLOCKs can be flexible library elements with parameter-determinable properties that enable the creation of multiple instances of equivalent logical and/or electrical implementation. Moreover, as semiconductor process technology evolves, standard cell dimensions decrease relatively to the increasing chip dimensions. Thus, quantization of standard cell dimensions does not scale with the evolution of semiconductor process technology. In contrast to standard cells dimensions, the quantization of STANDARD BLOCKs dimensions is substantially constant relative to chip dimensions and scales with the evolution of semiconductor process technology.

Figure 7:
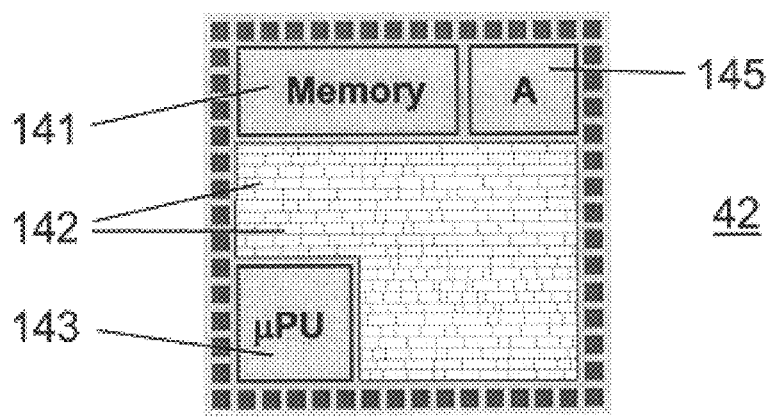
FIG. 7 illustrates the comparison of ICs designed with standard cells, functional blocks and STANDARD BLOCKs, respectively.
Figure 7:
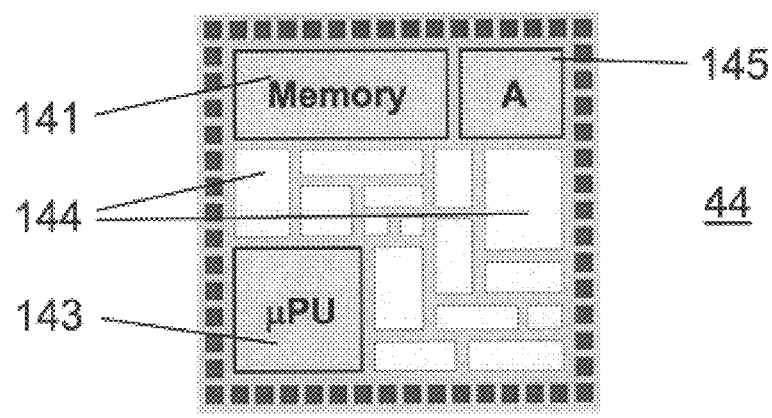
Figure 7:
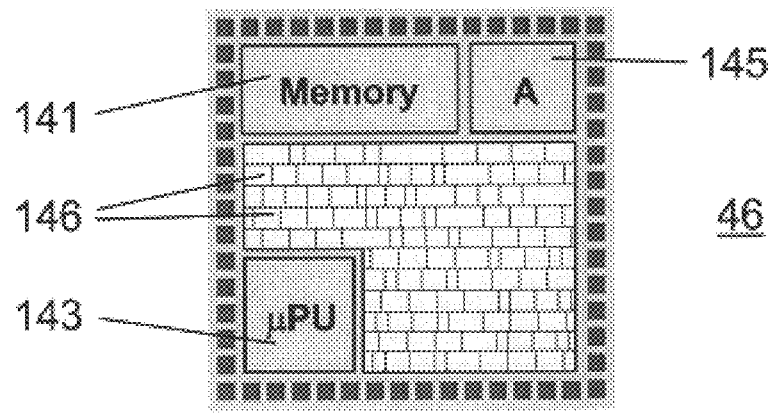

FIG. 7 illustrates the comparison of ICs designed with standard cells, functional blocks and STANDARD BLOCKs, respectively. The ICs also include pre-made hard IP blocks 141, 143, and 145 that are comprised of standard cells and/or custom circuitry. The soft IP portions of the IC design are implemented with standard cells 142 in the standard-cell-based architecture 42, functional blocks 144 in the functional-block-based architecture 44, and STANDARD BLOCKs 146 in the STANDARD BLOCK based architecture 46. Structurally, STANDARD BLOCKs granularity is larger than that of the standard cells since each STANDARD BLOCK contains a plurality of standard cells or cell rows. Also, because of the physically constrained form of STANDARD BLOCKs, the STANDARD BLOCK based architecture substantially eliminates the irregularity inherent in functional-block-based architecture. Namely, the regularity and substantial uniformity of STANDARD BLOCKs' form facilitates efficient placement of the STANDARD BLOCKs with substantially no waste of space on the silicon die. This, in turn, enables construction of the IC layout with higher density compared to a functional block based architecture. The STANDARD BLOCK architecture applies primarily to the soft IP portions of the IC design, however the hard IP portions of the IC design (Memory block 141, MPU block 143, and analog block 145 can be also implemented with STANDARD BLOCKs as will be later explained.

As a further comparison, standard-cell-based architecture 42 allows automatic placement and routing (P&R), but is either limited or impractical for processing ICs with millions of gates. Functional-block-based architecture 44 allows only semi-automatic assembly and, depending on the chip size, it is also limited or impractical for handling hundreds or more of functional blocks. In contrast, STANDARD BLOCK architecture, e.g. 46, allows automatic P&R and the ability to handle hundreds of millions of gates in thousands of STANDARD BLOCKs. Consequently the STANDARD BLOCK architecture provides substantially unlimited capacity to IC design tools, and particularly P&R tools. Furthermore, STANDARD BLOCK based IC design involves partitioning of the large logic design into STANDARD BLOCKs—i.e. a set of individual, and preferably self-contained functional entities—such that individual STANDARD BLOCK designs can be processed in parallel before being assembled. Moreover, timing budgets can be easily re-distributed among STANDARD BLOCKs and the timing re-budgeting is likewise automatic.

Figure 8A:
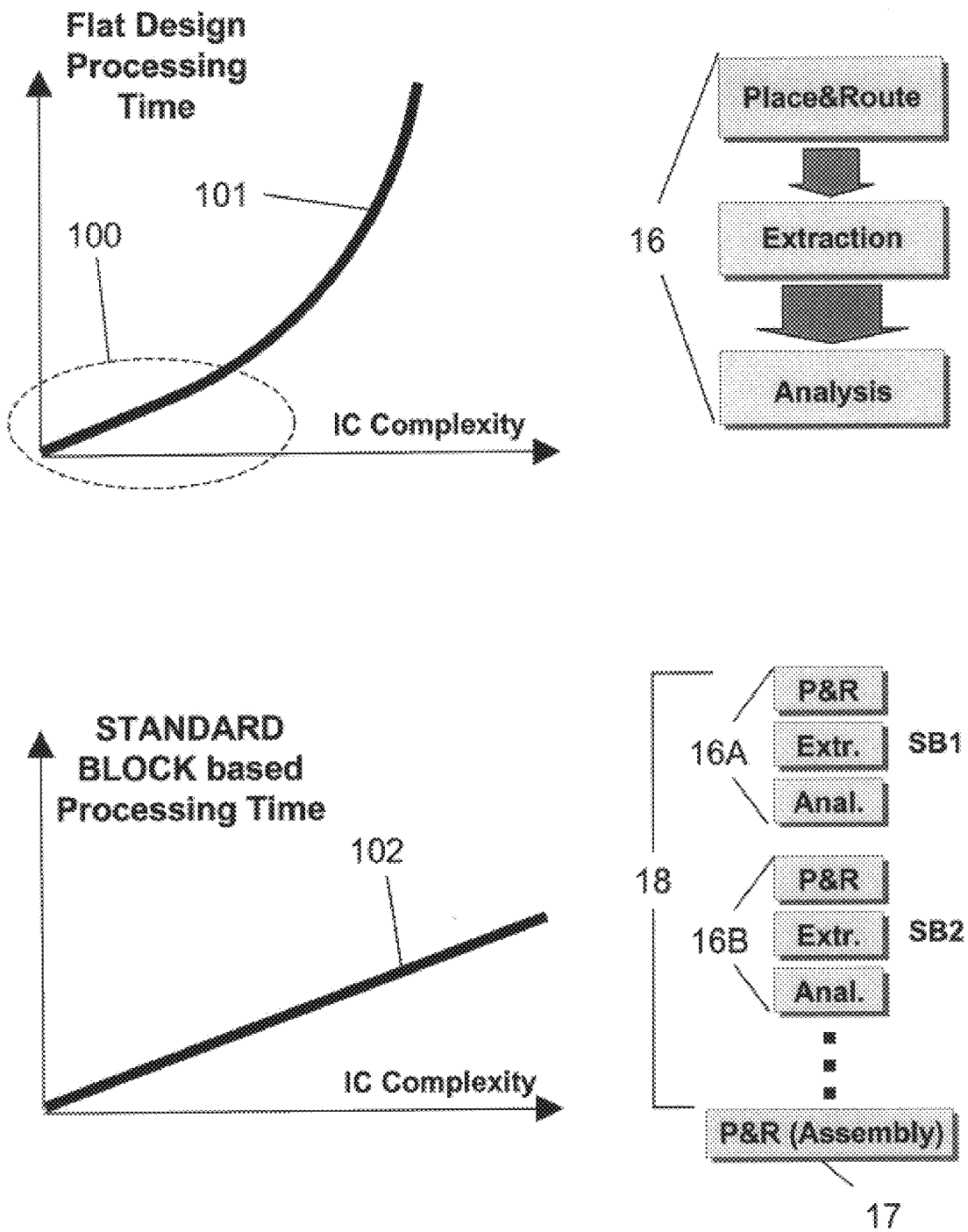
FIGS. 8A–D shows the relative design times of IC design processes with standard cell, functional blocks and STANDARD BLOCK architectures, respectively.

As to design time, the new IC architecture with STANDARD BLOCKs accelerates the IC design process, as illustrated in FIGS. 8A–D. FIG. 8A show the relative design times associated with flat (standard cell) and STANDARD BLOCK designs in a uni-processor design environment. Standard-cell-based design is non-hierarchical (hence flat) in which all the standard cells are processed 16 to form the IC. As shown, IC design time increases 101 for ICs designed with standard cells are non-linear relative to increases in IC complexity (gate count) above a certain level of IC complexity 100. In contrast, design time increases 102 for ICs designed with STANDARD BLOCKs are linear throughout. Although, as will be further explained herein, STANDARD BLOCKs are self contained functional entities that can be individually designed concurrently, in a uni-processor environment they are designed serially (16A, 16B, etc.). However, the implementation of each STANDARD BLOCK (16A, 16B, etc.) and the assembly 17 of STANDARD BLOCKs is relatively simple and automatic, such that the collective time of all the processes is less than the collective time of the flat standard cell based design process 16.

Figure 8B:
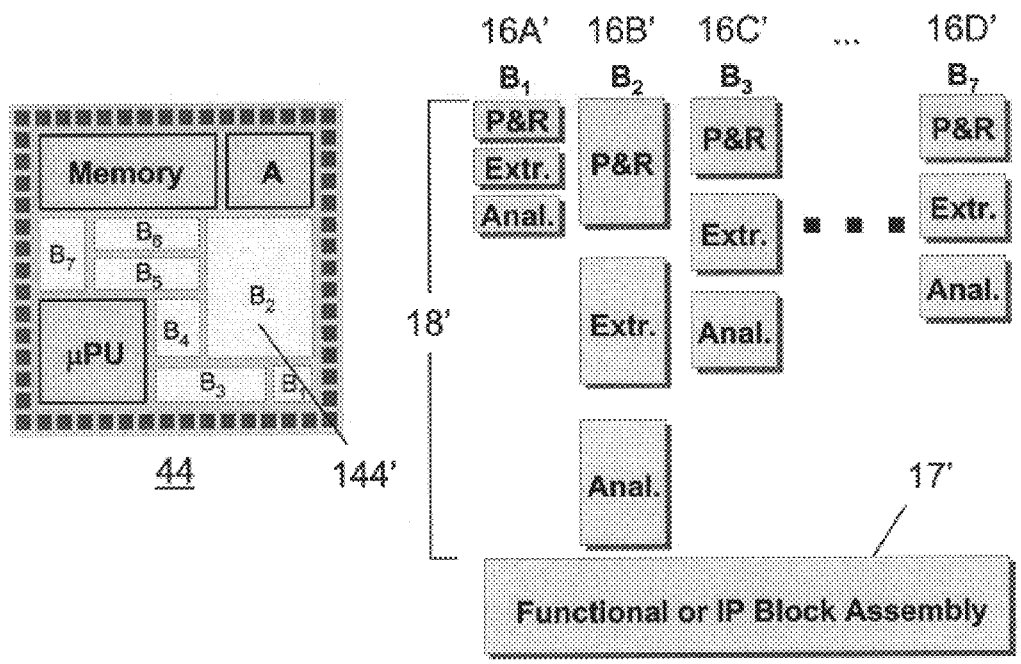
Figure 8B:
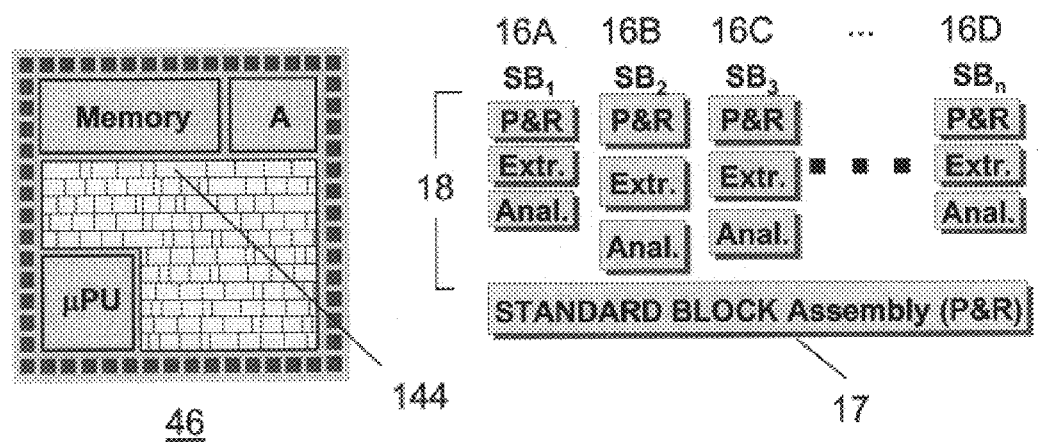

FIG. 8B show the relative design times associated with functional block and STANDARD BLOCK based designs in a multiprocessor design environment. Functional blocks and, similarly STANDARD BLOCKs, are complete functional entities, although not necessarily with similar functional boundaries. As a result, functional blocks, and likewise STANDARD BLOCKs, can be processed individually but concurrently (16A'–D' and 16A–D, respectively). In either of the concurrent design styles, the design time (18' and 18, respectively) is as long as the longest individual design cycle (16B' and 16B, respectively) which is typically associated with the largest block among the blocks processed (144' and 144 respectively). The difference between functional block based and STANDARD BLOCK based designs is that functional block design times are far more diverse and, on average, longer than STANDARD BLOCKs design times. Furthermore, if the netlist hierarchy contains repeated structures (logic portions of the netlist) that can each be mapped into a STANDARD BLOCK, the physical implementation of the repeated structures can be replicated (without repeating their design). As a result, the total number of individual STANDARD BLOCKs being actually processed can be considerably lower. Notably also, functional or IP blocks assembly 17' is semi-automatic thus more complex and time consuming than the automatic assembly 17 of STANDARD BLOCKs. Assembly of STANDARD BLOCKs can be advantageously accomplished with conventional automatic P&R tools.

Figure 8C:
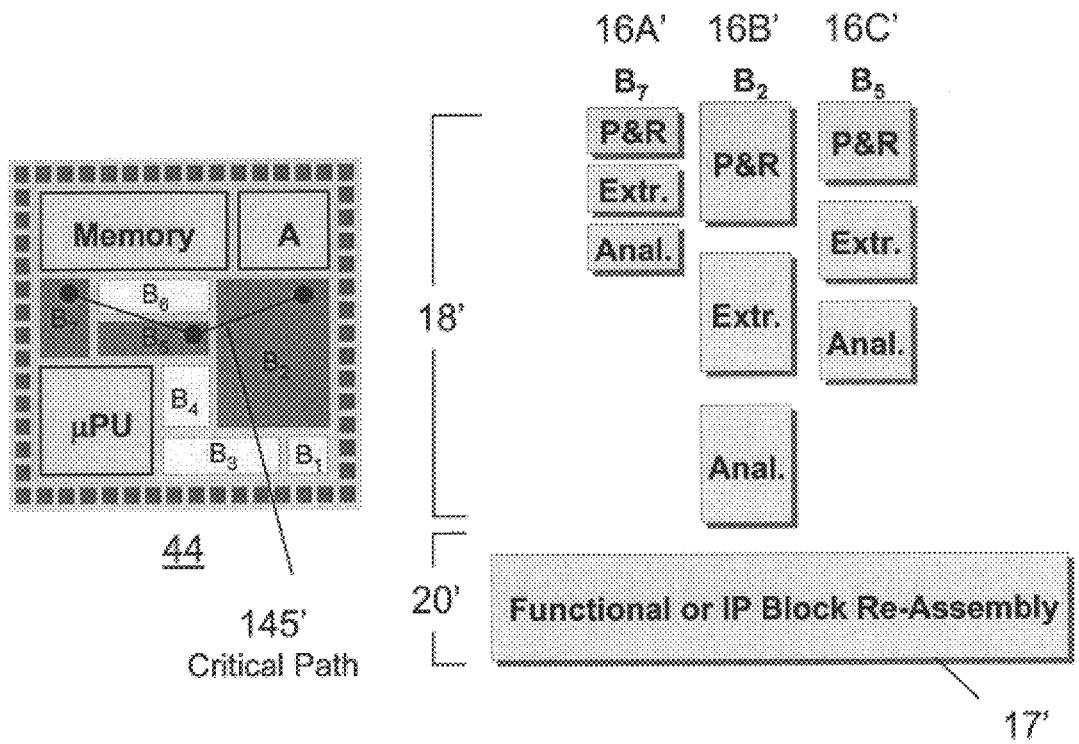
Figure 8C:
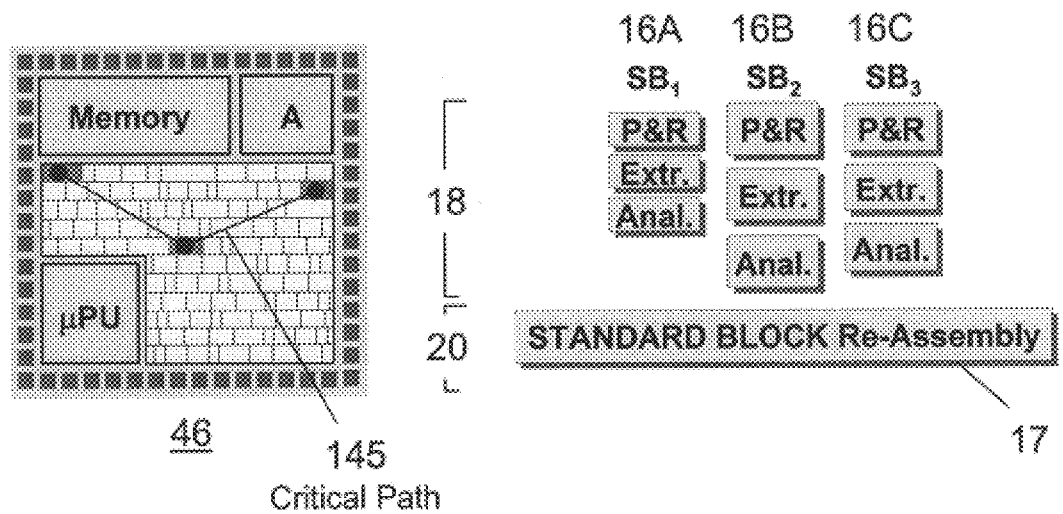

In addition, the design time in response to engineering change orders (ECOs) is longer for functional block based design than STANDARD BLOCK based design, as shown in FIG. 8C. This is true because STANDARD BLOCKs can be concurrently re-designed and automatically re-assembled with introduction of minimal perturbation in the overall layout. For example, in the functional-block-based design, when a critical path (145') spanning across functional blocks is affected by an ECO, a large portion of the design is perturbed requiring a significant re-redesign (16A'–C'). In a STANDARD BLOCK based design, only the affected STANDARD BLOCKs may need to be redesigned and the re-assembly process is faster when done with conventional placement tools. Namely, the collective time for optimizing a critical path (145 and 145', respectively) in response to an ECO is shorter for STANDARD BLOCK based design methodology as compared with functional block based design methodology.

Figure 8D:
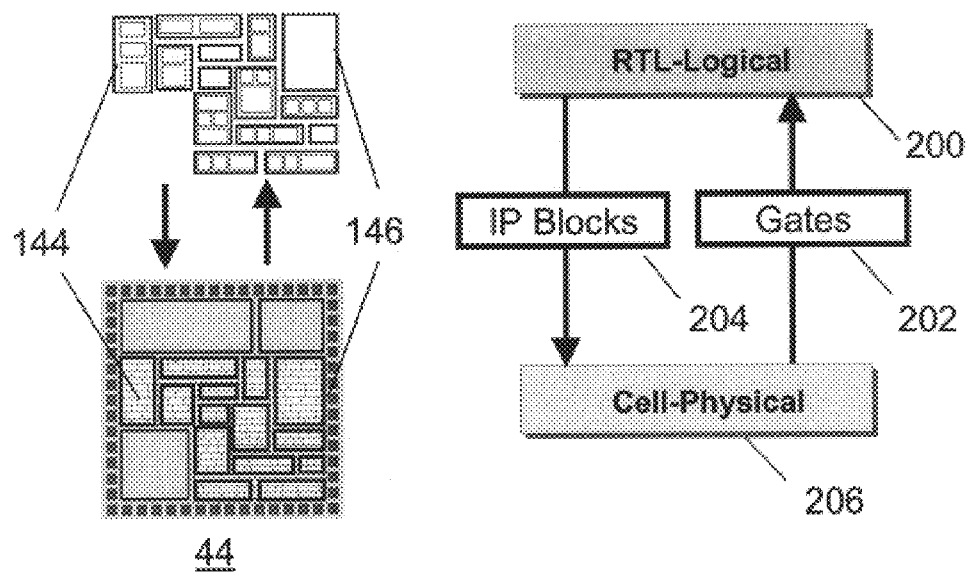
Figure 8D:
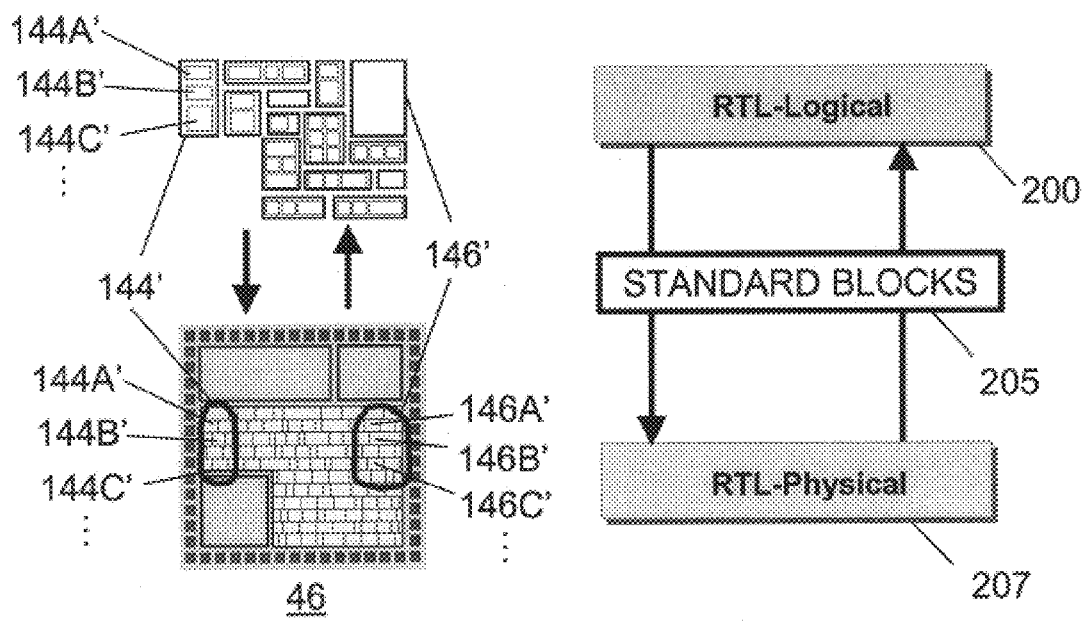

Further in relation to the foregoing differences, FIG. 8D illustrates a comparison between functional (or IP) block and STANDARD BLOCK based design regarding the information exchange between front-end (logical) and back-end (physical) design teams. In a STANDARD BLOCK based design methodology, the information gap between logical and physical design teams can be bridged more easily. This information gap exists because front-end teams work at the RTL level, while back-end teams work at the gate (or cell) level. In general, front-end designers implement large functional blocks out of smaller modular RTL sub-blocks either because of historical capacity limitations of front-end synthesis tools, or as part of well structured design methodologies. The RTL sub-blocks are typically linked together to create functional blocks. The functional blocks are then linked together to create a complete netlist for the IC. The netlist is passed from the front-end teams to the back end teams for the physical IC implementation. However, even though the complete netlist may be organized as a collection functional blocks (each one containing sub-parts of the netlist), the actual physical design is done using a flat cell based approach. As a result, reconciling design issues between front-end and back-end teams in functional block based design methodology is difficult.

In contrast, this communication gap is bridged when using the new IC architecture with STANDARD BLOCKs. For example, when a functional block hierarchy 144 consists of RTL sub-blocks, these RTL sub-blocks can be mapped into corresponding STANDARD BLOCKs (see functional block 144' made of STANDARD BLOCKs 144A', 144B', 144C', etc.). When a functional block 146 is physically larger than the STANDARD BLOCK's allowable size, the functional block can be physically partitioned into a collection of STANDARD BLOCKs during the physical design phase (see functional block 146' made of STANDARD BLOCKs 146A', 146B', 146C', etc.). Also, since one or more STANDARD BLOCKs provide a physical implementation of one or more functional sub-blocks, they become a common platform of communication and information exchange between the logical and physical design teams.

As explained, STANDARD BLOCKs are created by partitioning IC design (e.g., RTL full hierarchy or netlist) into smaller parts or modules. The partitioning is based, for example, on functionality, number of gates (or cells), number of pins per STANDARD BLOCK, total dimensions of the chip, etc. The number of cells and pins in each part can vary in a range between predefined minimum and maximum, as noted above. The smaller parts are then mapped into the physical STANDARD BLOCKs. This modular approach can be adapted to any logic functionality (expressed as soft or hard IP).

Figure 9A:
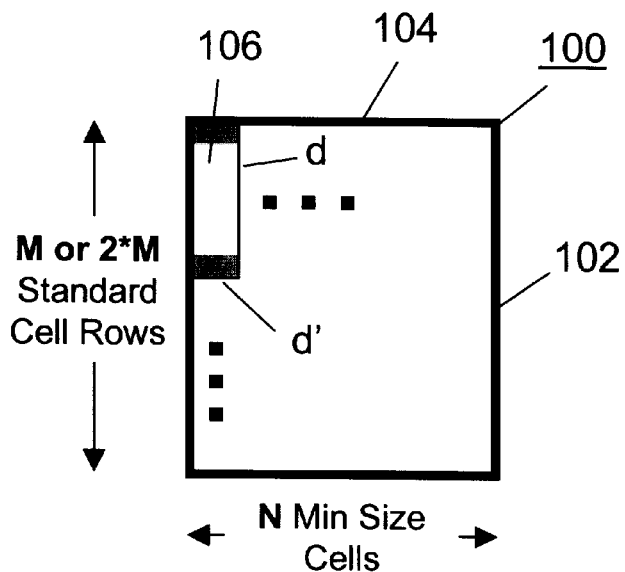
FIGS. 9A and 9B illustrates preferred structures of the STANDARD BLOCK.
Figure 9A:
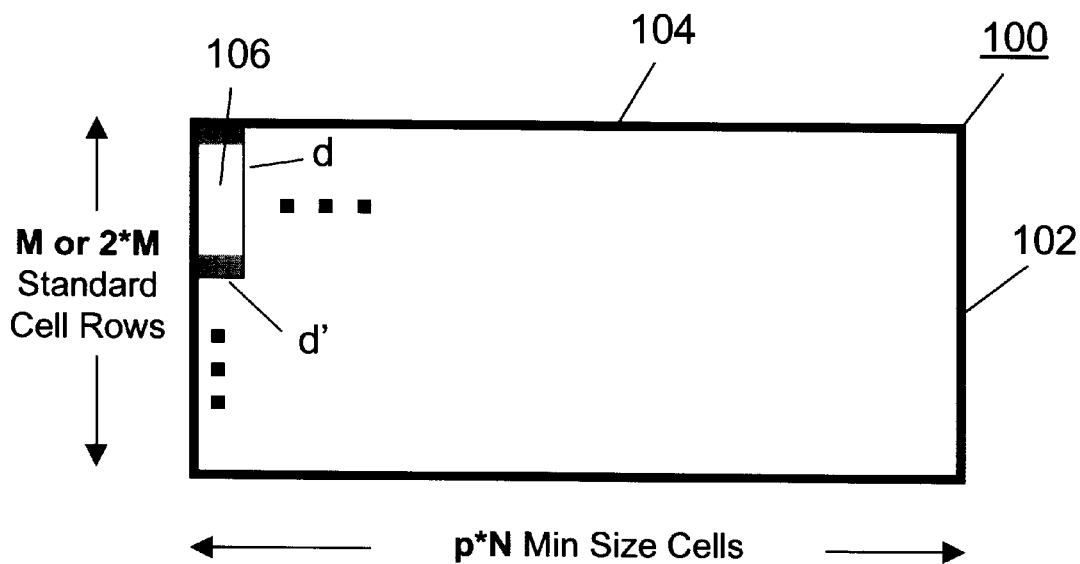
Figure 9B:
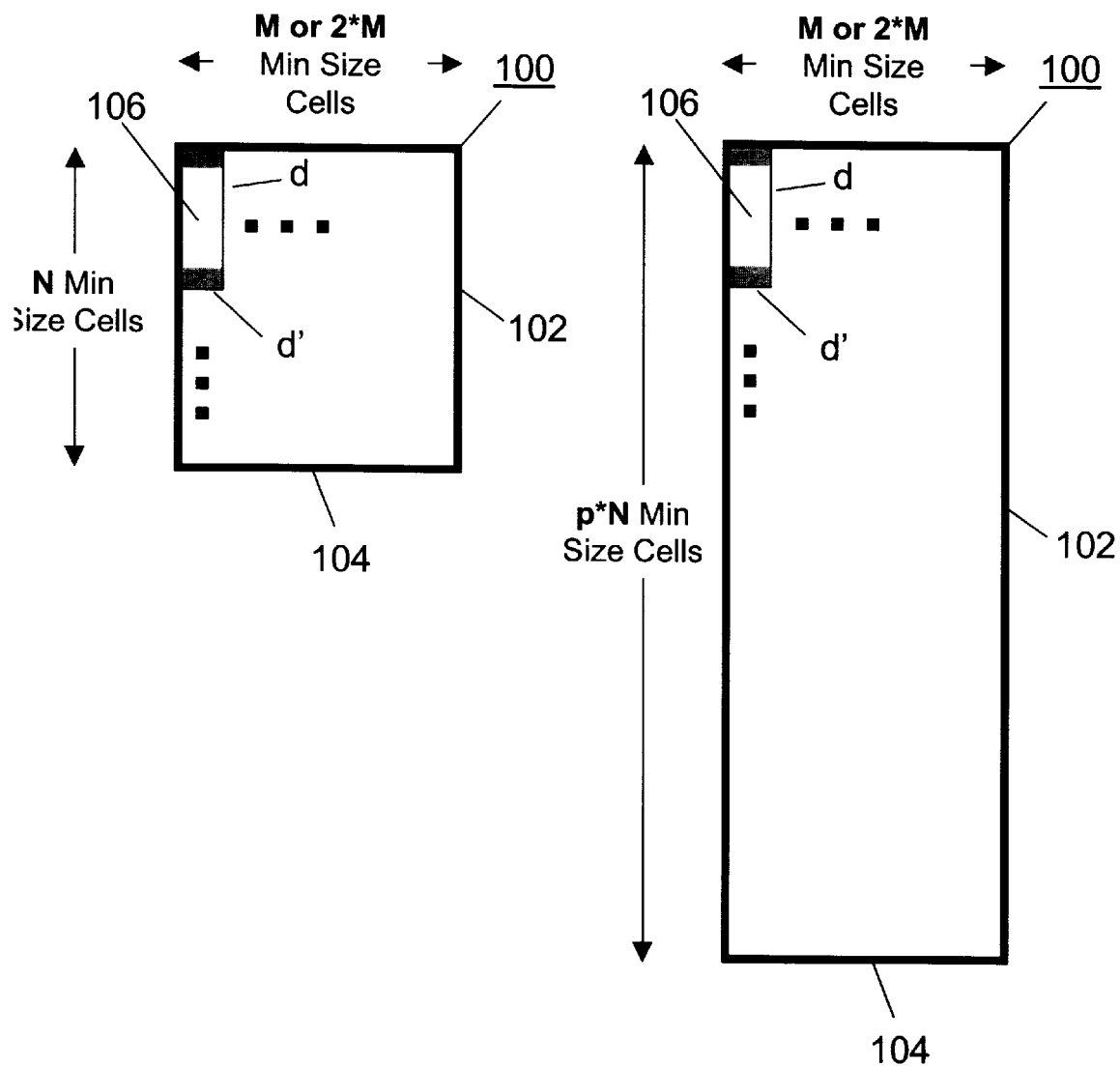

In any IC layout formed with the new IC architecture, the STANDARD BLOCKs are created as general abstractions having a physically constrained form yet flexible physical design properties. FIGS. 9A and 9B illustrates preferred structures of the STANDARD BLOCK. As mentioned, a basic building block of the STANDARD BLOCK 100 is the standard cell 106. It is noted, however, that STANDARD BLOCKs can include any standard cell from the selected design library. Standard cells typically have a rectangular footprint with given dimensions. As a result, the dimensions, i.e., height 102 and width 104, of STANDARD BLOCKs can be indicated in terms of number of cells. With the number of cells being optimized for top-level design, as noted above, each of the STANDARD BLOCKs can include thousands of cells, and preferably includes an approximate range of a thousand to tens of thousands of gates. It is further noted that, preferably, the cell dimensions are attributed to the smallest standard cell available in the design library, although, as mentioned before, STANDARD BLOCKs can include any standard cells from the cell library. Namely, for optimal use of the IC die space, the dimensions—i.e., height and width—of STANDARD BLOCKs are relative to the dimensions of a minimal size cell in the cell library.

Alternatively, the dimensions, i.e., height 102 and width 104, of STANDARD BLOCKs can be indicated in terms of number of grids or number of sites. A "grid" denotes a spacing rule between interconnects, typically measured as the sum of a layer width plus same layer spacing. A "site" is an area reserved for a cell (typically expressed in grids), and most commonly is associated with the dimensions of the smallest cell in the library, typically an inverter or buffer.

In terms of form, one STANDARD BLOCK dimension is fixed or quantized and the other dimension is variable and ranging between predetermined limits (See: height 102 in FIG. 9A and width 104 in FIG. 9B). The dimensions of STANDARD BLOCKs within a particular IC layout are set for the given IC design and process technology and are additionally dependent on the overall chip size and placement algorithms. The fixed or quantized STANDARD BLOCK dimension is, in essence, equivalent to a fixed or quantized number of cell rows (or grids or sites) within the STANDARD BLOCK. The fixed or quantized STANDARD BLOCK dimension is set to a constant number, M, of multiples of a cell (grid or site) dimension, or multiples, q, of M (i.e., qM). Preferably, this STANDARD BLOCK dimension is either M or 2M times the minimal cell dimension (i.e., M*d or 2M*d, where d is the minimal cell dimension). This configuration eliminates height/width irregularities responsible for forming space-consuming gaps during placement. Setting the STANDARD BLOCK height/width to no more than 2M times the cell dimension helps keep the placement algorithms simpler, although this STANDARD BLOCK dimension can be fixed to other multiples of M without departing from the scope and spirit of the invention.

The variable dimension of STANDARD BLOCKs is limited to a range (See: width 104 in FIG. 9A and height 102 in FIG. 9B). Restricting the range in this manner ensures efficient row-based (or column-based) placement of the STANDARD BLOCKs by abutment. The variable dimension equals to multiples of a second dimension of the cells (or grids or sites), d', where the number of second dimension multiples varies from a minimum, N, to a maximum pN (i.e., multiples, p, of N). That is, the variable dimension of STANDARD BLOCKs varies from N*d' to pN*d'. By restricting the variable dimension of STANDARD BLOCKs into such a range conventional placement tools can be utilized, thus making the top-level assembly task robust and fully automatic.

Figure 9C:
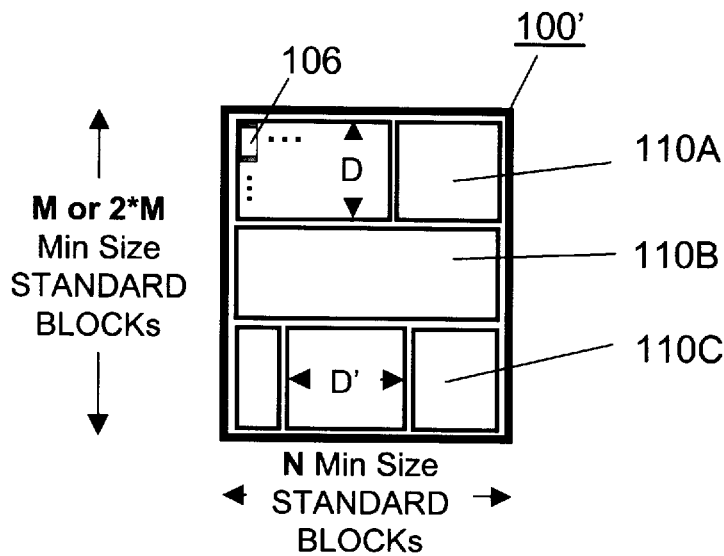
FIG. 9C illustrates preferred structures of multilevel or hierarchical STANDARD BLOCKs.
Figure 9C:
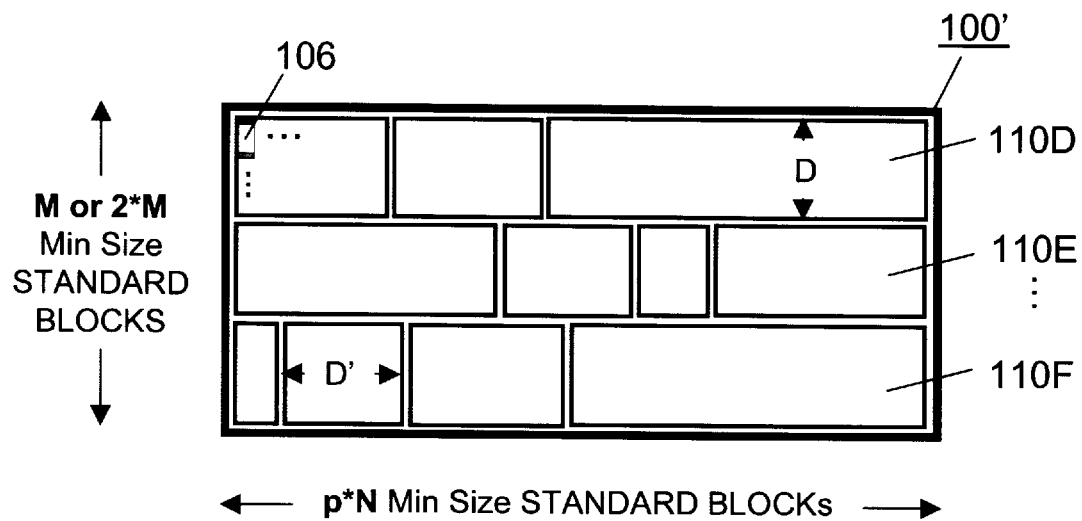

As previously noted a STANDARD BLOCK may also include a hierarchy of STANDARD BLOCK sub-blocks. FIG. 9C illustrates a preferred structure of a multilevel or hierarchical STANDARD BLOCK 100'. One dimension of the multilevel STANDARD BLOCK is fixed or quantized and is equal to a constant number, M, of multiples of a sub-block (preferably minimal sub-block) dimension, D, or multiples, q, of M (i.e., qM). Preferably, q is no greater than 2 such that the fixed or quantized dimension equals M*D or 2M*D. The other dimension of the multilevel STANDARD BLOCK is variable and ranging between NED' and pN*D', where D' is the other dimension of the sub-block (preferably minimal sub-block).

Figure 10A:
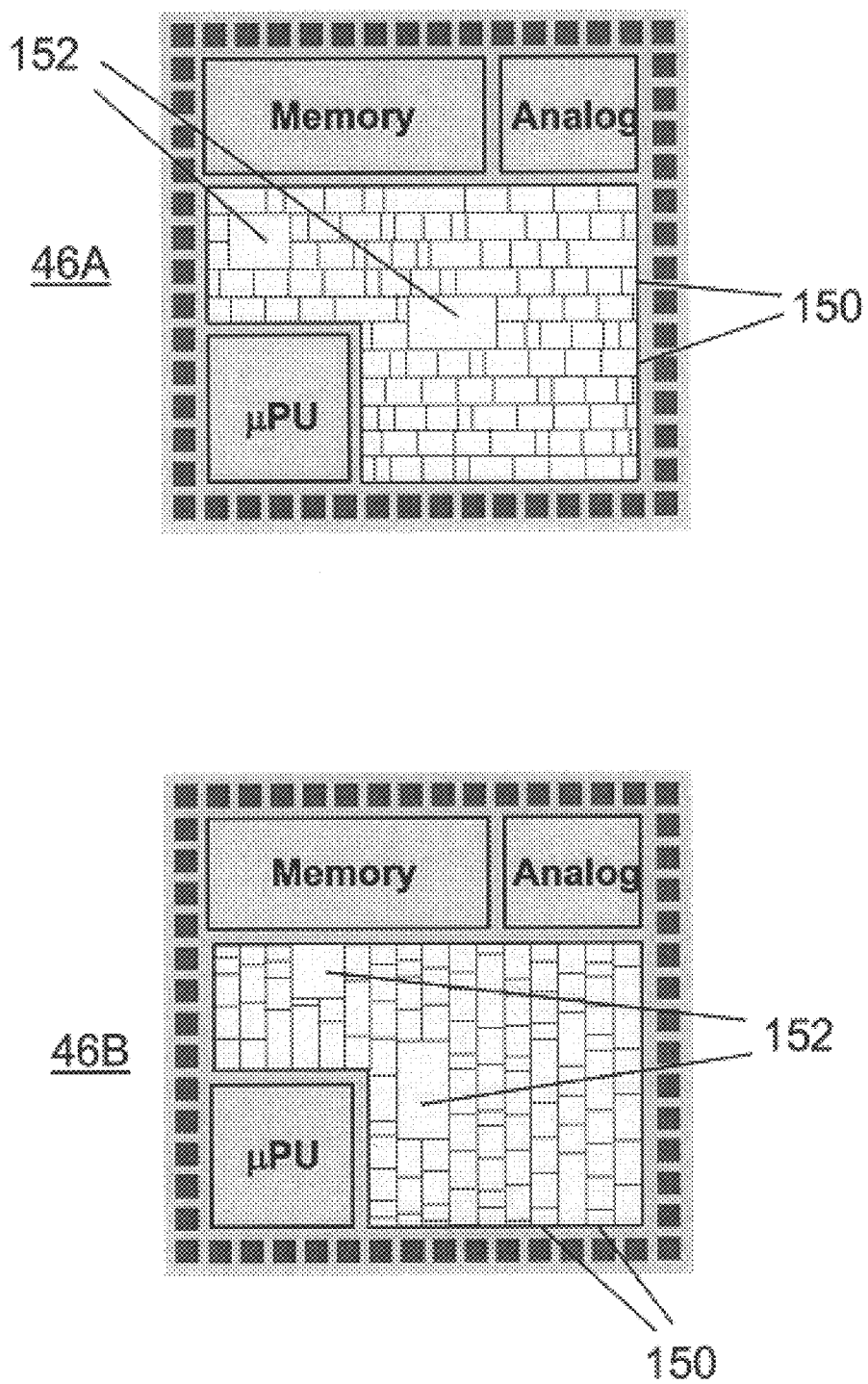
FIGS. 10A–D illustrate alternative architectures utilizing STANDARD BLOCKs.
Figure 10B:
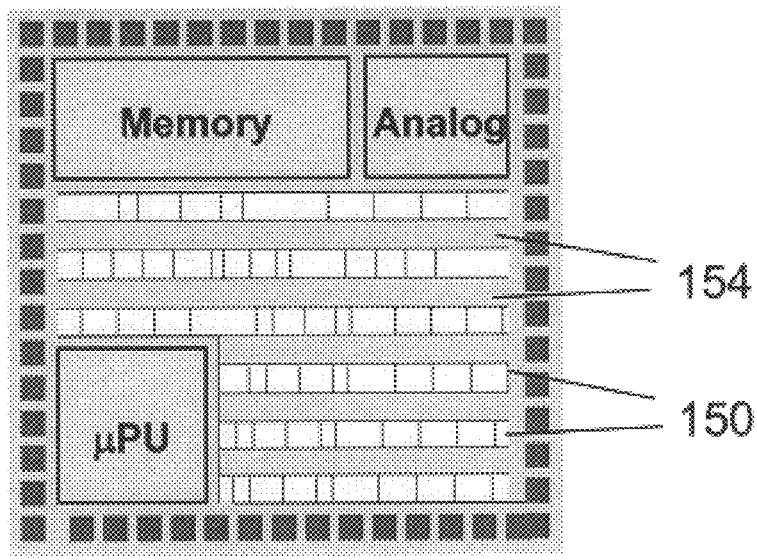
Figure 10B:
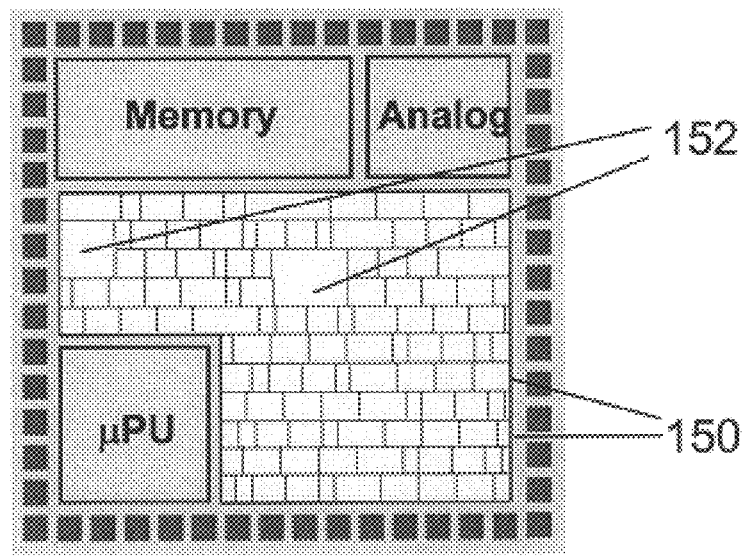

As shown on FIGS. 10A and 10B, the new IC architecture 46A–D is implemented with STANDARD BLOCK ARRAYs, in which STANDARD BLOCKs are placed adjacent to each other in a row or column configuration 150 (STANDARD BLOCK ARRAY is a trademark of Ammo-Core Technology Inc.). This configuration creates a more compact layout of an IC with the new IC architecture. In either configuration, the STANDARD BLOCKs are placed abutted to each other with their fixed or quantized dimension aligned and oriented in the same direction (which is perpendicular to the STANDARD BLOCK ARRAY direction). In an exemplary STANDARD BLOCK ARRAY configuration, all STANDARD BLOCKs in the same row have the same height 150. In a second exemplary STANDARD BLOCK configuration, some STANDARD BLOCKs 150 populate a single row while others 15 populate a plurality of rows. That is, some STANDARD BLOCKs have the same height which is also the row height while others have a quantized height set to multiples of a fixed value (e.g., multiples of one, two etc. of the same height such as the row height) and are abutting multiple STANDARD BLOCKs. (Although it is not preferred, STANDARD BLOCKs each having a multiple-row height can be placed abutted to each other without departing from the scope and spirit of the invention. For example, STANDARD BLOCKs populating two rows, i.e., having a double-row height, can be placed next to each other.) The width of STANDARD BLOCKs in any of the rows is variable and ranging between predefined limits. As a further example, all STANDARD BLOCKs in a column based configuration have the same width and a variable height, and/or a quantized width and a variable height.

It is important to understand that the STANDARD BLOCK ARRAY is not always fully populated (100% utilization) with STANDARD BLOCKs. Namely, STANDARD BLOCKs are not always placed all abutted to each other which leaves some empty spaces (or gaps) in the STANDARD BLOCK ARRAY (not shown). As will be later explained, these gaps can be filled with top-level cells and power rails.

Figure 10C:
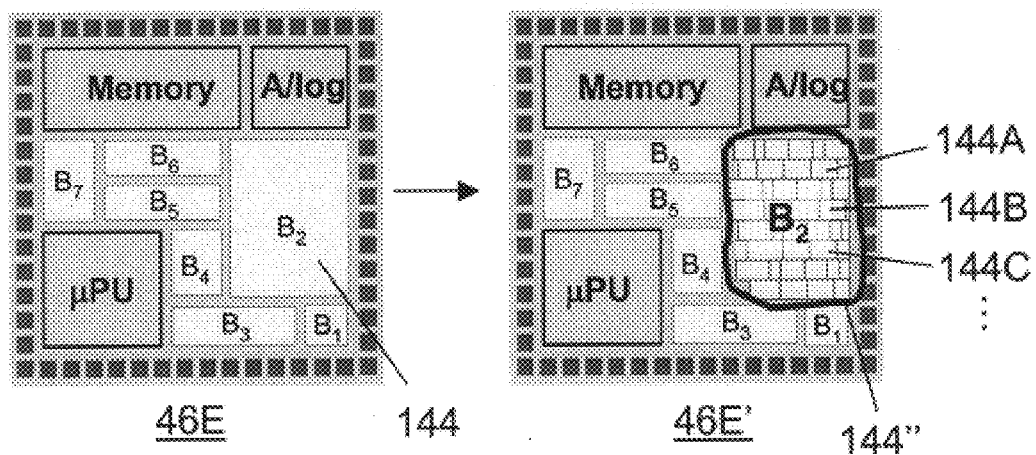
Figure 10C:
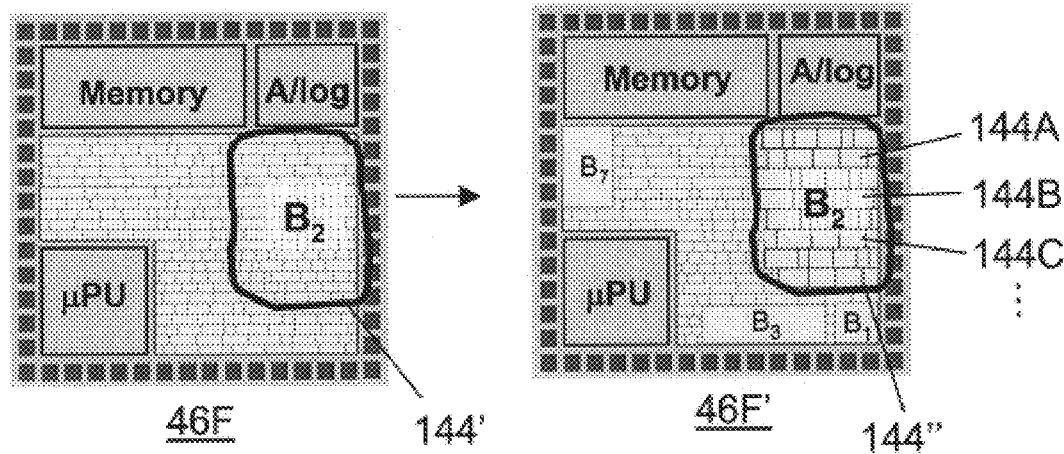
Figure 10D:
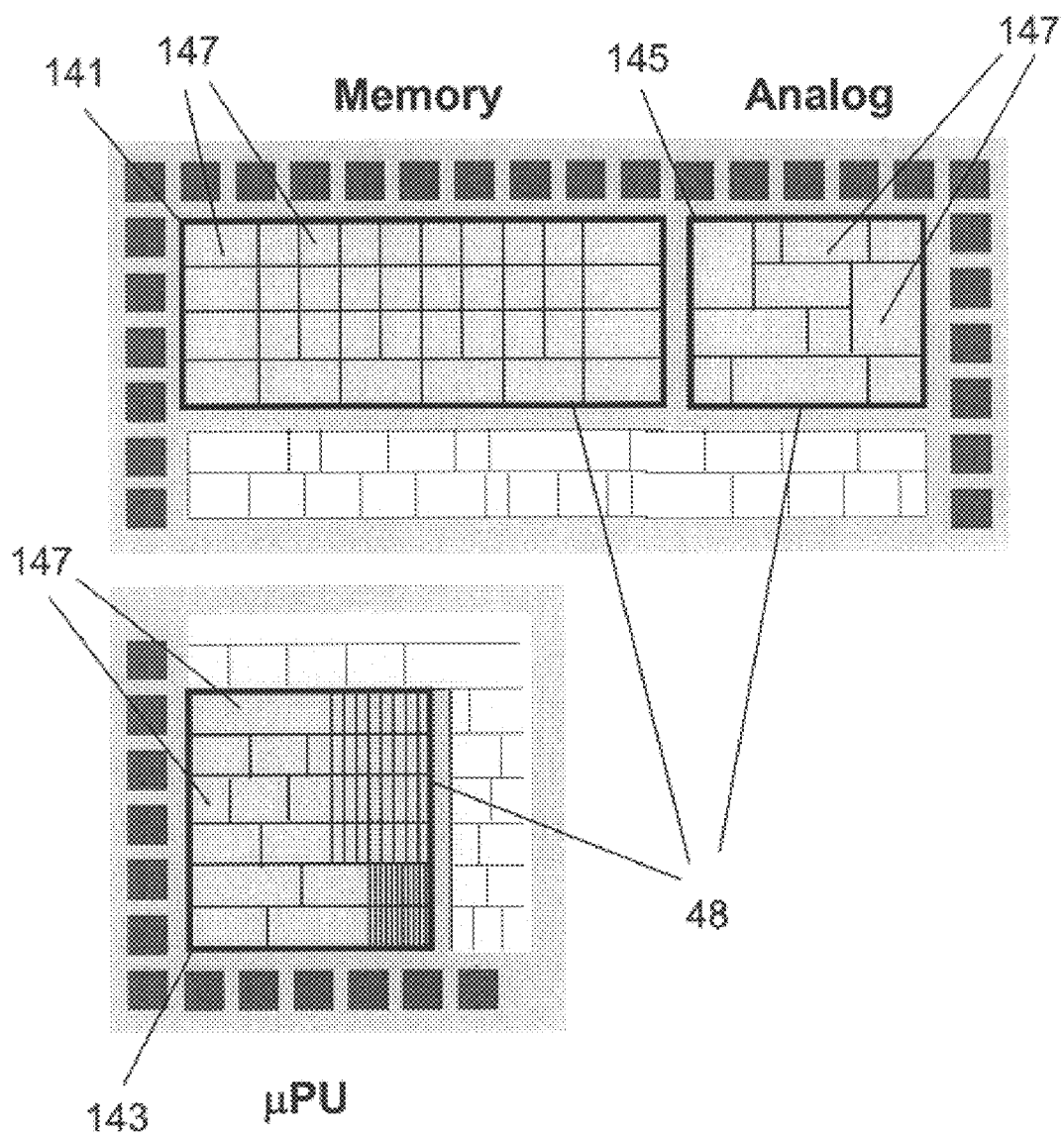

FIG. 10B illustrates alternative IC architectures 46D and 46C with STANDARD BLOCKs, with and without channels 154. In general, channels 154 are spaces not occupied by standard cells and/or functional blocks. With STANDARD BLOCK architecture, channels are spaces not occupied by STANDARD BLOCKs, standard cells and functional blocks. Channels are commonly used for routing interconnects. In STANDARD BLOCK architecture with STANDARD BLOCK arrays configured as either rows (as in 46C, FIG. 10), or columns (not show), the channels 154 are spaces between the rows (or columns). Channel height in a row based configuration (or channel width in a column based configuration, not shown) may be any size depending upon the amount of routing resources needed. A STANDARD BLOCK based configuration without channels (which occurs when channel size is reduced to zero) enables higher IC density and typically requires more layers of metal (for routing over instead of between the IC parts). FIG. 10C illustrates alternative new IC architectures designed with mixed design styles. An IC layout 46E designed with functional blocks can be alternatively designed as a mixed functional block and STANDARD BLOCK based IC layout 46E'. In such layout, the functionality of one or more of the functional blocks (e.g., B2 144' and 144") is implemented with a collection of STANDARD BLOCK(S) 144A, 144B, etc. Similarly, an IC layout 46F designed with standard cells can be alternatively designed as a mixed standard cell, STANDARD BLOCK, and functional block based IC layout 46F' in which the functionality of a group of cells (e.g., B2 144' and 144") is designed in STANDARD BLOCK(s) 144A, 144B, etc.

As noted before and as shown in FIG. 10D, hard IP blocks 48 (e.g. memory 141 and MPU 143) can be created from an assembly of individual STANDARD BLOCKs 147. Some functionality, e.g., a memory and a memory access control function, can be implemented in separate STANDARD BLOCKs such that a combination of the STANDARD BLOCKs can form a complete functional entity. For example, the memory block 141 can be an assembly of STANDARD BLOCKs each with address decoders, I/O buffers, or memory cells functionality. These functionalities and, in turn these STANDARD BLOCKs, can be repeated in every hard IP block design as many times as needed. Furthermore, other STANDARD BLOCKs in the IC can be designed for additional functions such as, datapath for MPU block 143, or sense amplifiers for analog block 145. The aggregation of the STANDARD BLOCK and/or STANDARD BLOCK can be assembled to form a complete functional entity such as the memory 141, MPU 143, or analog 145 blocks.

Figure 11:
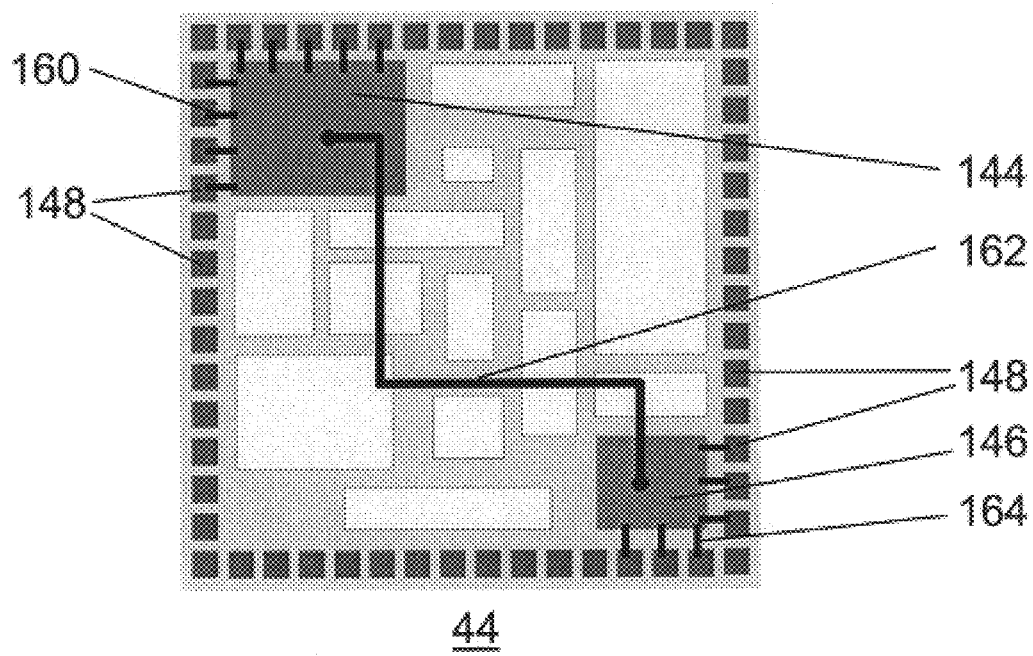
FIG. 11 illustrates how the STANDARD BLOCK structural features (i.e., granularity and form regularity) facilitate better compliance with design requirements.
Figure 11:
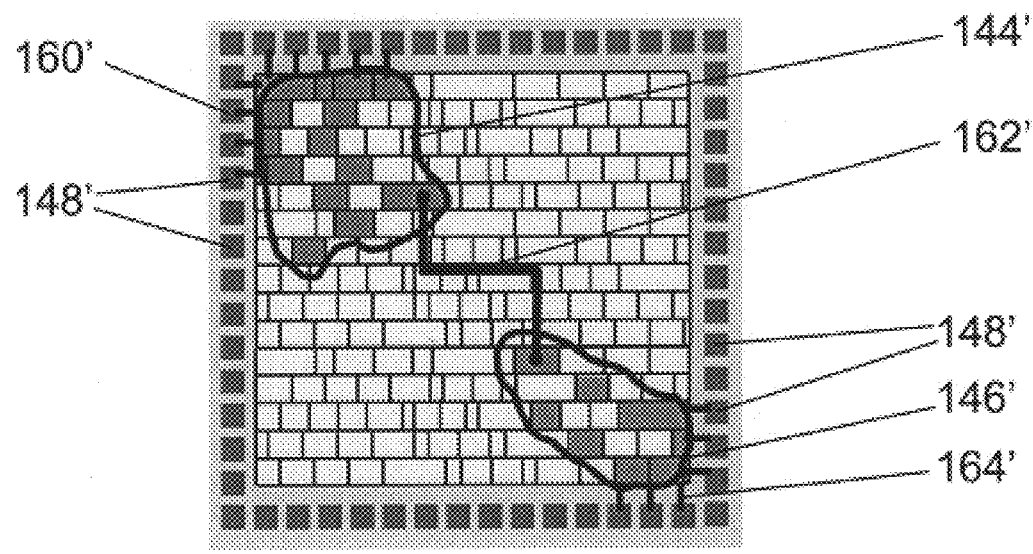

FIG. 11 illustrates how the aforementioned STANDARD BLOCK structural features (i.e., granularity and form regularity inherent in STANDARD BLOCK architecture) facilitate better compliance with design requirements such as timing and density. In this example, a functional block architecture 44 may have two rigid functional blocks 144 and 146 that need to satisfy signal path timing requirements (which may be achieved by shortening all interconnects 162 between the functional blocks and likewise interconnects 160 and 164 between these functional blocks and the I/O pins 148 of the chip). This problem may be unsolvable in a functional block based architecture 44 because the rigid nature of functional blocks 144 and 146 allows only a limited number permutations for optimizing placement and interconnect length. However, if the two functional blocks 144 and 146 are alternatively implemented with STANDARD BLOCKs 144' and 164' with the STANDARD BLOCK architecture 46, the problem can be more easily solved. Namely, the flexibility of STANDARD BLOCK architecture 46 allows more P&R permutations and facilitates optimization of both placement and interconnect routing simultaneously. By enabling more efficient placement and shorter interconnects among STANDARD BLOCKs placed by abutment, the granularity and form regularity inherent in STANDARD BLOCK architecture results in both higher chip density and better simultaneous timing optimization than in functional block based design.

FIG. 11 also illustrates how the aforementioned STANDARD BLOCK structural features (i.e., granularity and form regularity inherent in STANDARD BLOCK architecture) can simplify design reuse with hard IP. One of the fundamental premises that drives the industry toward functional block-based design methodologies is that chips have become too complex to design from scratch. With design reuse, canned functional blocks designs can be reused and combined to form the desired chip, (just as numerous chips are combined on a printed circuit board (PCB)). In a functional block based design, pre-existing designs of IP functional blocks—known as cores, virtual components, are stored in a computer, and they are mixed and matched to create, for instance, a system-on-chip (SOC). Functional blocks are provided in two forms, soft IP and hard IP. Soft IP is provided in RTL (or gate level netlist) form which affords flexibility and process independence but requires the additional process (the physical design implementation) of conversion to hard IP before manufacturing the chip. Hard IP is provided in ready to use layout form, but it is inflexible (or rigid as explained before) and applicable only to a specific manufacturing process.

However, if hard IP (e.g., functional block 144 and 146) is alternatively implemented as a collection of STANDARD BLOCKs (e.g. 144' and 146') the hard IP can be both flexible and ready for reuse. This "flexible hard IP" approach enables rapid SOC or other IC prototyping (i.e., exploring multiple permutations of placement and timing prior to actual layout of the STANDARD BLOCKs), and helps maximize design predictability, and better compliance with design requirements.

Internally, STANDARD BLOCKs are further structurally characterized as being general and flexible enough to accommodate various configurations of power grids, clock grids, top-level cells, etc. These structural features are preferably predefined for the given IC design and process technology. However, the discussion later explains that, as flexible library elements, STANDARD BLOCKs have certain architectural characteristics that allow a later determination of their final functional configuration. For example, areas reserved in STANDARD BLOCKs are presented as an abstraction to the top-level assembly tool and can be configured with pins, interconnects, buffers, repeaters, and/or other glue logic in the top-level assembly phase. FIGS. 12A–12F illustrate these architectural features.

Figure 12A:
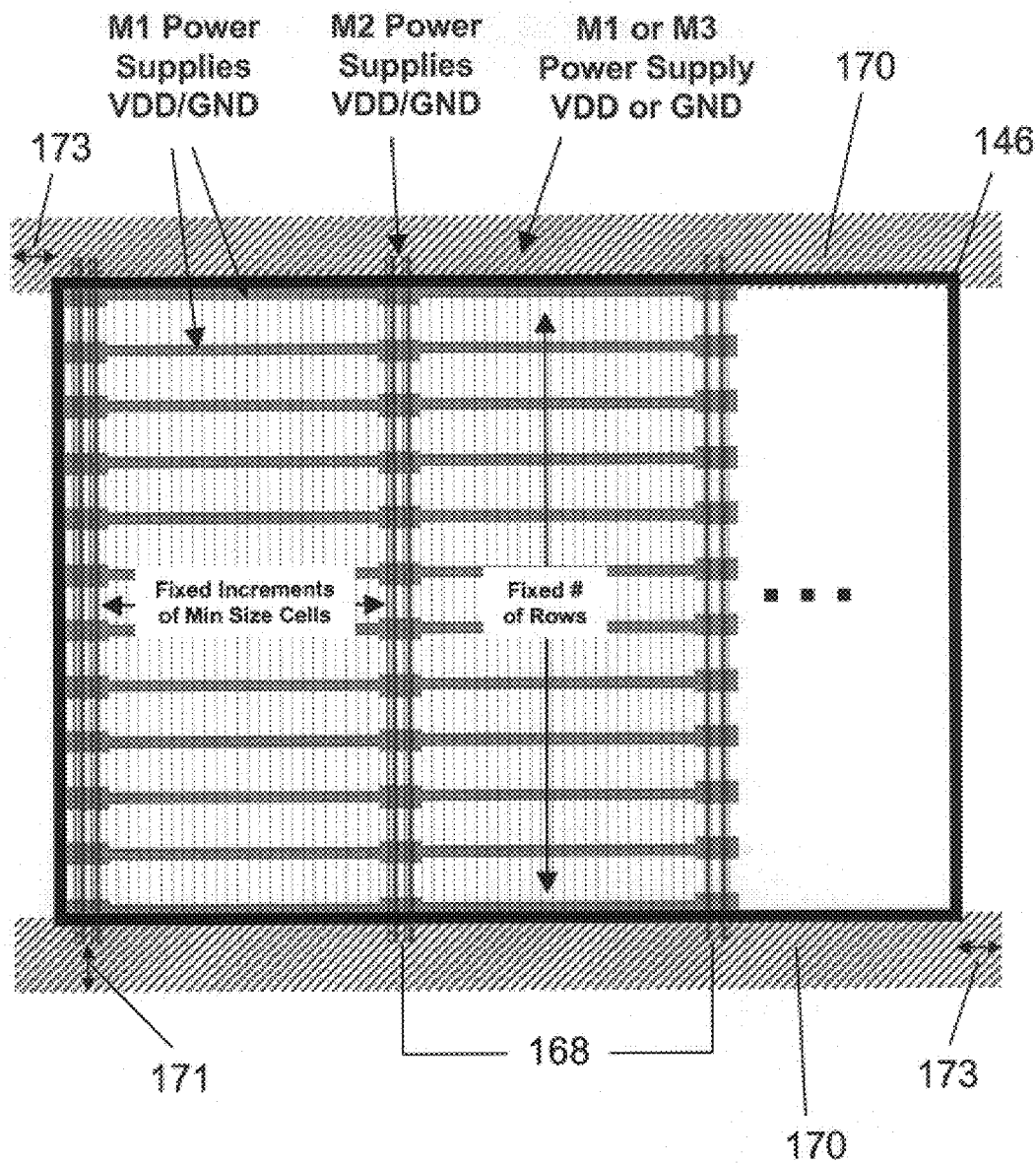
FIGS. 12A–E illustrate the architectural features of STANDARD BLOCKs.
Figure 12B:
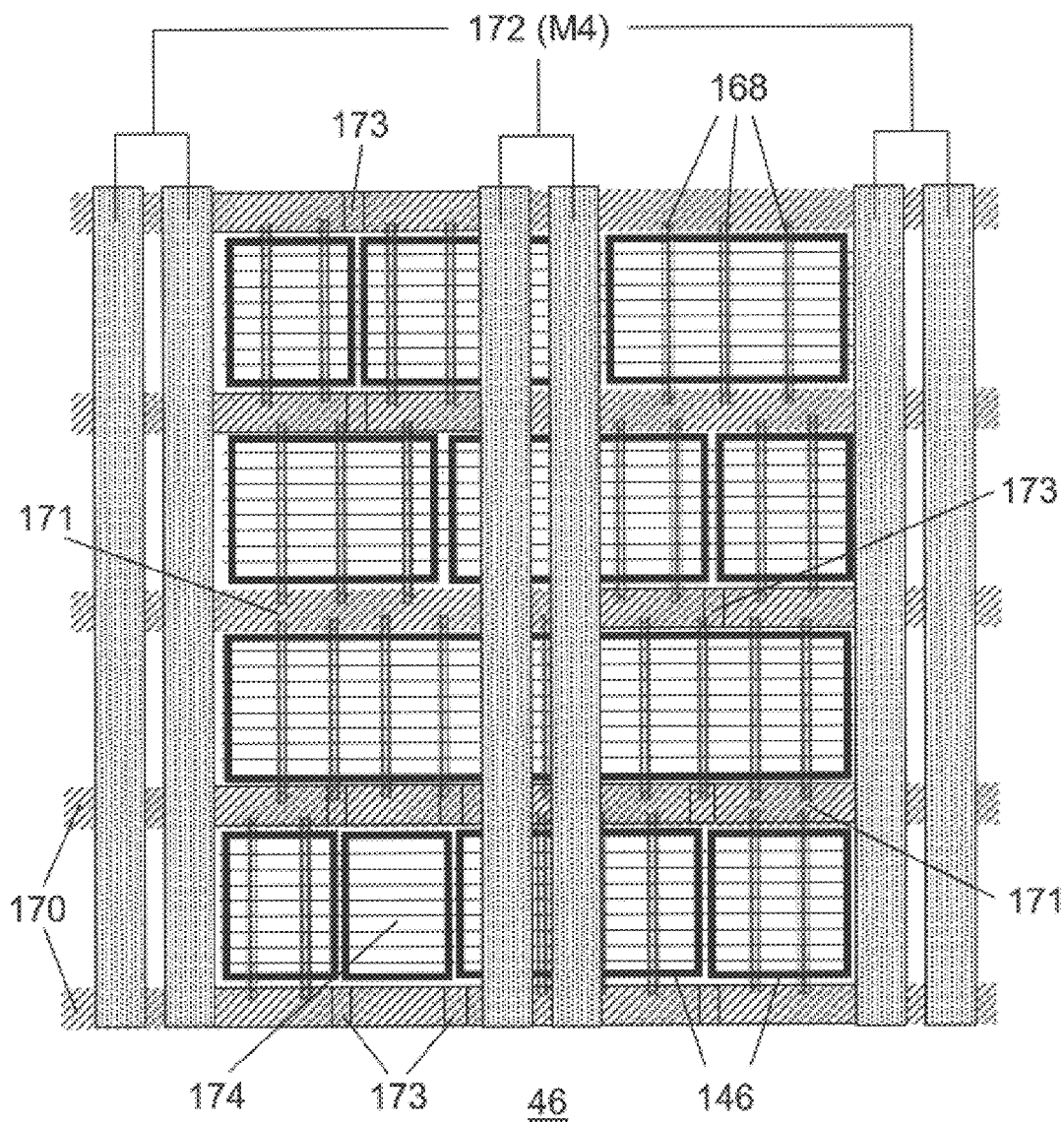

As shown in FIGS. 12A and 12B, the internal power grid structure of STANDARD BLOCKs can simplify the top-level assembly process and power distribution in the new IC architecture. In this example, a thicker horizontal metal strip 170 of metal layer M1 or M3 is placed at the boundaries of the STANDARD BLOCK. Such metal strips 170 enable sharing of VDD (power) and GND (ground) between STANDARD BLOCKs that occupy adjacent rows (or columns) in a STANDARD BLOCK ARRAY configuration. The STANDARD BLOCK rows (or columns) are oriented opposite relative to each other (i.e. with one of the STANDARD BLOCKs having a mirrored power grid configuration). Furthermore, by extending 173 the metal strip 170 beyond the STANDARD BLOCK boundaries, VDD (power) and GND (ground) rails can be contiguous. To ensure the continuity of power rails at the top level when STANDARD BLOCK ARRAYs are not fully occupied, special power routing tools can fill the gaps. Alternatively special STANDARD BLOCKs, referred to before as the "filler" STANDARD BLOCKs, having only the -power structure for M1 and M3 layers and no cells can be inserted. These filler STANDARD BLOCKs (not shown) can also be used to contain top-level cells as described later. A thick horizontal metal strips 170 extends from M1 (of the first or last cell row) if it is an M1 strip, and connects to M2 if it is an M3 strip.

Pairs of vertical M2 strips (for VDD/GND rails) are placed in substantially regular intervals 168. The number of M2 rail pairs in a STANDARD BLOCK depends on the estimated aggregate power consumption of the total number of standard cells therein. Thus, if the range of power consumption for the logic netlist included in the STANDARD BLOCK can be estimated, the frequency and fixed intervals 168 of the M2 rails as well as the widths of M2, and M3 (or M1) used for VDD and GND can be calculated. A space 171 between the respective edges of M2 rails and M1 or M3 strips, is provided when needed to allow for staggering of power and ground rails between STANDARD BLOCK ARRAY rows that share VDD and GND.

The illustration in FIG. 12A represents one approach to a power structure, according to which the thick power rails 170 are outside the boundary of the STANDARD BLOCK 146. Another approach to a power structure can be that the thick rails are included inside the boundary of the STANDARD BLOCK (not shown). Additionally, as shown in FIG. 12B, pairs of vertical M4 strips 172 are placed in substantially fixed intervals above the respective STANDARD BLOCK ARRAYs.

Figure 12C:
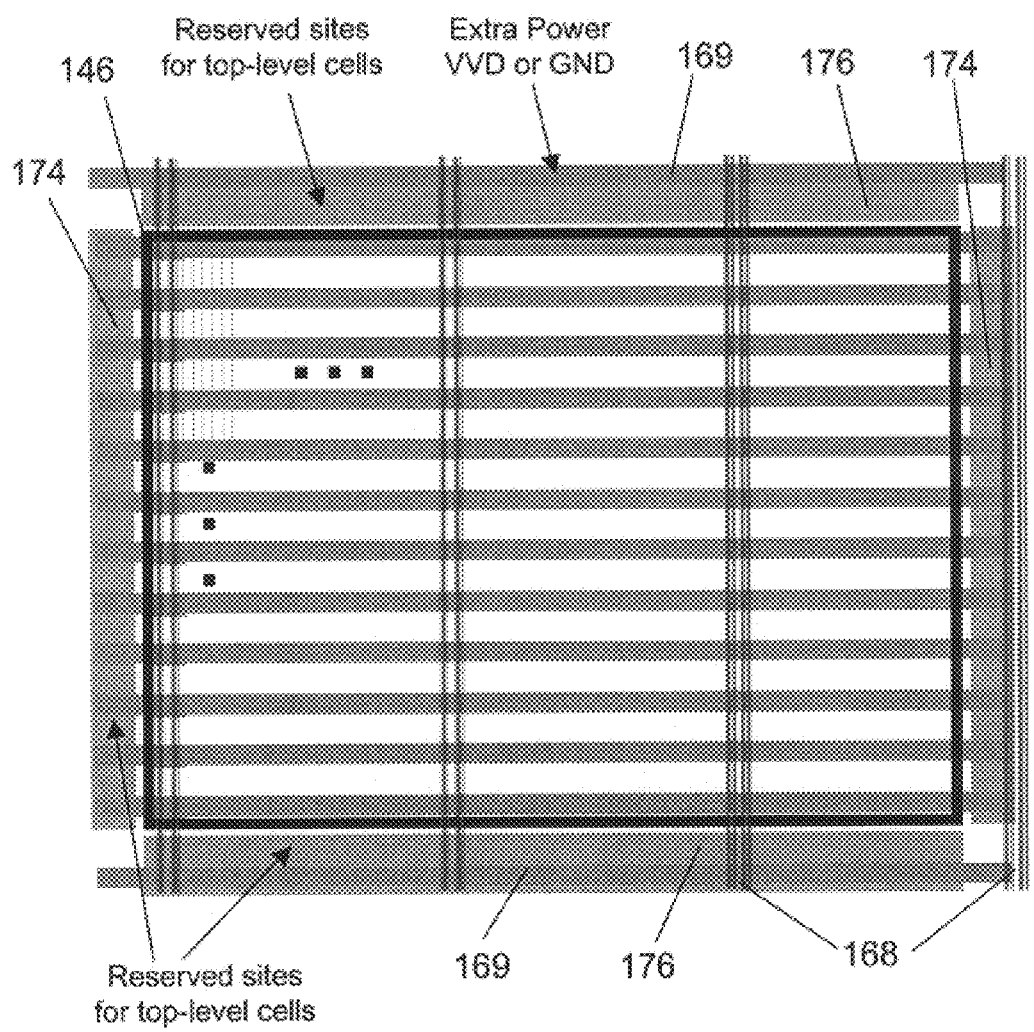
Figure 12D:
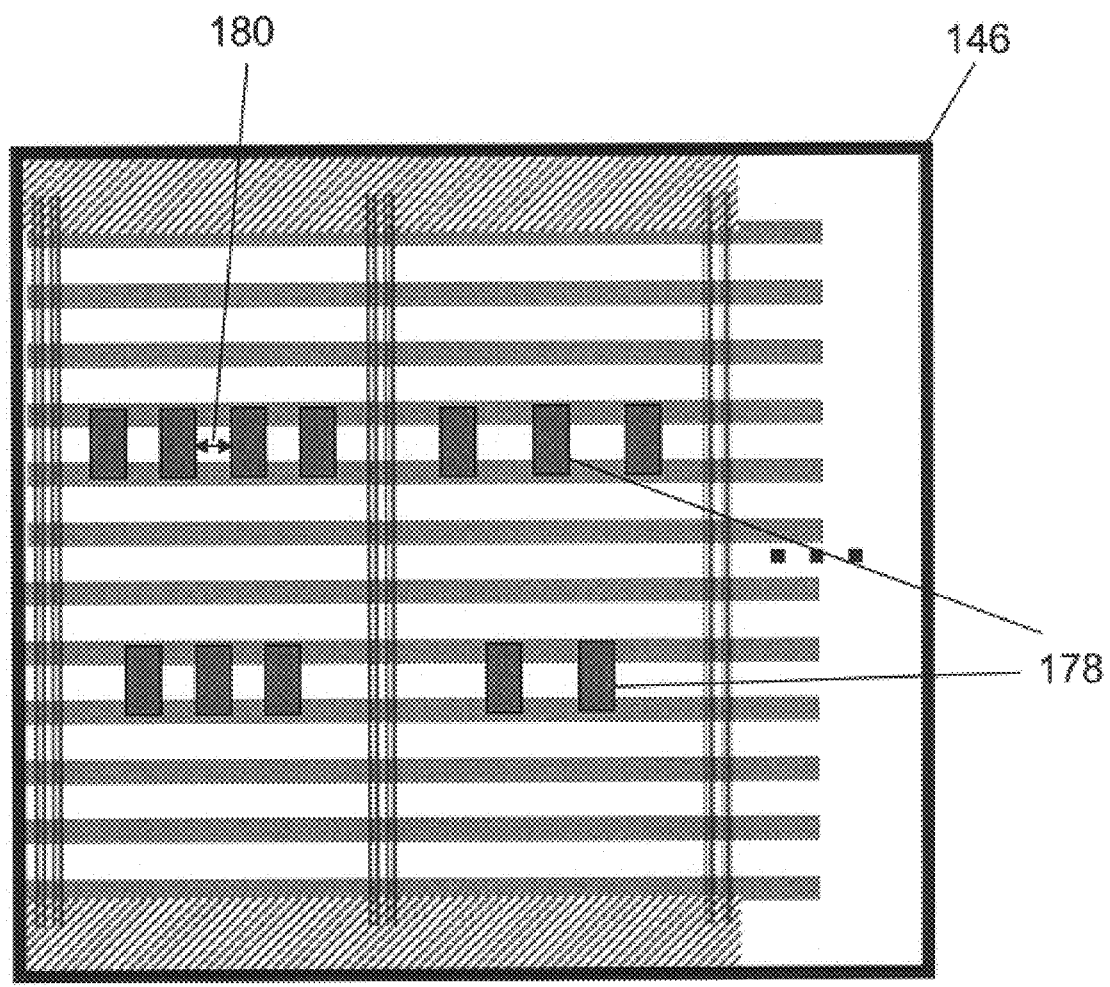
Figure 12E:
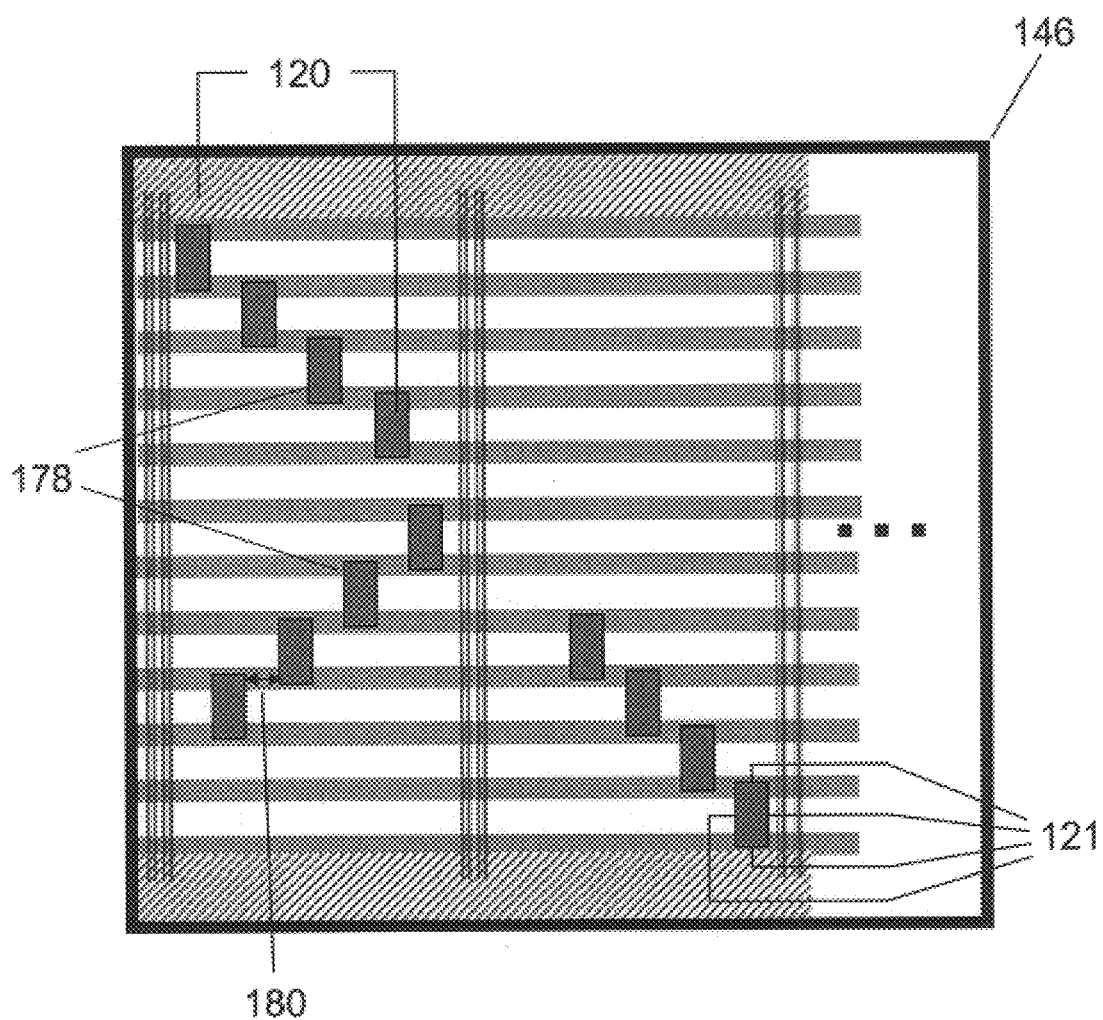

FIGS. 12C–12E describe site allocation inside the STANDARD BLOCK. In this context, "sites" are reserved areas used for adding standard cells, such as buffers, repeaters, test-scan circuitry, and/or other glue logic at the top-level design phase. Hence, these buffers, repeaters, test-scan circuitry, and other glue logic are commonly referred to as top-level buffers, repeaters, test-scan circuitry, and/or other glue logic, (hereafter collectively "top-level cells"). STANDARD BLOCK design provides flexibility in top-level cell sites allocation allowing the selection of a configuration that best meets timing and signal integrity requirements. Thus, STANDARD BLOCK based design can accommodate various configurations (or combinations thereof) other than those shown and described herein without departing from the scope and spirit of the invention.

As shown in FIG. 12C, sites 174 and 176 can be reserved outside and around the perimeter of each STANDARD BLOCK for a later inclusion of top-level cells and interconnects between STANDARD BLOCKs and/or top-level cells. In this example, reserving (blocking) the sites 174 at the left and right sides allows later addition of top-level cells (such as repeaters for splitting and driving global interconnects that are routed over the STANDARD BLOCKs). Alternatively the filler STANDARD BLOCKs can be used, as describe above, for reserving the space(s) for top-level cells. The sites 176 at the top and bottom spaces can be reserved or alternatively created by forming channels between the STANDARD BLOCKs. The power rails 168 can be configured to provide VDD and GND to the reserved sites. Additional power rails 169 can be inserted if necessary to provide VDD and GND to the reserved sites. Any one of the reserved sites can be alternatively used for pins.

The illustration in FIG. 12C represents one approach to site allocation of top-level cells (or pin) sites, according to which the reserved sites (174 and 176) are outside the boundary of the STANDARD BLOCK 146. Another approach to allocation of top-level cell (or pin) 174 and 176 sites around the perimeter of STANDARD BLOCKs is reserving the sites inside the boundary of STANDARD BLOCK (not shown).

FIG. 12D illustrates another approach to top-level cell or pin sites allocation. In this example, the sites 178 are also located within the STANDARD BLOCK boundaries of the respective STANDARD BLOCKs and are placed in a staggered configuration. The staggered sites are spaced 180 in order to allow routing of interconnects. FIG. 12E illustrates yet another approach to top-level cells (and/or pins) sites allocations. In this example, the sites 178 are also located within the STANDARD BLOCK boundary and are placed in a diagonal configuration (e.g, 120). The diagonal sites are likewise spaced 180 in order to allow accessibility of routing interconnections from multiple directions 121. The staggered and diagonal approaches advantageously allow a more balanced distribution of routing resources (i.e., interconnects) as well as flexibility and control of routing directions. This approach also prevents jogging of wires thereby keeping interconnects length to a minimum and improving timing performance.

It is noted that the foregoing approaches can be implemented in a STANDARD BLOCK singly or in combination. It is further noted that after the placement of STANDARD BLOCKs, any unused space (less than 100% utilization) can also be designated for top-level cells.

Figure 13A:
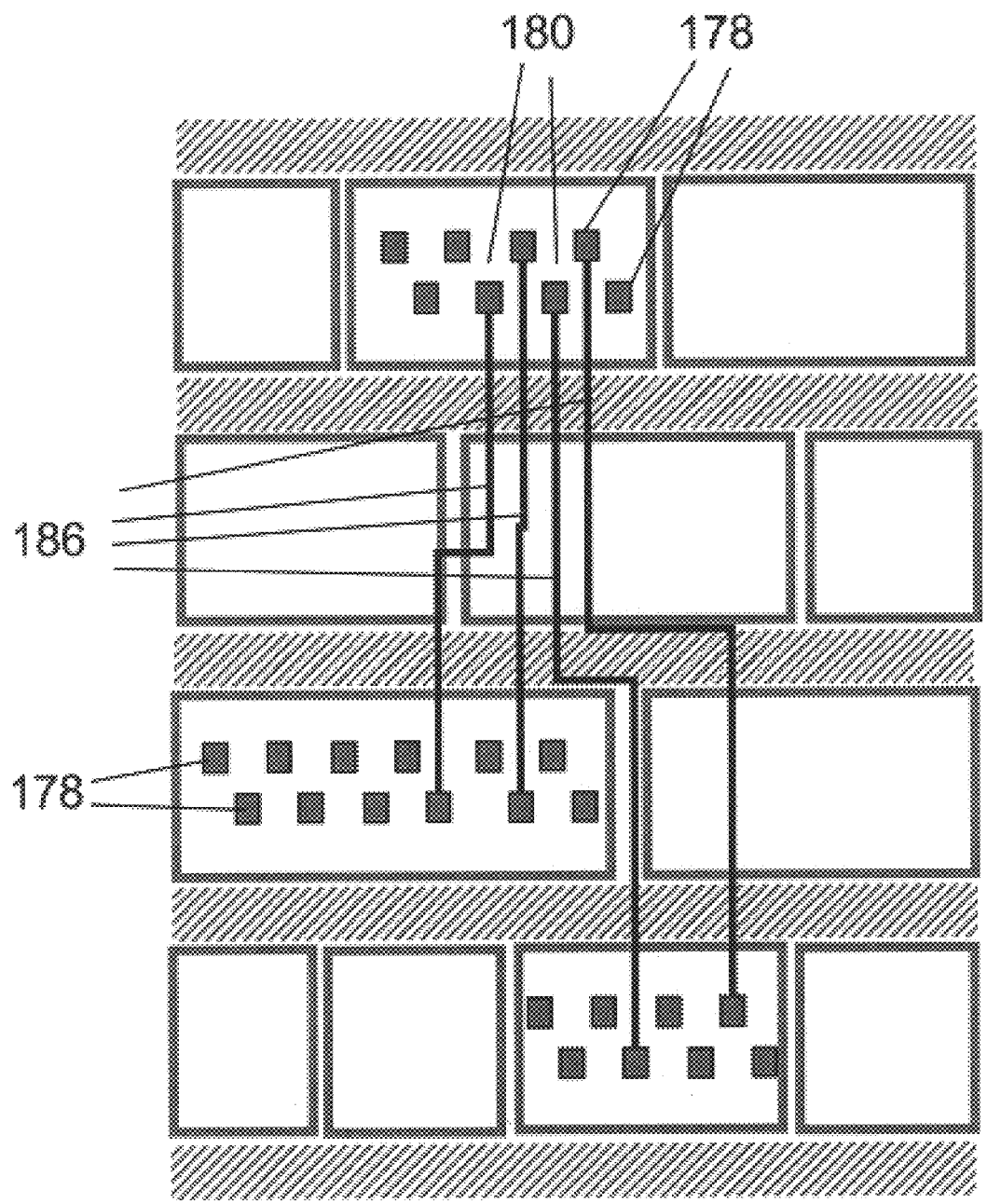
FIGS. 13A–D illustrate portions of the new IC architecture and provide a top-level view of the architectural features of STANDARD BLOCKs.
Figure 13B:
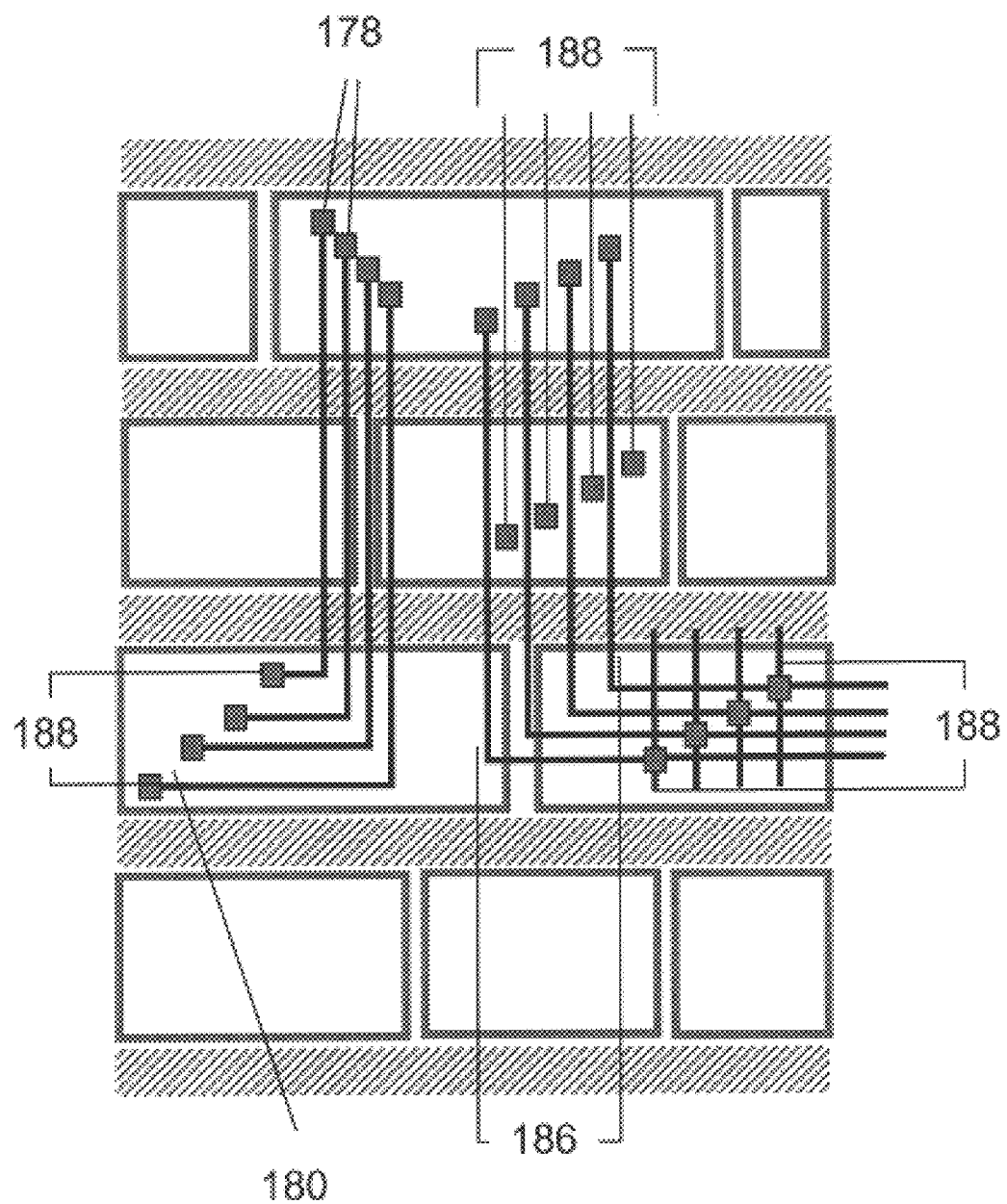
Figure 13C:
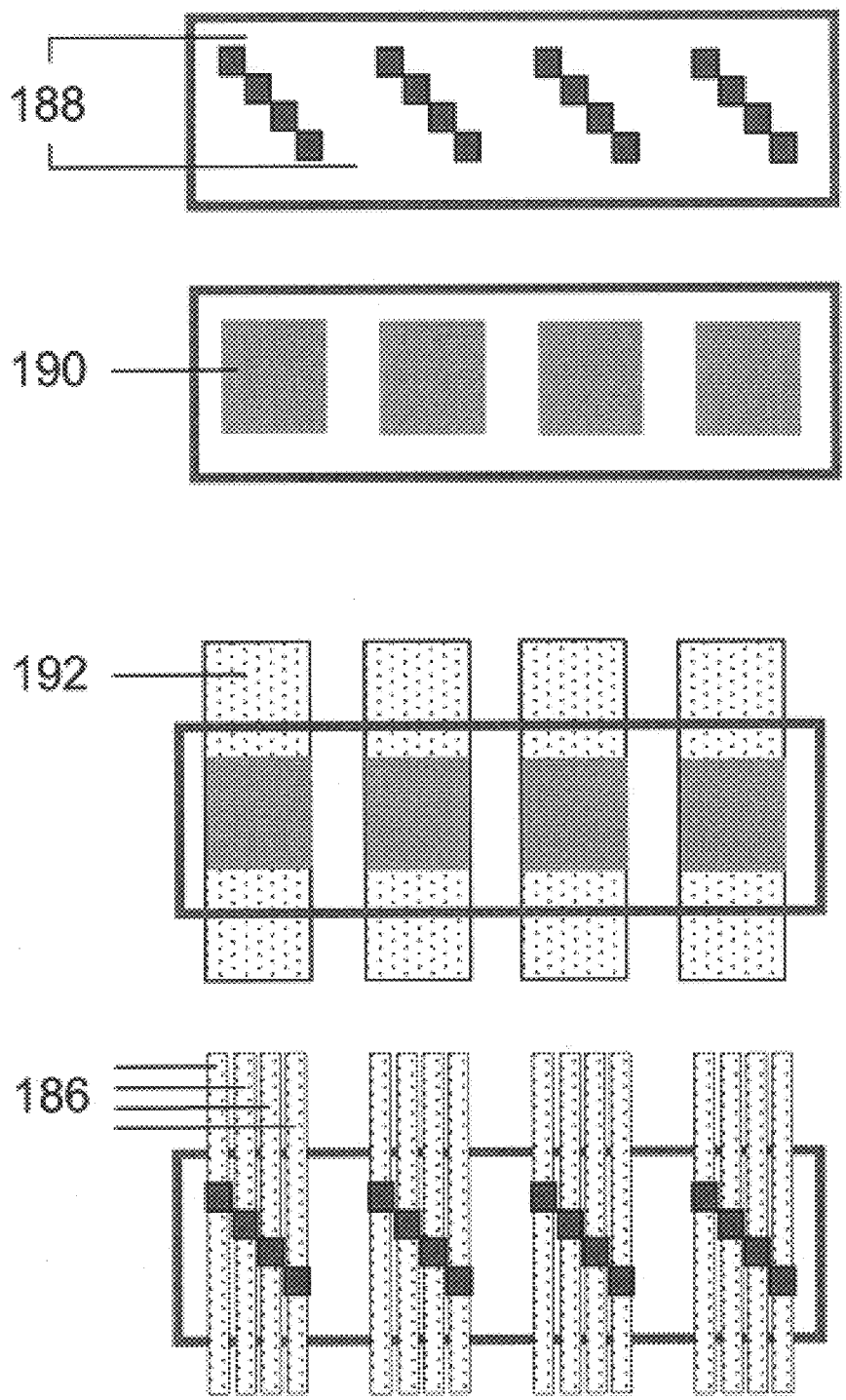
Figure 13D:
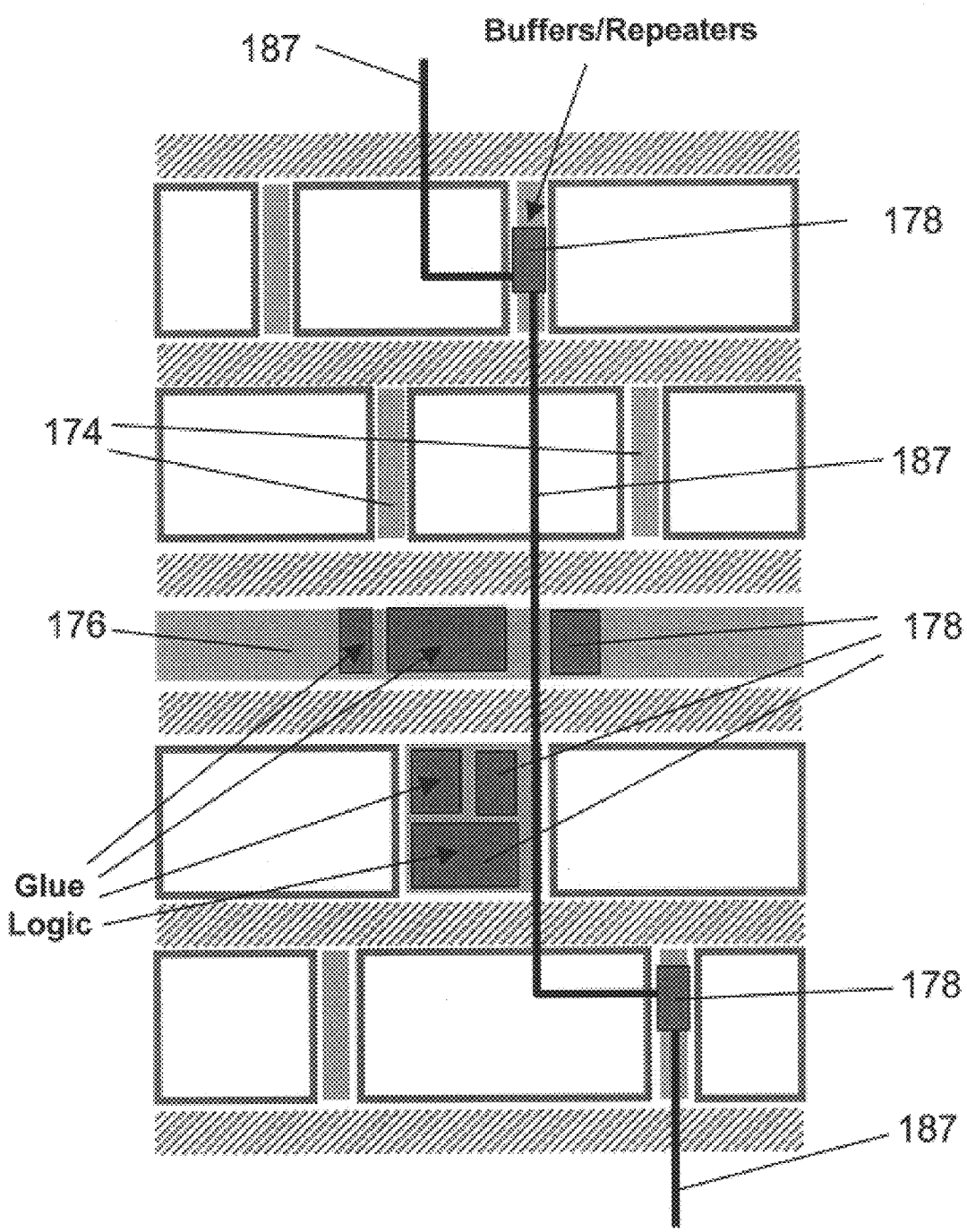

FIGS. 13A–D illustrate portions of the new IC architecture and provide a top-level view of the above-outlined architectural features of STANDARD BLOCKs. These architectural features are used by the top-level assembly tool to complete the top-level configuration of the STANDARD BLOCKs, including their assembly, interconnect routing and insertion of top-level cells where needed. As shown, the placement, diagonally or in staggered fashion, of pins and/or top-level cell sites 178, and the spacing therebetween 180, balances the distribution of routing resources, controls their direction and allows better grouping of buses 186 with optimal pin accessibility. By allowing access to the pins 188 (and/or top-level cells 178, FIGS. 12D–E) from multiple directions, this approach enables the routing tools to minimize congestion (See, FIGS. 13A–B with interconnects 186 routed at a straight angle to intersect other interconnects from a group of pins 188, where pin accessibility is maximized and routing congestion is minimized). In the example of FIG. 13D, top-level routing is further optimized for timing. Reserved spaces (174 and 176) between the STANDARD BLOCKs allow insertion of top-level cells 178 (for instance, buffers and repeaters to subdivide global interconnects 187 that are routed over the STANDARD BLOCKs).

As stated above, the internal architecture of STANDARD BLOCKs is general and flexible enough to accommodate substantially any assignment of pin sites to optimize the number of pins and interconnect routing. To that end, typically, pins that are related can be grouped. For example, as shown in FIG. 13B, pins 188 connected to a certain bus can be grouped and collectively represented as a virtual pin abstraction 190, as shown in FIG. 13C. Namely, the virtual pin abstraction corresponds to the group of pins and the collective space occupied by them. Therefore, instead of presenting groups of plurality of pins to the top-assembly tool, a less populated presentation of STANDARD BLOCK features can be made with the virtual pins. This way also, instead of routing multiple bus wires the individual direction of which may diverge, a single thick interconnect 192 can be routed more controllably and efficiently. The single thick interconnect 192 can be split later into separate bus lines (interconnects) 186, after the top-level routing is completed.

Figure 14A:
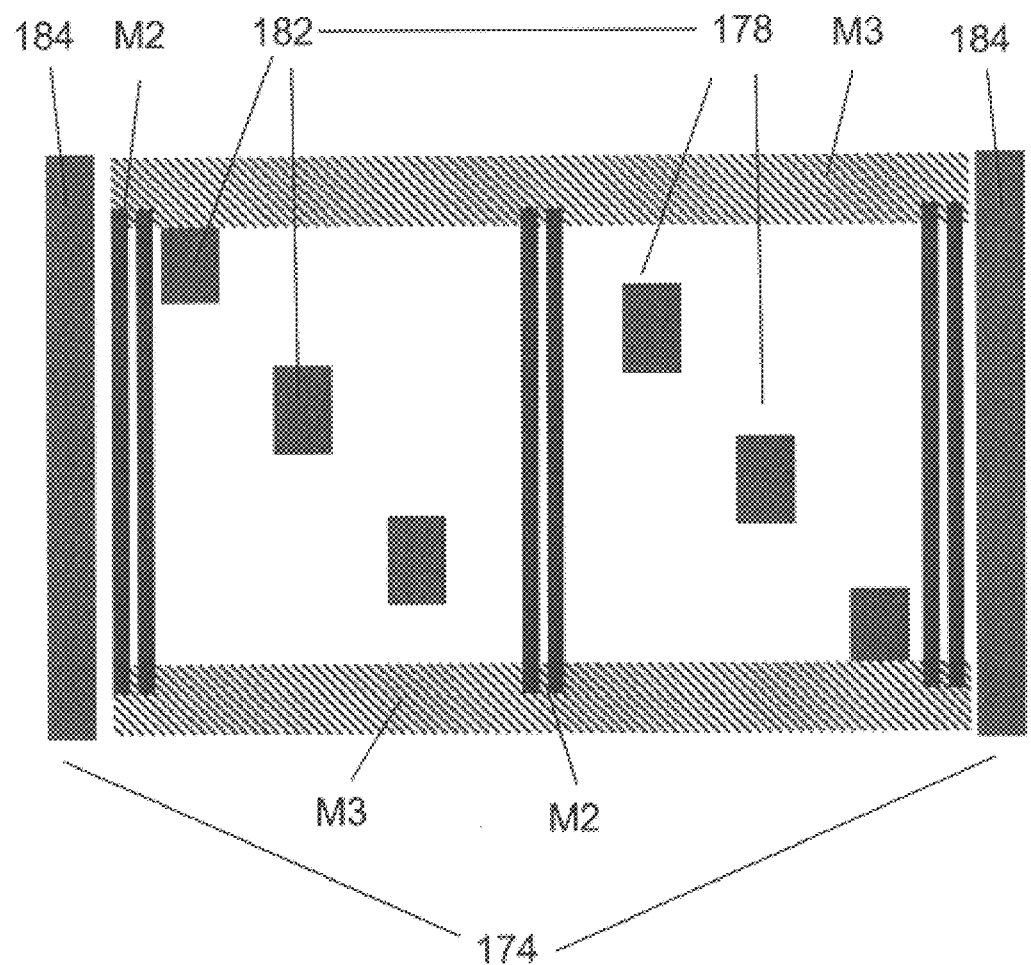
FIGS. 14A–G, illustrate additional architectural features and physical abstractions of STANDARD BLOCKs and their respective properties.
Figure 14B:
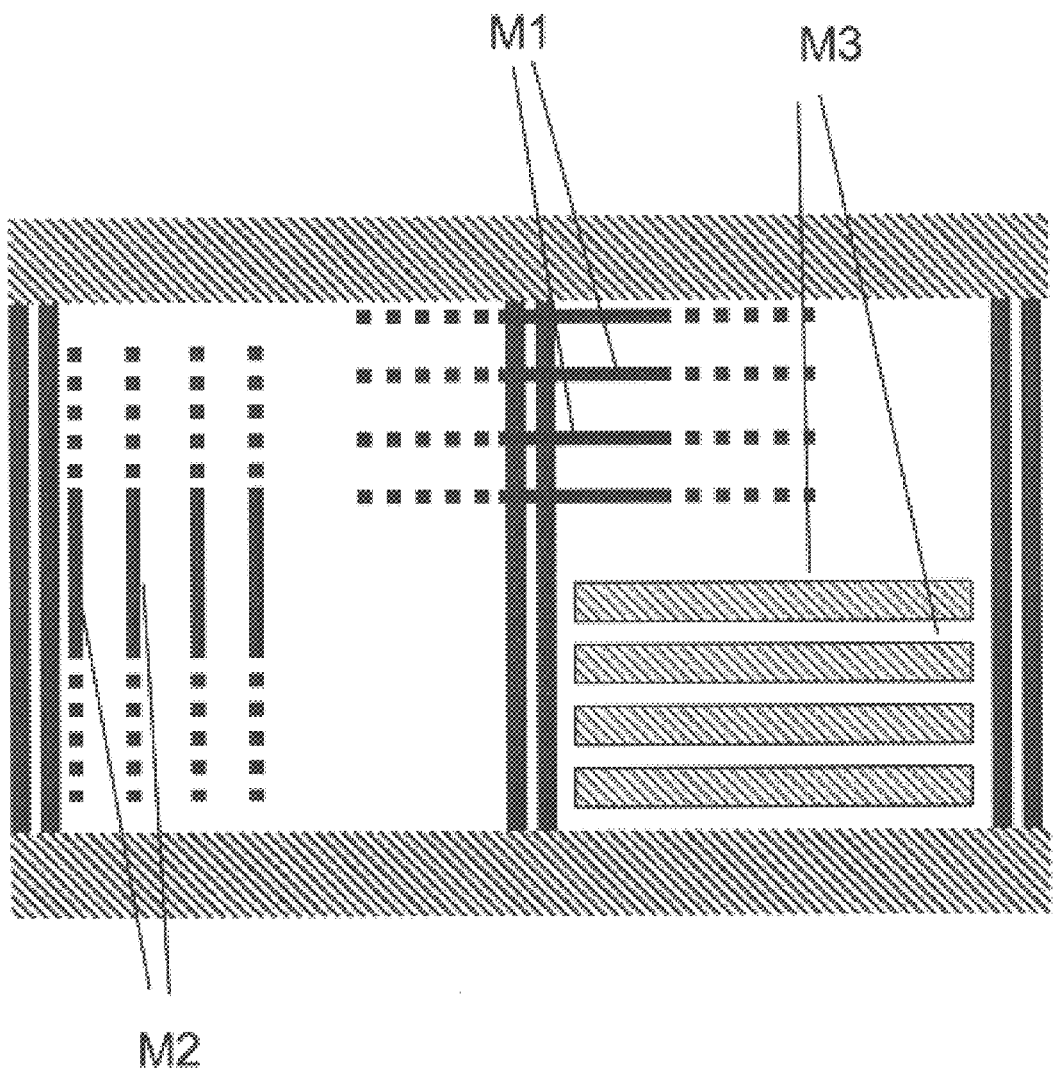

FIGS. 14A–G, illustrate additional architectural features and physical abstractions of STANDARD BLOCKs and their respective properties. FIG. 14A and 14B, respectively show an example of metal layers assignment and preferred relative directions inside a STANDARD BLOCK and STANDARD BLOCK ARRAY. Metal layers can be used for power, ground, clock and interconnect (signal) routing. Inside or around the perimeter of a STANDARD BLOCK, certain areas can be reserved (blocked) through selective use of metal layer(s). The areas (sites) are reserved for future insertion of top-level cells (and or pins) at the top-level physical design phase. To meet timing and signal integrity requirements areas are, for example, blocked to avoid placement or routing therein during the STANDARD BLOCK physical implementation. The blocked areas can thus be termed "intelligent avoidance" or "intelligent blockage" areas which are removed during assembly to allow for the insertion of top-level cells. Other areas, defined as abstraction areas, represent STANDARD BLOCK features such as pin groups, bus lines, or any other groups of objects that are combined to simplify the presentation of STANDARD BLOCKs for top-level design.

As shown in FIG. 14A, in order to reserve sites (e.g. 174 and 178) for top-level cells within or outside the boundaries of a STANDARD BLOCK, intelligent blockage areas 182 and 184 overlapping the future sites (174 and 178) are blocked in M1 and M2 metal layers. In this example, the reserved areas (collection of sites) are placed diagonally although other configurations such as staggered placement are possible, singly or in combination. Typically, M1 and M2 intelligent blockage areas are used inside the STANDARD BLOCK as "keep-out" areas to prevent placement and routing, thereby keeping the overlapped areas available for the future inclusion of top-level cells that use M1 and M2 layers. The overlapping intelligent blockages areas (182 and 184) can be removed later on to allow the insertion of top-level cells in the (uncovered) reserved sites (178 and 174), respectively.

As shown in FIG. 14B, the preferred layers and respective directions for power, ground, and interconnect routing are horizontal M1 strips, vertical M2 strips and horizontal M3 strips. Typically M1 and M2 are used inside STANDARD BLOCKs to connect local signals. M3 is typically used for both local and global (top-level) connections. It is typically important to maintain the relative metal-strip directions in the respective layers. However, the overall scheme may change such that, for example, M1 strips may be vertical and this will dictate horizontal M2 strips and vertical M3 strips (not shown). With this approach routing density is maximized.

Figure 14C:
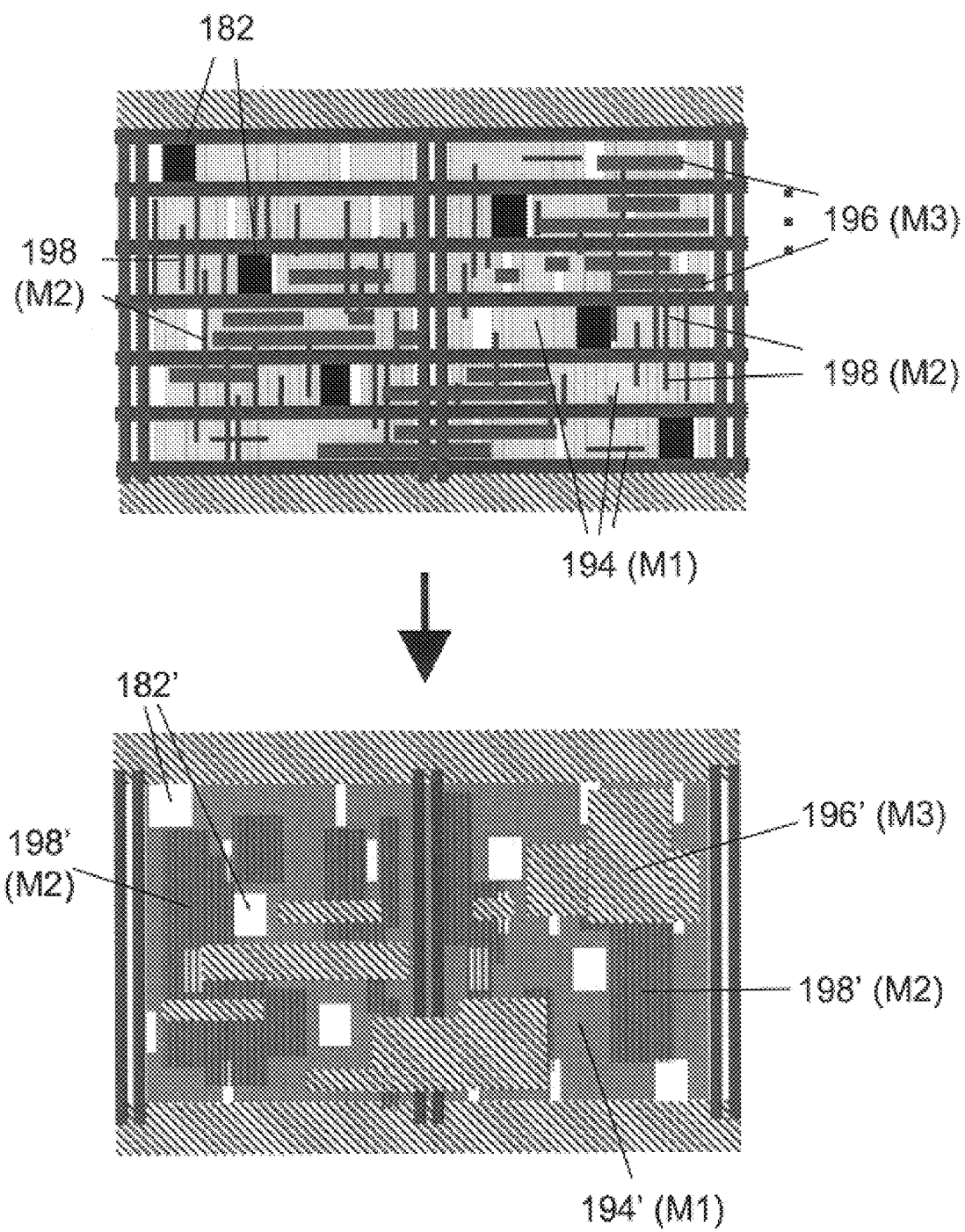

FIGS. 14C–14G show areas defined as abstraction areas representing STANDARD BLOCK features such as pin groups, bus lines, or any other objects or, more commonly, groups of objects. As explained, the objects are combined to simplify the presentation of STANDARD BLOCKs for top-level design and/or introduce controllability to top-level physical tools. For example, the areas 182 shown as reserved for future top-level cells in the top portion of FIG. 14C are shown below as empty spaces 182'. These empty spaces are created after the intelligent blockages (182 and 184 of FIG. 14A) are removed when the STANDARD BLOCK is presented to the top-level design tools. Groups of (horizontal) M1 strips 194, (vertical) M2 strips 196, and (horizontal) M3 strips 198 are merged and collectively shown below as abstractions (or top-level blockages) 194', 196' and 198', respectively. The use of abstractions for defining groups of objects within STANDARD BLOCKs with selected internal details invisible to the top-level design tool, advantageously makes the top-level design less populated and thus simpler for the top-level tools to process.

Figure 14D:
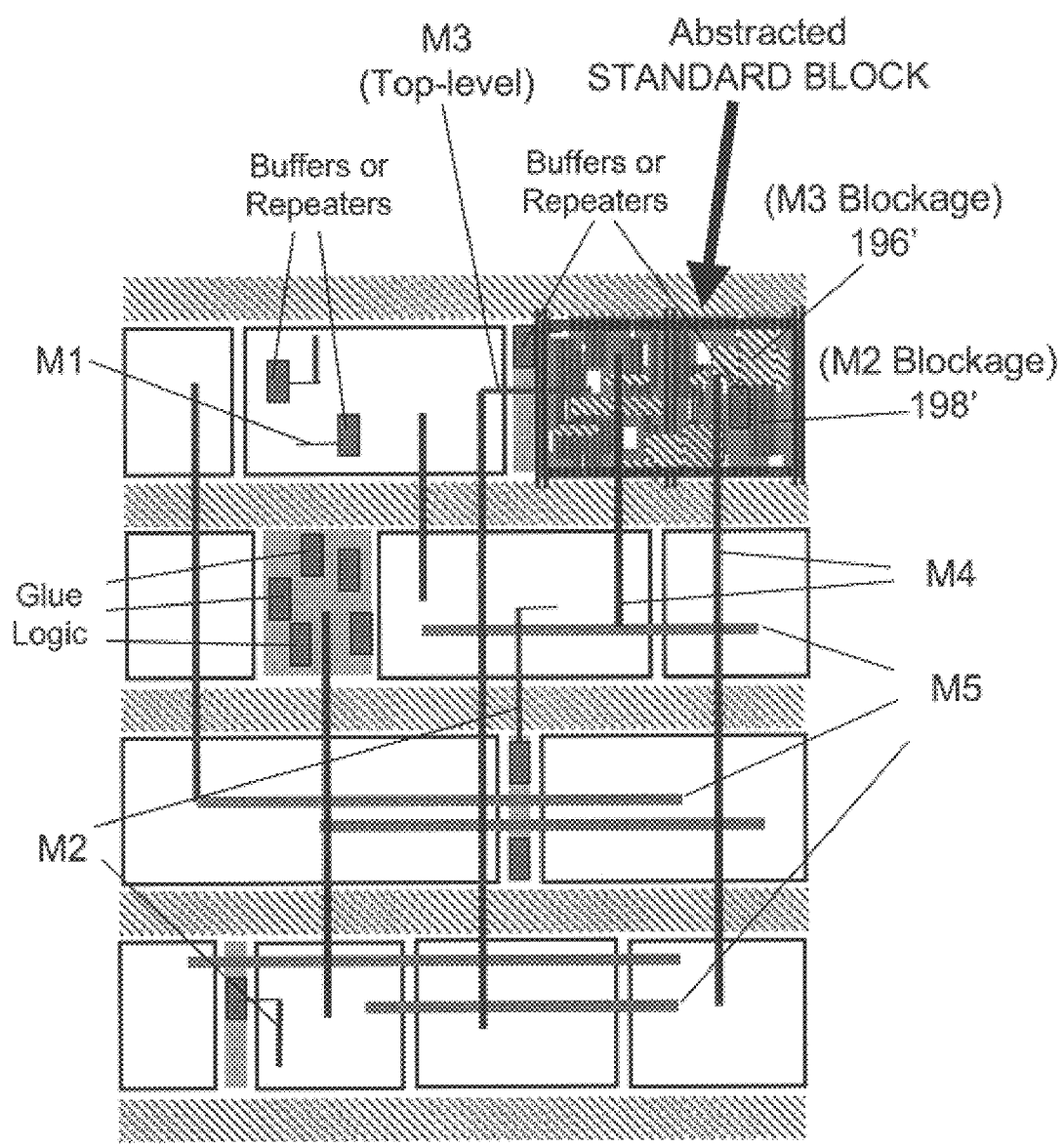
Figure 14E:
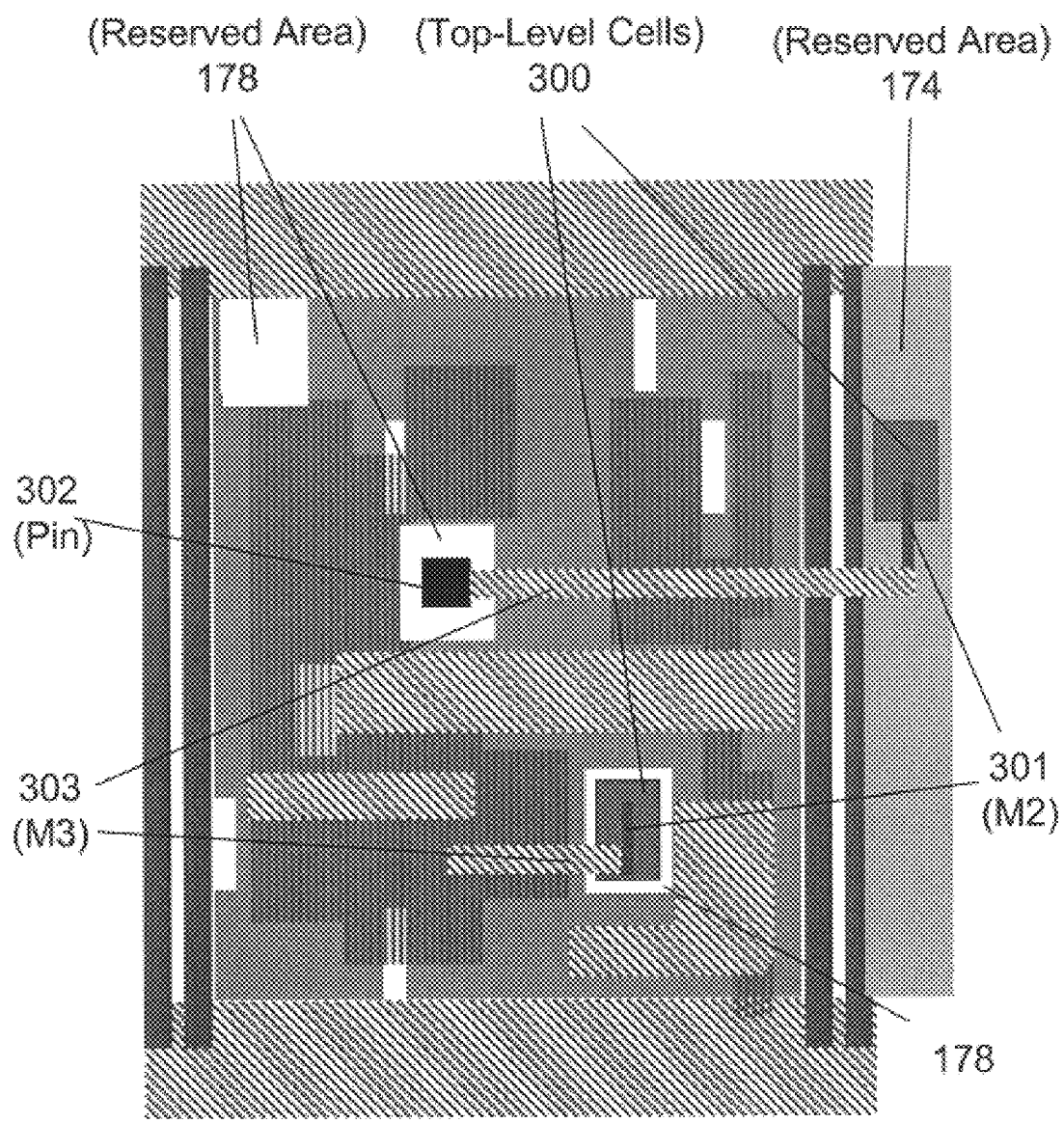

FIG. 14D shows a top-level assembly of STANDARD BLOCKs with one of them represented by physical abstractions. As compared with lower metal layers, M4 or higher metal layers (M5, M6, etc.) are used predominantly for top-level interconnections of power, signals etc. Top-level interconnections at the M3 (and occasionally M2) layer are used if space is available as defined by the intelligent blockages of STANDARD BLOCKs. The use of M1 and M2 layers at the top-level is substantially limited to interconnecting top-level cells placed in the reserved areas. FIG. 14E shows an approach to connecting top-level cells 300 in a site 174 outside the STANDARD BLOCK to pins 302 inside the STANDARD BLOCK. M2 strips 301 are shown routed around the inserted top-level cell 300 and, through M3 strips 303, the internal connection is completed. M2 strips can be alternatively routed in reserved area 174.

Figure 14F:
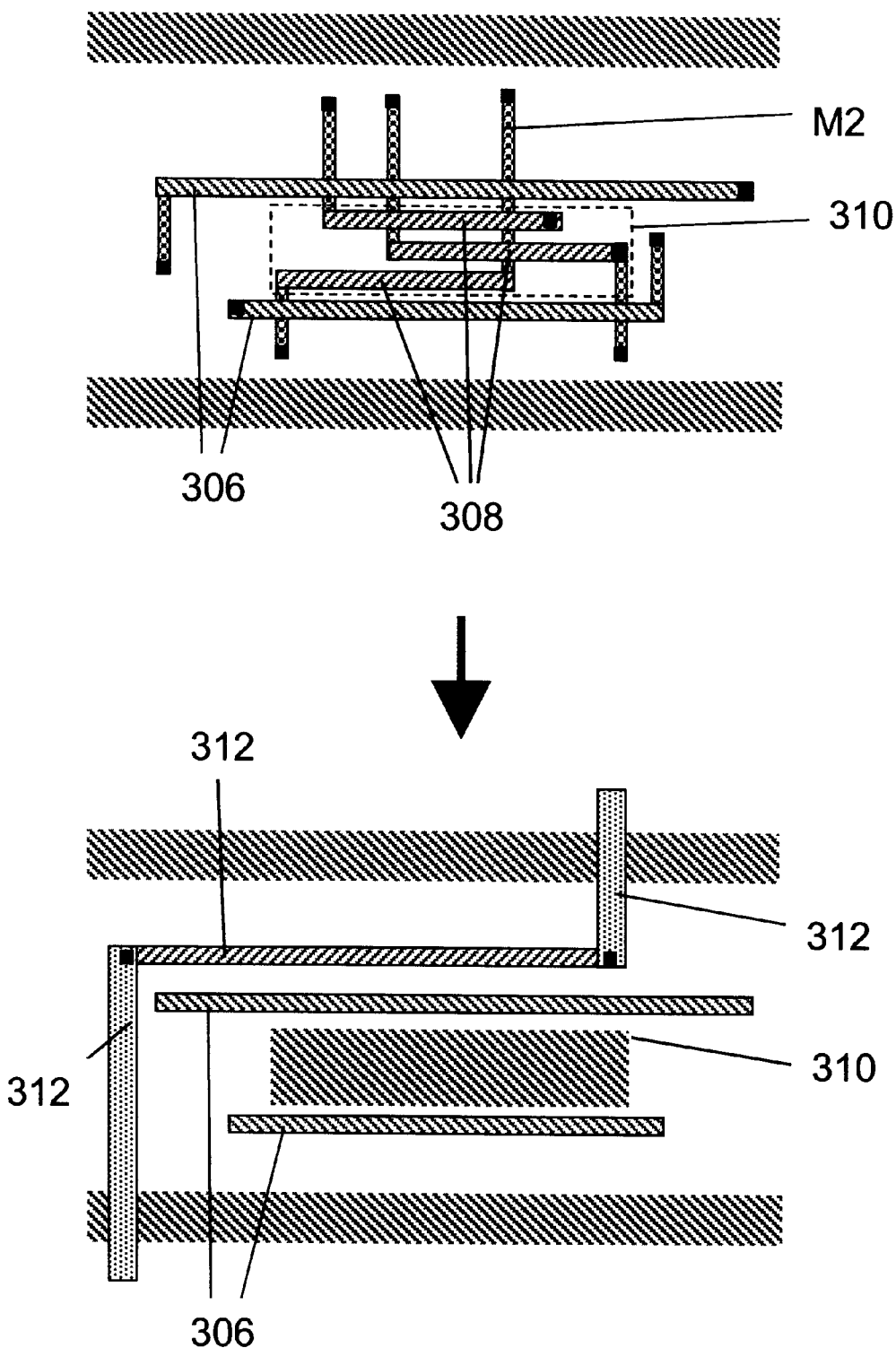
Figure 14G:
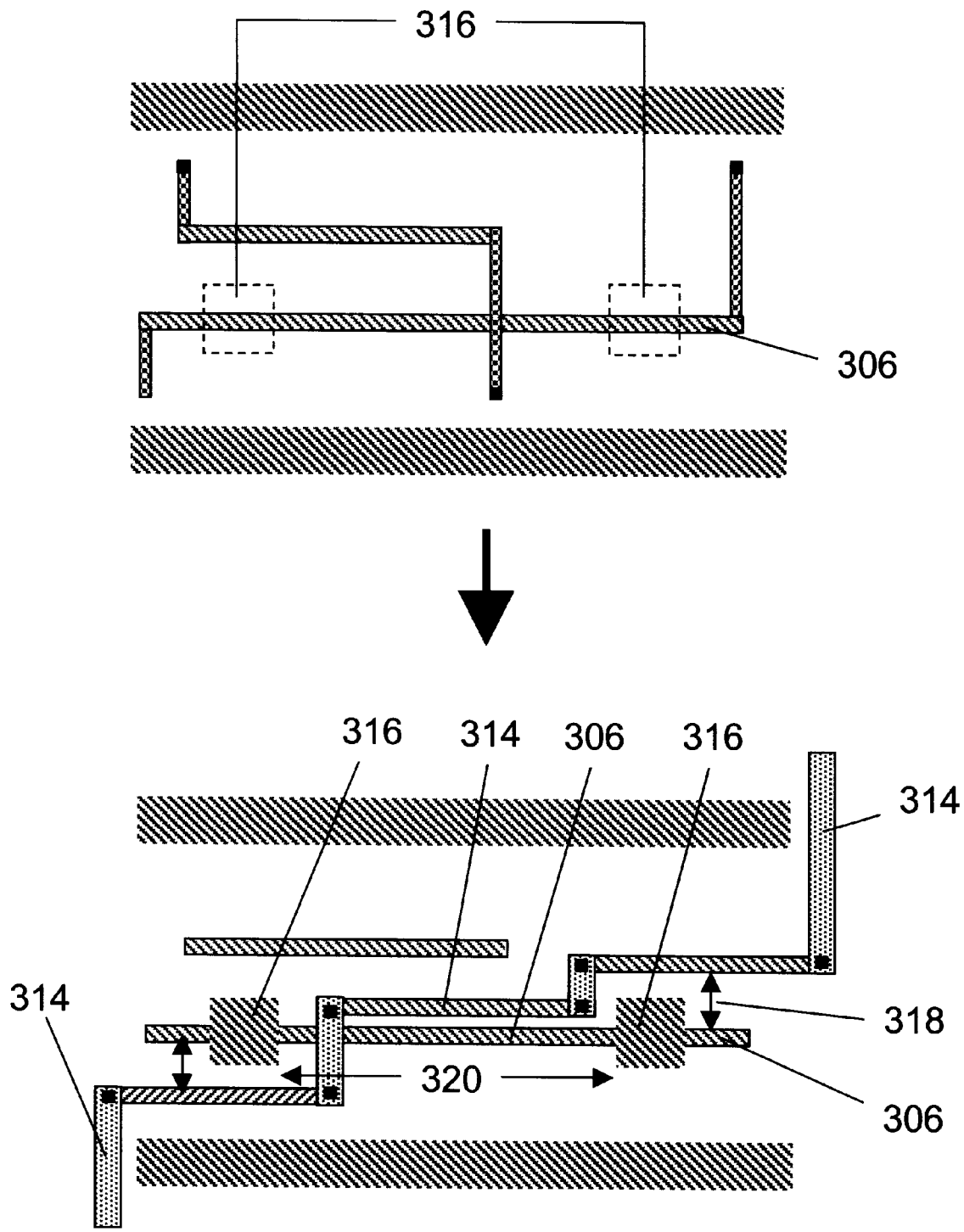

FIGS. 14F and 14G illustrate the creation of intelligent blockages. The actual features of the STANDARD BLOCK are shown above, and their abstractions are shown below. For example, in FIG. 14F, intelligent blockage of an area 310 in the M3 layer (merging a group of metal strips 308) is created to minimize the number of objects (wires or lines) at the top-level and expose only selected internal objects (such as interconnects that could be susceptible to cross talk from global interconnects). Peripheral interconnects 306, namely, local (internal) interconnects that on one side or the other do not have a local neighbor interconnect in the STANDARD BLOCK, are not abstracted. Instead, they are promoted to the top-level as they are for consideration of cross-talk during top-level routing. In other words, these interconnects 306 are recognized by the top-level tools as part of the STANDARD BLOCK abstraction and are considered for purposes of top level routing 312 with respect to cross-talk. The technique of promoting selected internal STANDARD BLOCK interconnects can be applied to any nets.

As a further example, FIG. 14G shows how intelligent blockage is created for preventing cross-talk between internal and top-level interconnects along critical paths. This applies, for example, to cross-talk between local and global interconnects where the local interconnects are promoted as they are to the top-level design phase. To avoid cross-talk, "avoidance areas" (or "prevention blockages") 316 are created to prevent top-level interconnects 314 from being routed in parallel and adjacent to the local interconnects 306 beyond a certain distance 320 where cross-talk becomes critical. In this example, the avoidance areas 316 are spaced apart along the internal interconnect 306 such that the top-level interconnect 314 may be routed in parallel and adjacent to the internal interconnect 306 only for a given distance 320 (the distance between the avoidance areas). Beyond this distance 320, the local and top-level routing tools will be forced to form a detour around the avoidance areas 316 to allow at least a predetermined spacing 318 between them which minimizes cross-talk impact. The technique of creating such blockages for use at the top-level (for routing prevention and/or controllability purposes) can be applied to any areas inside STANDARD BLOCKs.

The foregoing architectural features of STANDARD BLOCKs delineate their flexible physical design properties. These flexible physical design properties augment the distinguished structural characteristics of STANDARD BLOCKs as outlined herein. These features are made possible, in part, by STANDARD BLOCKs being created either as portions of a large logical design or as flexible physical design library elements (with reconfigurable logical/electrical parameters that enable the creation of different instances of the respective library elements) for use in to the context of top-level design. Accordingly, the configuration of each instance of a corresponding flexible library element (i.e., STANDARD BLOCK) can be derived in the top-level physical design context from its fundamental properties, as well as its fundamental characteristics modeled when appropriate as abstractions.

To that end, the new IC architecture is created with the STANDARD BLOCKs as general physical abstractions that are akin to black boxes and, upon assembly of the STANDARD BLOCKs, includes all design aspects such as timing, interconnect, routing, signal integrity, power, and clock. That is, with most internal design aspects of each STANDARD BLOCK being substantially invisible, each STANDARD BLOCK is deemed for assembly purposes as a black box populated only with some visible global aspects. These global aspects are selected to be available by all or groups of the STANDARD BLOCKs and they typically include the clock signal(s), bus lines, pins, scan-chain and power grid. (Scan-chain is a link woven among gates using interconnections that are enabled only for the purpose of self test.)

Figure 3:
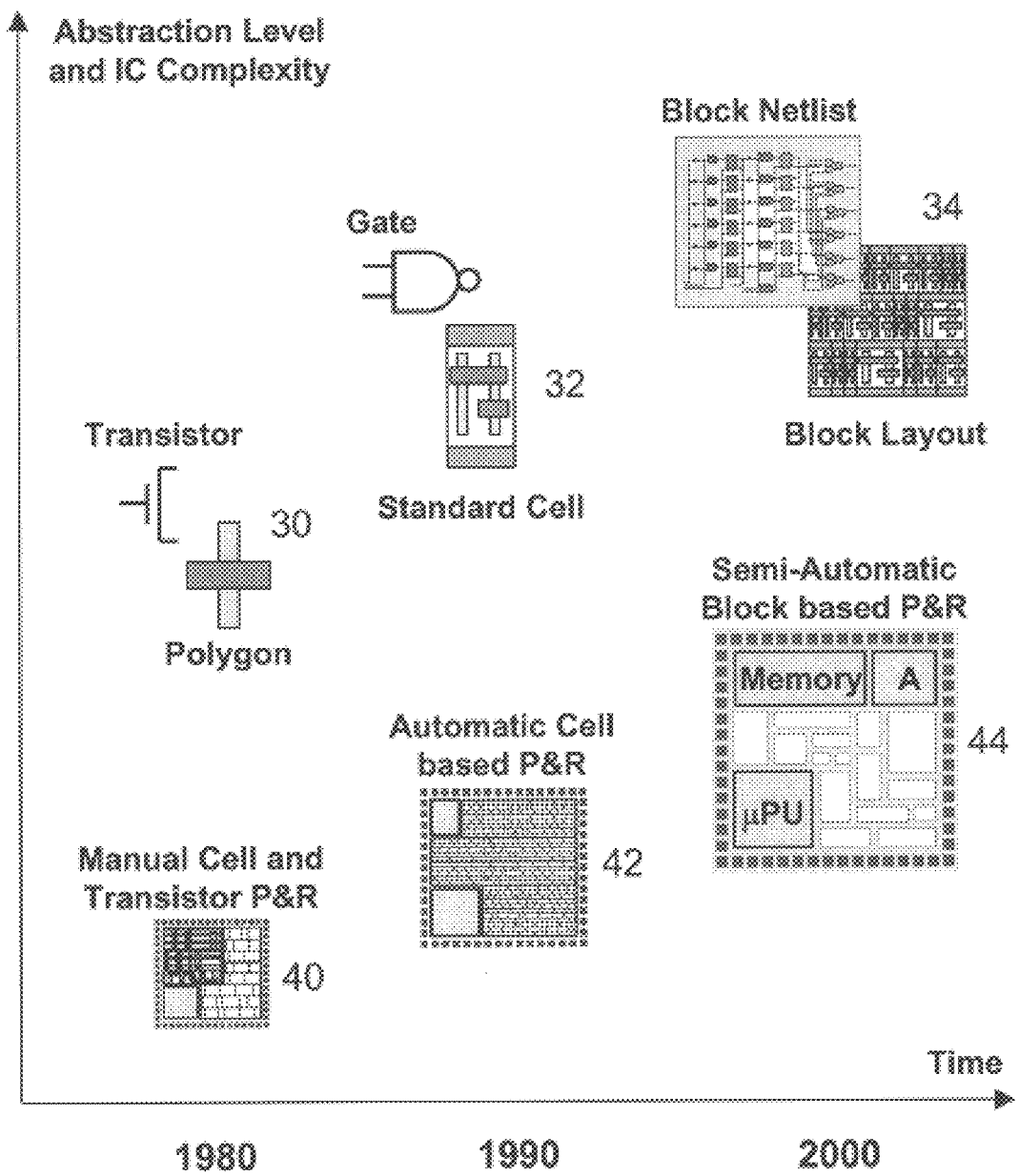
FIG. 3 shows the evolution over time of ICs, from a small transistor-level (or polygon-level) to higher levels of abstractions.
Figure 4:
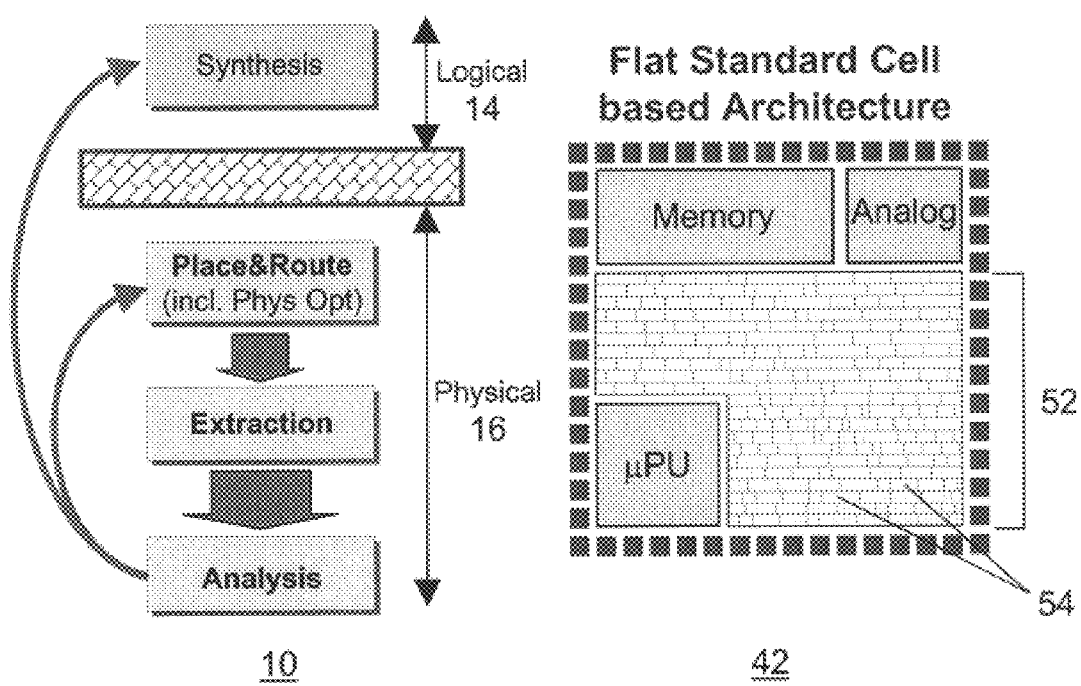
FIG. 4 shows standard-cell-based architecture and design method according to which the IC layout is formed of rectangular cells with a similar height, the so-called standard cells
Figure 5:
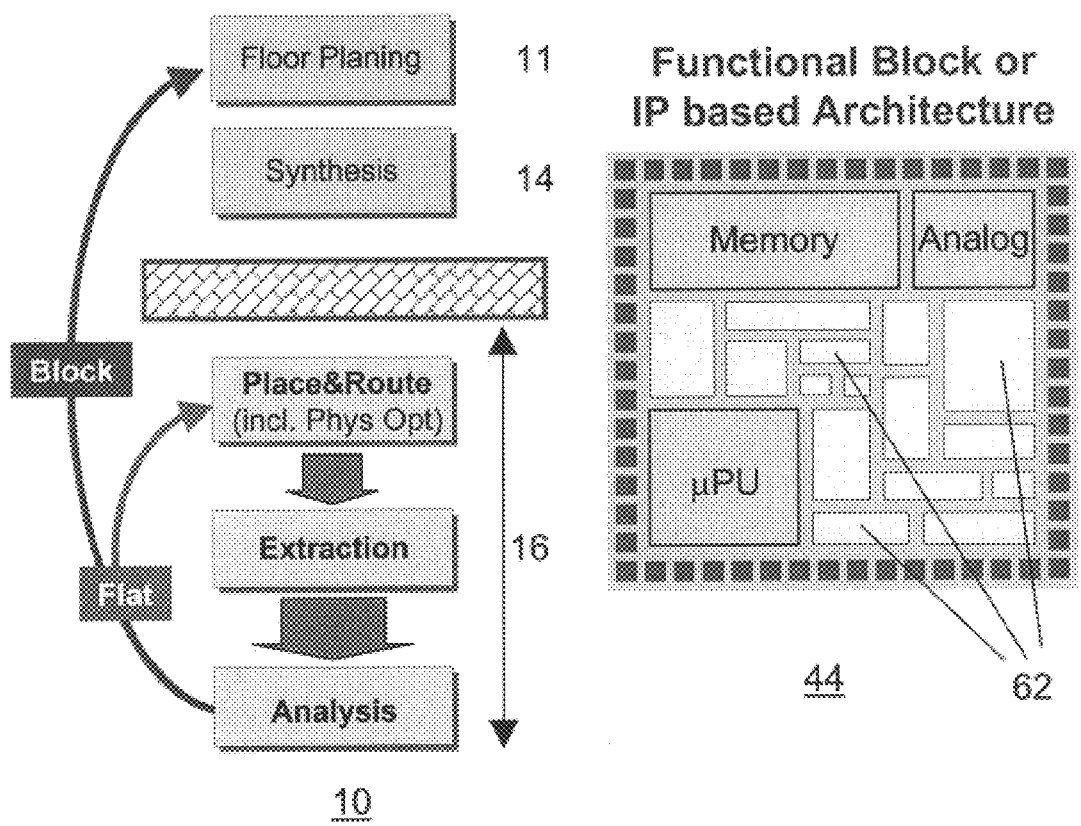
FIG. 5 shows a functional block architecture and a design method according to which the IC layout is formed of irregular functional blocks.

Namely, each of the STANDARD BLOCKs can be uniquely characterized by its fundamental properties, including power, clock, and signal integrity properties, and by its fundamental characteristics which are modeled as abstractions. As outlined above, these abstractions combine, for example, areas blocked or reserved for top-level cells and/or global bus lines in order to provide to the top-level assembly tool minimally detailed, yet meaningful representation of STANDARD BLOCKs characteristics (See: e.g., FIGS. 1 3C and 14A). This architectural approach makes the assembly of STANDARD BLOCKs simpler and allows the design process to be more easily automated. A more detailed description of the power, clock and signal properties as well as the abstractions, such as physical block placement and interconnect abstractions, is given below.

The physical block placement abstraction, for example, is achieved through the definition of STANDARD BLOCK architecture and STANDARD BLOCK layout. The physical block placement abstraction includes the respective STANDARD BLOCK height and width.

The interconnect abstraction, as illustrated for example in FIGS. 14F and 14G, is defined for STANDARD BLOCKs in order to separate the interactions of local level interconnects inside the STANDARD BLOCKs from the interaction of top-level interconnects between the STANDARD BLOCKs. With the exception critical paths, at each level, the electrical parameters, such as coupling and other parasitic and non-parasitic parameters are considered without regard to parameters at the other level. By not exposing routing consideration for all interconnects and vias inside each STANDARD BLOCK to the top-level interconnects routing, memory usage in the top-level assembly tools can be significantly reduced. As the exception, critical internal information, such as the critical paths is promoted to the top-level in order to be considered in the top-level assembly.

Figure 15:
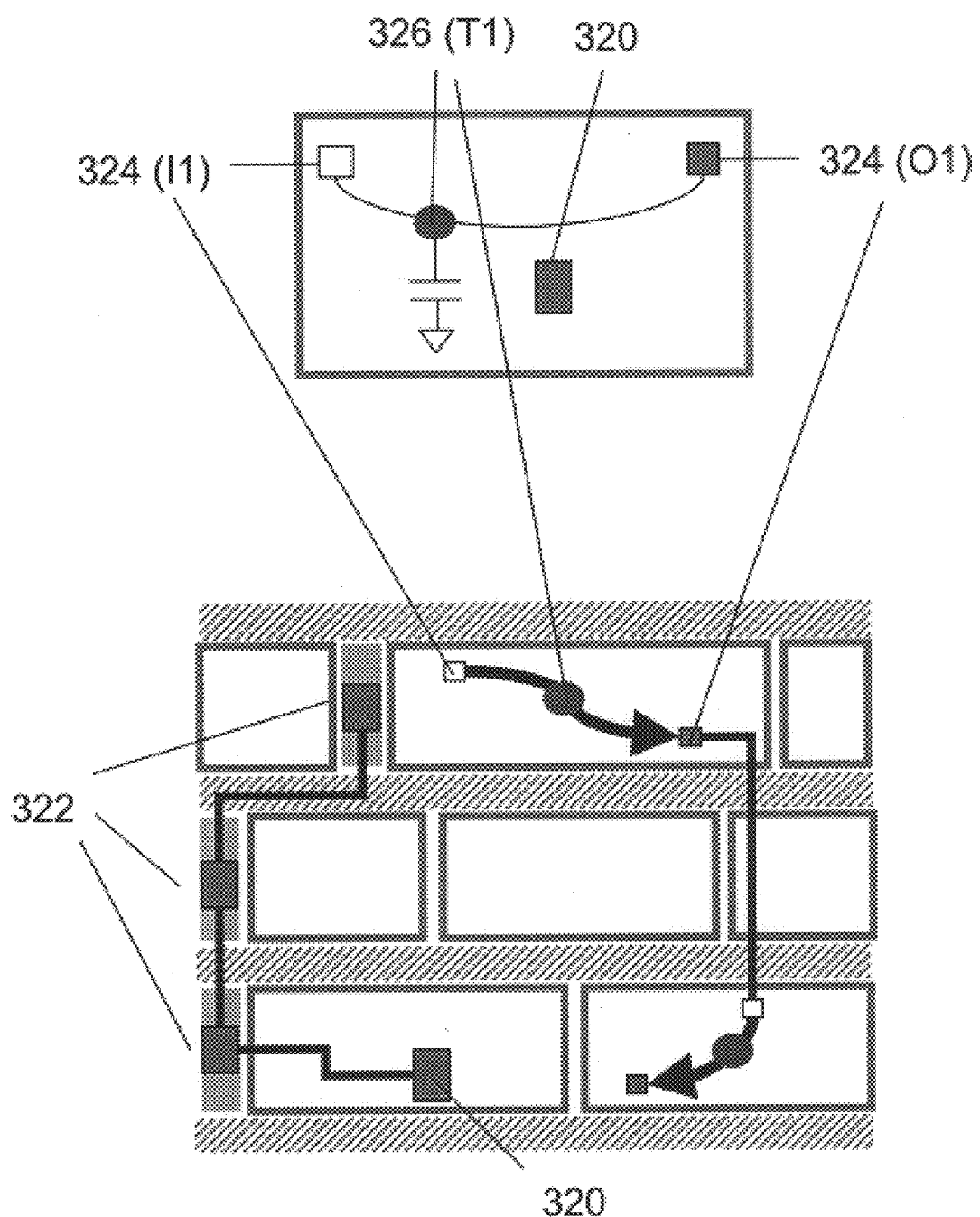
FIG. 15 illustrates timing and power properties of a STANDARD BLOCK.

Along with their physical characteristics, STANDARD BLOCKs also have properties such as power and timing. FIG. 15 illustrates the timing and power properties. These properties are associated (or attached) respectively to I/O terminals (pins) 324, internal standard cells 320 and intermediate timing nodes 326 inside the STANDARD BLOCK that can be promoted to the top-level.

The power property represents the power consumption of STANDARD BLOCK. The power abstraction can model minimum, average (typical), or maximum power consumption. This power model can be static or dynamic depending on the level of sophistication of the power model.

The clock properties represent the clock tree(s) inside the STANDARD BLOCK. Typical properties that require exposure at the top level are clock insertion delay, and clock skew inside the STANDARD BLOCK. The clock tree can be typically configured as a clock grid, and the STANDARD BLOCK can be created with any type of configuration of the clock grid without departing from the scope and spirit of the invention. Each STANDARD BLOCK may have a separate clock tree, which is connected to the top-level clock network. This separation of clock trees may result in more accurate timing, and a better density for the clock distribution network.

The timing property provides a timing model of each STANDARD BLOCK. The timing model describes the timing relationship between input and output pins, internal pin-to-pin delays, insertion delays in clock pins (which help determine if addition of top-level cells is need), and setup/hold time in input pins. By integrating all the timing models and performing a timing analysis, the timing models are used for top-level timing verification of the entire design.

The signal integrity abstraction models, for example, the local interconnects inside each of the STANDARD BLOCKs that are susceptible to cross-talk with top-level interconnects between the STANDARD BLOCKs (top-level nets). The signal integrity abstractions can then be used to detect and fix, at the top-level, signal integrity issues such as noise.

Essentially, the foregoing features of STANDARD BLOCKs facilitate the, preferably, separate yet parallel (concurrent) respective designs of STANDARD BLOCKs. Each respective STANDARD BLOCK design produces the above-outlined abstractions and properties and provides them to the top-level assembly tool. Once the STANDARD BLOCKs are placed and interconnected, the top-assembly is ready for design verification and, if needed, design optimization. Design verification involves, for example, timing and power-consumption analysis using one or more of the above outlined properties.

In summary, the new IC architecture with STANDARD BLOCKs uses the STANDARD BLOCKs as a new level of abstraction with a granularity and regularity that is most appropriate for the design of complex, large scale deep-submicron IC designs. To this end, the new IC architecture combines the advantages of standard-cell-based and functional-block-based architectures as previously explained.

In general, STANDARD BLOCKs are, singly or (for a collection of STANDARD BLOCKs) in the aggregate, self contained functional entities that are preferably aligned with RTL block functional boundaries and can be created to correspond to various modules of intellectual property (soft IP or hard IP, as mentioned above). In other words, when aligmnent can be achieved, RTL design blocks can be combined to form a functional entity to be mapped into a flexible hard IP functional block in the form of one or a collection of STANDARD BLOCKs. Conversely, RTL design blocks can be partitioned and mapped into a collection of STANDARD BLOCKs, or hierarchical STANDARD BLOCKs. As such, STANDARD BLOCKs can be collected in a design library as flexible library elements with reconfigurable instances for easy re-use in subsequent designs. The alignment of STANDARD BLOCKs to the RTL functionality also provides a common platform for both the RTL design and the physical design. This makes passing information back to the RTL level much easier (for performing a re-design, for example, in order to meet physical constraints). Additionally, STANDARD BLOCK architecture makes virtual prototyping of ICs possible, especially because the interface to each STANDARD BLOCK is not affected by changes (or by the layout) inside the respective STANDARD BLOCK.

Furthermore, the physical implementation of ICs in a plug-and-play manner is made easier with the STANDARD BLOCK based new IC architecture. As self-contained functional entities, STANDARD BLOCKs can be independently manipulated without affecting other STANDARD BLOCKs. Structurally, the new IC architecture considers the IC layout to be formed with STANDARD BLOCK ARRAYs or other configurations consisting of STANDARD BLOCKs having one fixed or quantized dimension and one variable dimension. The fixed dimension enables STANDARD BLOCKs to align with one-another by abutment, such that they can form STANDARD BLOCK ARRAYs. The variable dimension ranges between predefined limits as explained above, such that several STANDARD BLOCKs can be contained in a STANDARD BLOCK ARRAY. In addition, STANDARD BLOCKs can share power along their variable dimension in alternate flipped configurations of STANDARD BLOCK ARRAYs, such that IC density is maximized and conventional placement tools can be utilized. The form of STANDARD BLOCKs and the adoption of advantages associated with standard cell and functional block architectures, provides IC design flexibility and allows engineering changes (ECOs) mid-stream or very late in the design process without significantly impacting the IC design outcome. Also, since STANDARD BLOCKs within an IC layout have significant architectural (e.g. form) uniformity (as when one dimension is uniformly equal to M*d or 2M*d) there is substantially no interdependency among the STANDARD BLOCKs in terms of physical layout. Therefore, concurrent physical design of STANDARD BLOCKs is very efficient, particularly as compared to the functional-blocks-based architecture.

In addition, the new IC architecture permits higher density, more efficient routing, and better compliance with timing requirements. The relative smaller size and substantial regularity of STANDARD BLOCKs allows placement tools to process and re-assemble STANDARD BLOCKs repeatedly without imposing a significant toll on the design time. Because the level of granularity and structural physical characteristics introduced by STANDARD BLOCK architecture allows the use of standard-cell-based layout design tools, higher levels of automation are achieved. This also applies to allowing more discrete and manageable IC design, optimization and verification at the STANDARD BLOCKs level, as well as simpler and more successful integration at the top-level. In essence, any engineering changes relative to function, timing, signal integrity, power or other specifications can be implemented at the top-level or at a local STANDARD BLOCK level without having a significant global effect in the IC layout, that could require a major re-design cycle.

Finally, the top-level cell sites and pins allocation either along the periphery and/or in a diagonal (and/or staggered) fashion inside each STANDARD BLOCK helps optimize routing and timing associated with interconnects during integration or subsequent engineering changes and re-assembly. Additionally, top-level cell sites along the periphery of each STANDARD BLOCK in the new IC architecture can be optionally eliminated to save space while causing virtually no disruption to the core logic of the STANDARD BLOCKs.

Although the present invention has been described in accordance with the embodiments shown, variations to the embodiments would be apparent to those skilled in the art and those variations would be within the scope and spirit of the present invention. Accordingly, it is intended that the specification and embodiments shown be considered as exemplary only, with a true scope of the invention being indicated by the following claims and equivalents.

What is claimed is:

1. An integrated circuit (IC) architecture with standard blocks, comprising:
   standard blocks each of the standard blocks having attributes including
      a form with dimensions, the form being physically constrained such that its dimensions include a fixed or quantized dimension and a variable dimension that ranges between predetermined limits, wherein the fixed or quantized dimension is a standard block height and, correspondingly, the variable dimension is a standard block width such that the predefined limits facilitate efficient row-based placement of the standard blocks or, alternatively, the fixed or quantized dimension is a standard block width and, correspondingly, the variable dimension is the standard block height such tat the predefined limits facilitate efficient column-based placement of the standard blocks;
      a granularity and a level of abstraction that are larger and higher, respectively, then a standard cell ganularity and level of abstraction such that each standard block includes a plurality of standard cells, and
      flexible physical design properties; standard block arrays, the standard blocks being arranged in a standard block array configuration forming the standard block arrays; sites reserved for top-level cells and having a configuration that is suited for meet timing and signal integrity requirments and is accommodated by the standard block attributes,
   wherein the IC architecture with the standard blocks forms a layout of any IC as well as any soft or hard intellectual property (IP) designs.

2. The IC architecture of claim 1 further comprising
   power grid and clock grid structures providing, respectively, power and ground and clock distribution, including to the standard blocks and top-level cells, and
   interconnects providing connections in the layout, including to the standard blocks and the top-level cells.

3. The IC architecture of claim 2 in which the power grid structure enables the sharing of power and/or ground between standard blocks that occupy adjacent standard block arrays which are oriented in a flipped configuration relative to each other.

4. The IC architecture of claim 2 in which the power grid and clock structures are formed in even and odd metal layers, wherein metal layer strips in the even metal layers, including M2, M4 and M6, are perpendicular to metal layer strips in the odd metal layers, including M1, M3 and M5.

5. The IC architecture of claim 4 in which the odd metal layer strips are horizontal and, correspondingly, the even metal layer strips are vertical, or, alternatively, the odd metal layer strips are vertical and, correspondingly, the even metal layer strips are horizontal.

6. The IC architecture of claim 2 further comprising special routing or filler standard blocks having a special power grid structure from metal layers M1 and M3, wherein the special power grid structure includes power and/or ground rails for the purpose of maintaining continuity of power and/or ground rails of the power grid structure in any empty spaces in the standard block arrays not occupied by standard blocks.

7. The IC architecture of claim 1 wherein the sites reserved for the top-level cells are located inside or around a perimeter of the standard blocks or in channels formed between the standard block arrays.

8. The IC architecture of claim 1 wherein the layout of IP designs can be entirely or partly constructed of standard blocks, and wherein the layout of IC designs includes either or both soft and hard IP portions the layout of each portion being entirely or partly constructed of standard blocks.

9. The IC architecture of claim 1 wherein the layout of IC designs includes soft and hard IP portions as well as a custom circuitry portion the layout of each portion being entirely or partly constructed standard blocks.

10. The IC architecture of claim 1 wherein the layout of IC designs includes, in addition to the standard blocks, portions constructed entirely on standard cells and/or portions constructed entirely on functional blocks.

11. The IC architecture of claim 10 wherein one or more than one other portions constructed entirely of standard cells and or portions constructed entirely of functional blocks are replaced with corresponding portions constructed entirely or partly of standard blocks.

12. The IC architecture of claim 1 wherein, as compared to layouts formed with functional block based architecture, any layout formed with the standard blocks results in a higher IC or IP density.

13. The IC architecture of claim 1 in which the physically constrained form of the standard blocks approximates a rectangularly shaped area the fixed or quantized dimension of which is its height and, correspondingly, the variable dimension of which is its width or, alternatively, the fixed or quantized dimension of which is its width and, correspondingly, the variable dimension of which is its height.

14. The IC architecture of claim 13 in which the height of any one of the standard block arrays is the respective height of the standard blocks that populate the standard block array and correspondingly a length of any of the standard block arrays is defined by IC dimensions, or, alternatively, the width of any the standard block arrays is the respective width of the standard blocks that populate the standard block array and correspondingly, the length of any of the standard block array is defined by IC dimensions.

15. The IC architecture of claim 1 in which the standard blocks in any standard block array are placed abutting each other, and in which some of the standard blocks can populate more than one standard block array.

16. The IC architecture of claim 1 in which not all of the standard blocks are placed abutting each other.

17. The IC architecture of claim 1 further comprising a standard block hierarchy, wherein any of the standard blocks that is a multilevel standard block is constructed with the standard block hierarchy of a plurality of standard block sub-blocks.

18. The IC architecture of claim 1 wherein the standard block arrays are formed in a column or row configuration in which a number of the standard blocks are disposed abutted to each other with their fixed or quantized dimension aligned and oriented in the same direction, the direction being perpendicular to the respective row or column configuration direction.

19. The IC architecture of claim 1 wherein any of the standard blocks that are hierarchical standard blocks are constructed from a plurality of standard block sub-blocks and/or standard block sub-block arrays in the form of a standard block hierarchy, the standard block sub-bock arrays being configured in a row or column configuration in which the standard block sub-blocks are disposed abutted to each other with their fixed or quantized dimension aligned and oriented in the same direction, the direction being perpendicular to the row or column configuration direction.

20. The IC architecture of claim 1 wherein the standard blocks can be each created as a complete or partial functional entity, any group of the standard blocks which are created as the partial functional entities may, in the aggregate, form a complete functional entity, and wherein standard block sub-blocks are created as partial functional entities such that a group of the standard block sub-blocks may, in the aggregate, form a complete functional entity.

21. The IC architecture of claim 1 in which metal layers are used for wires in power grid and clock grid structures and for interconnects, wherein first and second metal layers, M1 and M2, respectively, are used for local wires and interconnects and for connections to the top-level cells, a third metal layer, M3, being used for local and global wires and interconnects and, if space is available, for global wires and interconnects, and fourth and/or higher metal layers, M4, M5 and M6, are used for global wires and interconnects including over the top-level cells.

22. The IC architecture of claim 1 wherein top-level cells are placed in the reserved sites, the reserved sites being located inside and between standard blocks, or in channels between standard block arrays, or in empty spaces between standard block arrays that are not fully populated.

23. The IC architecture of claim 1 wherein placement of the standard blocks in the layout is flexible, the layout further including critical paths between one or more than one of the standard blocks, the critical paths having a distance, wherein the distance is shorter with the flexible placement of the standard blocks that is possible with a functional block based architecture, thereby improving IC timing performance.

24. The IC architecture of claim 1 further including metal layers and intelligent blockage areas of the metal layers, wherein routing is excluded from the intelligent blockage areas at a top-level of the IC.

25. The IC architecture of claim 24 wherein for forming a top-level of the IC architecture the intelligent blockage areas are presented to a top-level assembly tool as abstractions the internal details of which are invisible at the top-level of the IC architecture.

26. The IC architecture of claim 1 wherein the reserved sites for top-level cells have selectable locations the configuration of which includes, singly or in combination, diagonal and/or staggered placement inside any of the standard blocks, placement around a perimeter of any of the standard blocks and placement in channels between any of the standard blocks.

27. The IC architecture of claim 1 wherein the top-level cells for which the sites are reserved include one or a combination of top-level buffers/repeaters, test circuitry or glue logic to be inserted during a top-level physical design of an IC or IP.

28. The IC architecture of claim 1 in which the sites reserved for the top-level cells have power and ground wires proximate thereto in order to provide power and ground connections to the top-level cells.

29. The IC architecture of claim 1 further comprising sites for pins wherein the sites of pins in a group of related pins contained in the standard blocks are grouped, the groped pin sites having spaces between them to allow routing therebetween, each group of pins being a virtual pin for the purpose of less populated presentation thereof to the top-level assembly tool.

30. The IC architecture of claim 29 wherein each virtual pin is presented to the top-level assembly tool as an abstraction having internal details invisible to the top-level assembly tool.

31. The IC architecture of claim 29 wherein the virtual pin is associated with a thick metal strip that collectively represents individual wires or interconnects connected to the pins in the group, the thick metal strip being converted into the individual interconnects during top-level design of the IC, each virtual pin and thick metal strip being presented to the top-level assembly tool as abstractions having internal details invisible to the top-level assembly tool.

32. The IC architecture of claim 1 wherein each of the standard blocks is a general abstraction akin to a black box global design aspects of which are transparent at a top level of the IC architecture and local design aspects of which are invisible at the top level.

33. The IC architecture of claim 32 wherein the global design aspects of the standard block include its fundamental architectural characteristics, including its physically constrained form, and its fundamental power, timing, clock and signal integrity properties.

34. The IC architecture of claim 1 wherein the IC designs includes designs of ASIC (application specific IC) and system on chip (SoC).

35. The IC architecture of claim 1 the standard block based architecture of which combines advantages of standard cell and functional block architectures and, relative thereto, brings higher levels of automation and integration to all levels of the IC design, including IC physical design, thus facilitating faster IC design, higher IC layout density, lower IC cost, more efficient routing and better timing requirements compliance.

36. The IC architecture of claim 1 in which the flexible physical design properties of each standard block are configurable in the context of a physical design.

37. The IC architecture of claim 1 in which the standard blocks are complete or partial functional entities, wherein respective standard block designs are performed separately but concurrently, such that any IC and/or IP designs can be accelerated, and any of the standard blocks can be independently manipulated without affecting others of the standard blocks, wherein the concurrent designs and independent manipulations facilitate easy and quick response to engineering change orders (ECOs).

38. The IC architecture of claim 1 the design of which, and any IP design portion of which, is fashioned as a register transfer level (RTL) hierarchy design partitioned into RTL design blocks, wherein functionality of the standard blocks correspondingly aligns with functionality of one or a combined group of the RTL design blocks, the alignment providing a common platform for the RTL design and physical design.

39. The IC architecture of claim 38 in which each or a collection of the standard blocks has a functionality that aligns with a register transfer level (RTL) design block of the IC design.

40. The IC architecture of claim 1 in which the standard blocks are flexible library elements with reconfigurable logical and/or electrical instances for easy re-use in other IC or IP designs, the configuration of each instance being determined in a top-level physical design context.

41. The IC architecture of claim 1 wherein the dimensions of the standard blocks form are determined for a given IC design and process technology, as well as, an overall chip size of the IC design.

42. The IC architecture of claim 1 wherein each of the standard blocks is capable of being separately designed concurrently with others of the standard blocks.

43. An integrated circuit architecture, wherein said architecture includes a plurality standard cells, each of said standard cells having a fixed standard cell height and a variable standard cell width, said architecture comprising:
a plurality of standard blocks, each of said standard blocks having a quantized dimension, a variable dimension, a granularity and level of abstraction, said quantized dimension being a selected multiple of said standard cell height, said variable dimension being constrained between a minimum dimension and a maximum dimension, said granularity and said level of abstraction being larger and higher, respectively, than a corresponding granularity and level of abstraction of each of said standard cells;
a plurality of standard block arrays, each of said standard block arrays having an array dimension commensurate with said quantized dimension, first selected ones of each of said standard blocks being linearly disposed in a respective one of said arrays wherein said standard blocks in each of said arrays are aligned with said quantized dimension disposed along said array dimension;
said standard block arrays being structurally intermixed with said standard cells such that said fixed standard cell height is coincident with said array dimension and said variable standard cell width is coincident with said variable dimension.

44. The integrated circuit architecture of claim 43 further comprising:
a power grid distributing power to said standard blocks and said standard cells;
a clock grid distributing clock signals to said standard blocks and said standard cells; and
interconnects interconnecting said standard blocks and said standard cells.

45. The integrated circuit architecture of claim 44 in which said power grid structure enables the sharing of power and/or ground between said standard blocks that occupy adjacent standard block arrays.

46. The integrated circuit architecture of claim 44 wherein said power grid, said clock grid and said interconnects include a set of metal layers, said layers having subsets, said subsets being assigned to local and global routing.

47. The integrated circuit architecture of claim 44 further comprising filler cells disposed in interstices between non-abutting one of said in said standard block arrays.

48. The integrated circuit architecture of claim 43 wherein selected ones of said standard cells are selectively located inside said standard blocks.

49. The integrated circuit architecture of claim 43 wherein selected ones of said standard cells are selectively located external of said standard blocks within one of said arrays.

50. The integrated circuit architecture of claim 43 wherein a channel is defined between at least two adjacent ones of said standard block arrays and further wherein selected ones of said standard cells are selectively located in said channel.

51. The integrated circuit architecture of claim 43 further comprising selected ones of soft IP modules and hard IP modules, each of said modules coexisting with said standard block arrays.

52. The integrated circuit architecture of claim 51 wherein said modules are at least partly constructed of said standard block arrays.

53. The integrated circuit architecture of claim 43 wherein each of said standard blocks has a height defined by said quantized dimension and a width defined by said variable dimension.

54. The integrated circuit architecture of claim 53 wherein each respective one of said standard block arrays has a width, said width of at least one respective one of said standard blocks arrays being at least equal to a total of said variable dimension of each of said first selected ones of said standard blocks disposed therein.

55. The integrated circuit architecture of claim 54 wherein said first selected ones of said standard blocks in said at least one respective one of said array are disposed abutting each other.

56. The integrated circuit architecture of claim 53 wherein each respective one of said standard block arrays has a width, said width of at least one respective one of said standard blocks arrays being greater than to a total of said variable dimension of each of said first selected ones of said standard blocks disposed therein.

57. The integrated circuit architecture of claim 56 wherein some of said first selected ones of said standard blocks in said at least one respective one of said array are disposed non-abutting each other.

58. The integrated circuit architecture of claim 43 wherein each of said standard blocks has a width defined by said quantized dimension and a height defined by said variable dimension.

59. The integrated circuit architecture of claim 58 wherein each respective one of said standard block arrays has a height, said height of at least one respective one of said standard blocks arrays being at least equal to a total of said variable dimension of each of said first selected ones of said standard blocks disposed therein.

60. The integrated circuit architecture of claim 59 wherein said first selected ones of said standard blocks in said at least one respective one of said array are disposed abutting each other.

61. The integrated circuit architecture of claim 58 wherein each respective one of said standard block arrays has a height, said height of at least one respective one of said standard blocks arrays being greater than to a total of said variable dimension of each of said first selected ones of said standard blocks disposed therein.

62. The integrated circuit architecture of claim 61 wherein some of said first selected ones of said standard blocks in said at least one respective one of said array are disposed non-abutting each other.

63. The integrated circuit architecture of claim 43 wherein said standard block arrays are selectively one of rows and columns.

64. The integrated circuit architecture of claim 43 wherein said standard block arrays are adaptable to construct the architecture of a further standard block, said further standard block having a quantized dimension commensurate with the sum of said array dimension of each of said arrays in said architecture of said further standard block.

65. The integrated circuit architecture of claim 43 wherein each of said standard block arrays are formed selectively in one of a column and a row configuration wherein for each of said first selected ones of said standard blocks in each respective one of said arrays said quantized dimension is oriented in the same direction, the direction being perpendicular to the respective one of said row and said column configuration.

66. The integrated circuit architecture of claim 43 wherein second selected ones of said standard blocks are distributed in a plurality of said standard block arrays define a functional module.

67. The integrated circuit architecture of claim 43 wherein said standard cells include selected ones of buffers/repeaters, test circuitry and glue logic.

68. The integrated circuit architecture of claim 43 further comprising sites for pins wherein the sites of pins in a group of related pins contained in said standard blocks are grouped, the grouped pin sites having spaces between them to allow routing therebetween, each group of pins being capable of becoming a virtual pin for the purpose of less populated presentation thereof, wherein said virtual pin is associated with a thick metal strip that collectively represents individual wires or interconnects connected to said pins in the group, said thick metal strip being converted into the individual interconnects during top-level design of said integrated circuit, each virtual pin and thick metal strip being presented to the top-level assembly tool as abstractions in the internal details of which are invisible to the top-level assembly tool.

69. The integrated circuit architecture of claim 43 wherein selected other ones of said standard blocks define a functional block.

70. The integrated circuit architecture of claim 69 wherein a subset of said selected other ones of said standard blocks are non-contiguous and disposed in non-adjacent arrays.

71. The integrated circuit of claim 69 wherein a subset of said selected other ones of said standard blocks are non-contiguous and disposed in non-adjacent arrays.

72. The integrated circuit architecture of claim 43 wherein the dimensions of said standard blocks form are determined for a given integrated circuit design and process technology and an overall chip size of the integrated circuit.

73. An integrated circuit including a plurality standard cells, each of said standard cells having a fixed standard cell height and a variable standard cell width, said integrated circuit comprising:
   a plurality of standard blocks, each of said standard blocks having a quantized dimension, a variable dimension, a granularity and level of abstraction, said quantized dimension being a selected multiple of said standard cell height, said variable dimension being constrained between a minimum dimension and a maximum dimension, said granularity and said level of abstraction being larger and higher, respectively, than a corresponding granularity and level of abstraction of each of said standard cells;
   a plurality of standard block arrays, each of said standard block arrays having an array dimension commensurate with said quantized dimension, first selected ones of each of said standard blocks being linearly disposed in a respective one of said arrays wherein said standard blocks in each of said arrays are aligned with said quantized dimension disposed along said array dimension;
   said standard block arrays being structurally intermixed with said standard cells such that said fixed standard cell height is coincident with said array dimension and said variable standard cell width is coincident with said variable dimension.

74. The integrated circuit of claim 73 further comprising:
   a power grid distributing power to said standard blocks and said standard cells;
   a clock grid distributing clock signals to said standard blocks and said standard cells; and
   interconnects interconnecting said standard blocks and said standard cells.

75. The integrated circuit of claim 74 in which said power grid structure enables the sharing of power and/or ground between said standard blocks that occupy adjacent standard block arrays.

76. The integrated circuit of claim 74 wherein said power grid, said clock grid and said interconnects include a set of metal layers, said layers having subsets, said subsets being assigned to local and global routing.

77. The integrated circuit of claim 74 further comprising filler cells disposed in interstices between non-abutting one of said in said standard block arrays.

78. The integrated circuit of claim 73 wherein selected ones of said standard cells are selectively located inside said standard blocks.

79. The integrated circuit of claim 73 wherein selected ones of said standard cells are selectively located external of said standard blocks within one of said arrays.

80. The integrated circuit of claim 73 wherein a channel is defined between at least two adjacent ones of said standard block arrays and further wherein selected ones of said standard cells are selectively located in said channel.

81. The integrated circuit of claim 73 further comprising selected ones of soft IP modules and hard IP modules, each of said modules coexisting with said standard block arrays.

82. The integrated circuit of claim 81 wherein said modules are at least partly constructed of said standard block arrays.

83. The integrated circuit of claim 73 wherein each of said standard blocks has a height defined by said quantized dimension and a width defined by said variable dimension.

84. The integrated circuit of claim 83 wherein each respective one of said standard block arrays has a width, said width of at least one respective one of said standard blocks arrays being at least equal to a total of said variable dimension of each of said first selected ones of said standard blocks disposed therein.

85. The integrated circuit of claim 84 wherein said first selected ones of said standard blocks in said at least one respective one of said array are disposed abutting each other.

86. The integrated circuit of claim 83 wherein each respective one of said standard block arrays has a width, said width of at least one respective one of said standard blocks arrays being greater than to a total of said variable dimension of each of said first selected ones of said standard blocks disposed therein.

87. The integrated circuit of claim 86 wherein some of said first selected ones of said standard blocks in said at least one respective one of said array are disposed non-abutting each other.

88. The integrated circuit of claim 73 wherein each of said standard blocks has a width defined by said quantized dimension and a height defined by said variable dimension.

89. The integrated circuit of claim 88 wherein each respective one of said standard block arrays has a height, said height of at least one respective one of said standard blocks arrays being at least equal to a total of said variable dimension of each of said first selected ones of said standard blocks disposed therein.

90. The integrated circuit of claim 89 wherein said first selected ones of said standard blocks in said at least one respective one of said array are disposed abutting each other.

91. The integrated circuit of claim 88 wherein each respective one of said standard block arrays has a height, said height of at least one respective one of said standard blocks arrays being greater than to a total of said variable dimension of each of said first selected ones of said standard blocks disposed therein.

92. The integrated circuit of claim 91 wherein some of said first selected ones of said standard blocks in said at least one respective one of said array are disposed non-abutting each other.

93. The integrated circuit of claim 73 wherein said standard block arrays are selectively one of rows and columns.

94. The integrated circuit of claim 73 wherein said standard block arrays are adaptable to construct the architecture of a further standard block, said further standard block having a quantized dimension commensurate with the sum of said array dimension of each of said arrays in said architecture of said further standard block.

95. The integrated circuit of claim 73 wherein each of said standard block arrays are formed selectively in one of a column and a row configuration wherein for each of said first selected ones of said standard blocks in each respective one of said arrays said quantized dimension is oriented in the same direction, the direction being perpendicular to the respective one of said row and said column configuration.

96. The integrated circuit of claim 73 wherein second selected ones of said standard blocks are distributed in a plurality of said standard block arrays define a functional module.

97. The integrated circuit of claim 73 wherein said standard cells include selected ones of buffers/repeaters, test circuitry and glue logic.

98. The integrated circuit of claim 73 further comprising sites for pins wherein the sites of pins in a group of related pins contained in said standard blocks are grouped, the grouped pin sites having spaces between them to allow routing therebetween, each group of pins being capable of becoming a virtual pin for the purpose of less populated presentation thereof to a top-level assembly tool, wherein said virtual pin is associated with a thick metal strip that collectively represents individual wires or interconnects connected to said pins in the group, said thick metal strip being converted into the individual interconnects during top-level design of said integrated circuit, each virtual pin and thick metal strip being presented to the top-level assembly tool as abstractions in the internal details of which are invisible to the top-level assembly tool.

99. The integrated circuit of claim 73 wherein selected other ones of said standard blocks define a functional block.

100. The integrated circuit of claim 73 wherein the dimensions of said standard blocks form are determined for a given integrated circuit design and process technology and an overall chip size of the integrated circuit.

* * * * *